(12) United States Patent
Nakagawa

(10) Patent No.: US 9,330,992 B2
(45) Date of Patent: May 3, 2016

(54) WIRING SUBSTRATE FOR A SEMICONDUCTOR DEVICE HAVING DIFFERENTIAL SIGNAL PATHS

(71) Applicant: Renesas Electronics Corporation, Kawasaki-shi, Kanagawa (JP)

(72) Inventor: Kazuyuki Nakagawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/196,736

(22) Filed: Mar. 4, 2014

(65) Prior Publication Data

US 2014/0252612 A1    Sep. 11, 2014

(30) Foreign Application Priority Data

Mar. 6, 2013   (JP) ................. 2013-044393

(51) Int. Cl.
| | | |
|---|---|---|
| *H01L 23/48* | (2006.01) | |
| *H01L 23/12* | (2006.01) | |
| *H01L 23/498* | (2006.01) | |
| *H01L 23/50* | (2006.01) | |
| *H05K 1/11* | (2006.01) | |
| *H01L 23/367* | (2006.01) | |
| *H05K 1/02* | (2006.01) | |
| *H01L 23/00* | (2006.01) | |

(52) U.S. Cl.
CPC .......... *H01L 23/12* (2013.01); *H01L 23/49822* (2013.01); *H01L 23/49838* (2013.01); *H01L 23/50* (2013.01); *H05K 1/0251* (2013.01); *H05K 1/116* (2013.01); *H01L 23/367* (2013.01); *H01L 24/16* (2013.01); *H01L 24/32* (2013.01); *H01L 24/33* (2013.01); *H01L 2224/0401* (2013.01); *H01L 2224/05147* (2013.01); *H01L 2224/05155* (2013.01); *H01L 2224/05166* (2013.01); *H01L 2224/131* (2013.01); *H01L 2224/16225* (2013.01); *H01L 2224/16227* (2013.01); *H01L 2224/2919* (2013.01); *H01L 2224/2929* (2013.01); *H01L 2224/29386* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2924/15311* (2013.01); *H01L 2924/3511* (2013.01); *H05K 1/0245* (2013.01); *H05K 1/0253* (2013.01); *H05K 2201/09309* (2013.01); *H05K 2201/09718* (2013.01)

(58) Field of Classification Search
CPC ................... H01L 23/49827; H01L 23/49816; H01L 24/81; H01L 21/563; H01L 225/06517; H01L 21/486; H01L 2224/83101
See application file for complete search history.

(56) References Cited

U.S. PATENT DOCUMENTS

| | | | |
|---|---|---|---|
| 6,587,008 B2 | 7/2003 | Hatanaka et al. | |
| 2006/0243478 A1* | 11/2006 | Inagaki et al. | |
| 2008/0190658 A1* | 8/2008 | Toyoda et al. | ................ 174/263 |
| 2010/0213611 A1 | 8/2010 | Isa et al. | ................ 174/255 |

(Continued)

FOREIGN PATENT DOCUMENTS

JP        2005-340636 A      12/2005

* cited by examiner

*Primary Examiner* — Khiem D Nguyen
(74) *Attorney, Agent, or Firm* — Womble Carlyle

(57) ABSTRACT

A semiconductor device is provided with improved resistance to noise. Conductive planes are respectively formed over wiring layers. One wiring layer is provided with a through hole land integrally formed with a through hole wiring. In other wiring layers located over the wiring layer with the through hole land, openings are respectively formed in the conductive planes. The area of each of the openings is larger than the plane area of the through hole land.

23 Claims, 42 Drawing Sheets

FIG. 29

| | WIRING SUBSTRATE 2 | WIRING SUBSTRATE 2A | IMPROVEMENT EFFECT |
|---|---|---|---|
| Zdiff [Ω] | ABOUT 70 Ω | ABOUT 40 Ω | ABOUT 30 Ω |
| Sdd11 [dB] | Max -8dB (10GHz) | Max -3dB (10GHz) | -5dB (10GHz) |
| Sdd21 [dB] | ABOUT -1dB | ABOUT -4dB | ABOUT -3dB |

FIG. 42

WIRING SUBSTRATE FOR A SEMICONDUCTOR DEVICE HAVING DIFFERENTIAL SIGNAL PATHS

CROSS-REFERENCE TO RELATED APPLICATIONS

The disclosure of Japanese Patent Application No. 2013-044393 filed on Mar. 6, 2013 including the specification, drawings and abstract is incorporated herein by reference in its entirety.

BACKGROUND

The present invention relates to techniques of semiconductor devices, and more specifically, to a technique effectively applied to a semiconductor device having a semiconductor chip mounted on a wiring substrate with a plurality of wiring layers stacked thereover.

Japanese Unexamined Patent Publication No. 2010-219498 (Patent Document 1) discloses a semiconductor device having a void or floating pattern formed in a region of a wiring layer opposed to the surroundings of a solder ball and connected to a single wiring.

Japanese Unexamined Patent Publication No. 2002-100932 (Patent Document 2) discloses a semiconductor device in which a cutout portion is provided in a ground pattern to prevent the ground pattern from being superimposed over a wiring pattern for a piezoelectric vibrator including a monitor electrode pad.

Japanese Unexamined Patent Publication No. 2005-340636 (Patent Document 3) discloses a multilayer wiring substrate having a floating conductive layer positioned to be superimposed over ball pads for connecting balls on a surface of the substrate in the thickness direction.

RELATED ART DOCUMENTS

Patent Documents

[Patent Document 1]
Japanese Unexamined Patent Publication No. 2010-219498
[Patent Document 2]
Japanese Unexamined Patent Publication No. 2002-100932
[Patent Document 3]
Japanese Unexamined Patent Publication No. 2005-340636

SUMMARY

The inventors of the present application have studied techniques for improving the performance of a semiconductor device including semiconductor chips stacked over a wiring substrate. As one of the techniques, the semiconductor device has been studied which includes a semiconductor chip mounted over a wiring substrate with wiring layers stacked thereon.

As a result of the studies, the inventors of the present application have found out that various problems are raised from the viewpoint of improving resistance to noise of the semiconductor device when conductive planes are respectively formed over the respective wiring layers included in the wiring substrate.

Other problems and new features of the present invention will be better understood after a reading of the following detailed description of the present application in connection with the accompanying drawings.

A semiconductor device according to one embodiment of the invention includes a conductive plane formed at each of the wiring layers included in a wiring substrate. The wiring layers include a wiring layer having a through hole land integrally formed with a through hole wiring. The wiring layer formed as an upper layer above, or a lower layer under the wiring layer having the through hole land formed therein is provided with an opening located in the position of the conductive plane superimposed over the through hole land in the thickness direction. An area of the opening is larger than a plane area of the through hole land.

The invention can provide the semiconductor device with improved resistance to noise.

BRIEF DESCRIPTION OF THE DRAWINGS

FIG. 29 is an explanatory diagram showing the results of evaluation of electric characteristics of the wiring substrate shown in FIG. 21 and the wiring substrate shown in FIG. 22;

FIG. 42 is a cross-sectional view showing a semiconductor device as a modified example corresponding to FIG. 4.

DETAILED DESCRIPTION

Figure 1:
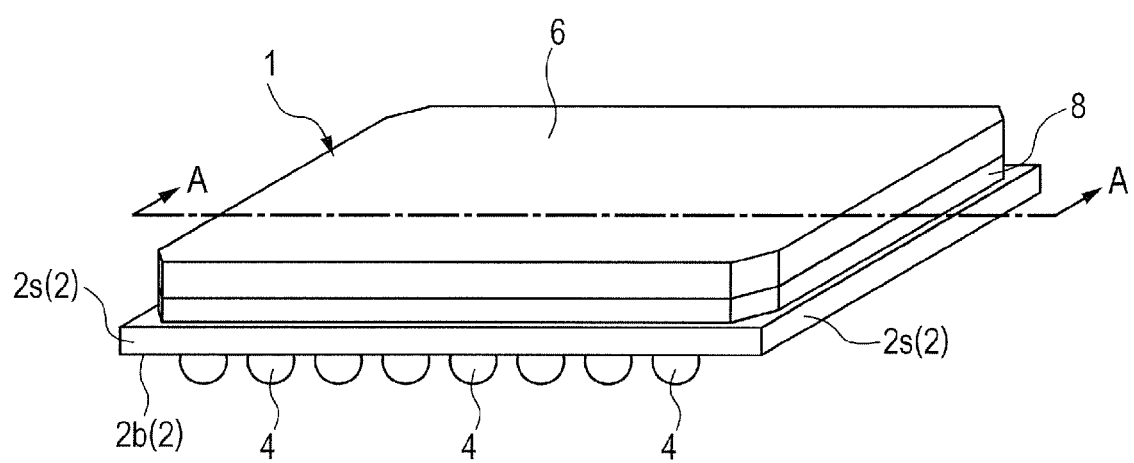
FIG. 1 is a perspective view of a semiconductor device according to one embodiment of the invention.

Explanation of Description Format and Basic Terms and Usage in Present Application In the present application, the following preferred embodiments may be described below by being divided into a plurality of sections or the like for convenience, if necessary, which are not independent from each other unless otherwise specified. Regardless of the order of the description of these sections, the sections indicate respective parts in a single example. Alternatively, one of the sections may be the details of a part of the other, or a modified example of a part or all of the other. In principle, parts having the same function will not be described repeatedly. Respective components of the preferred embodiments are not essential unless otherwise specified, except when limiting the number of the components in theory, and except when considered not to be definitely so from the context thereof.

Similarly, in the description of the embodiments, the term "X formed of A" or the like as to material, composition, and the like does not exclude elements other than the element "A", unless otherwise specified and except when considered not to be definitely so from the context. For example, as to the component, the above term means "X containing A as a principal component". For example, the term "silicon member" is not limited to pure silicon, and may obviously include a SiGe (silicon-germanium) alloy, or a multi-component alloy containing silicon as a principal component, and another additive. The term "gold plating", "Cu layer", or "nickel plating" is not limited to pure one, but can include a member containing gold, Cu, or nickel as a principal component unless otherwise specified.

Even when referring to a specific numeral value or amount, the number of elements or the like may be greater than, or less than the specific numeral number, unless otherwise specified, except when limited to the specific number in theory, and except when considered not to be definitely so from the context.

As to the terms "planar surface and side surface" as used in the present application, the term "planar surface" means a planar surface in parallel to a reference surface which is a surface of a semiconductor chip with a semiconductor element formed thereat. The term "side surface" means a surface intersecting the above-mentioned planar surface. The direction connecting two planar surfaces spaced apart from each other in the side view is referred to as a thickness direction.

It is noted that although the term "upper surface or lower surface" are used in the present application, there are various forms of semiconductor packages, whereby the upper surface of the semiconductor package happens to be located under its lower surface thereof after mounting the semiconductor package. In the present application, one planar surface of the semiconductor chip with the element formed thereat is hereinafter referred to as an upper surface, and the other surface opposite to the upper surface is hereinafter referred to as a lower surface.

In each drawing of the embodiments, the same or like parts are indicated by the same or similar reference character or number, and its description will not be repeated in principle.

In the accompanying drawings, even a cross-sectional view may omit hatching in some cases if the hatching possibly makes the sectional view complicated, or when a cavity or hole is easy to discriminate. In this context, the outline of a hole closed in a planar manner with respect to the background may be omitted when clearly seen from the description or the like. Further, in order to represent a part which is not a cavity or hole, or in order to clearly represent a boundary between regions, a hatching or dot pattern is sometimes given even when the figure is not a cross-sectional view.

PREFERRED EMBODIMENTS

Figure 2:
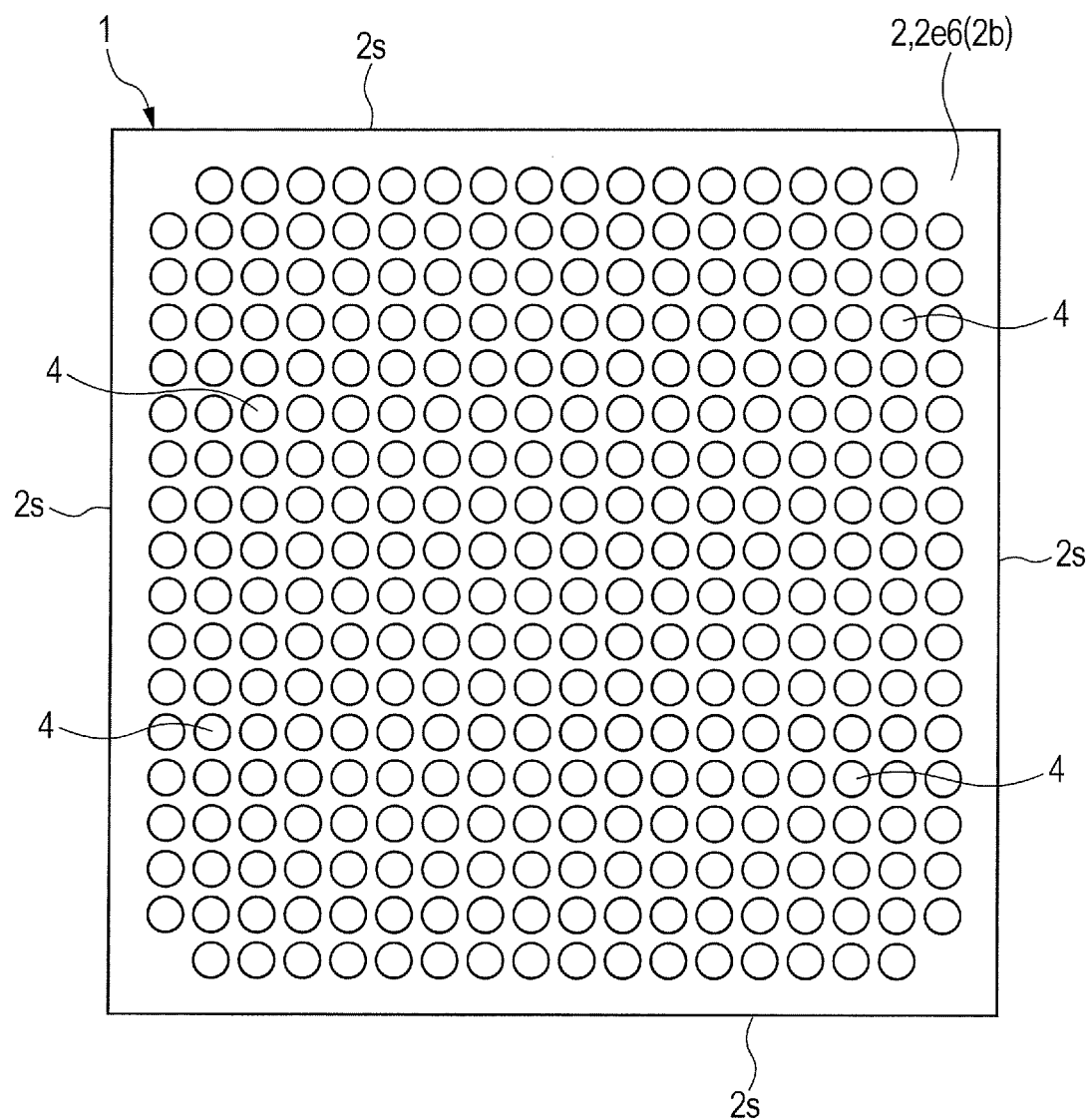
FIG. 2 is a bottom view of the semiconductor device shown in FIG. 1.
Figure 3:
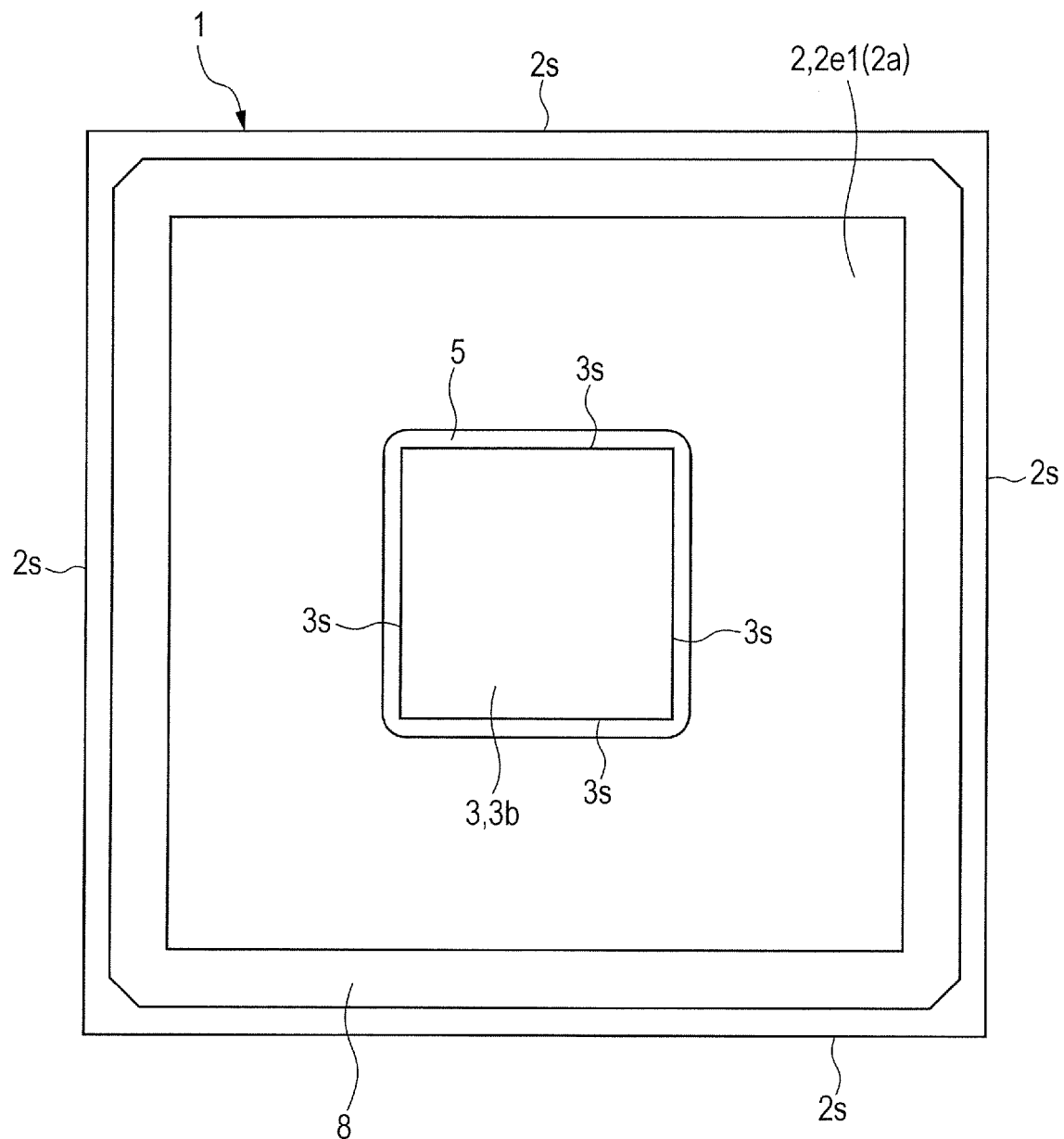
FIG. 3 is a plan view showing an internal structure of the semiconductor device over a wiring substrate while a heat-sink shown in FIG. 1 is removed.
Figure 4:
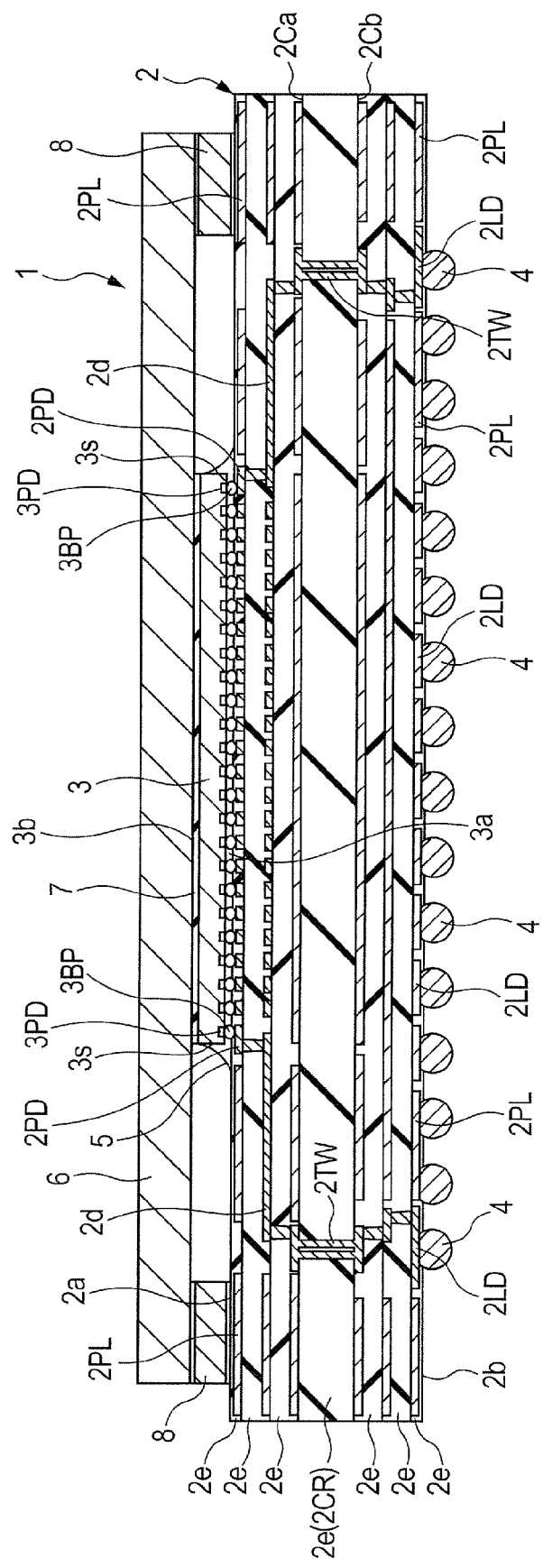
FIG. 4 is a cross-sectional view taken along the ling A-A of FIG. 1.

FIG. 1 shows a perspective view of a semiconductor device according to one embodiment, and FIG. 2 shows a bottom view of the semiconductor device shown in FIG. 1. FIG. 3 shows a perspective plan view of an internal structure of the semiconductor device over a wiring substrate with a heatsink shown in FIG. 1 removed. FIG. 4 shows a cross-sectional view taken along the ling A-A of FIG. 1. For easy understanding, FIGS. 1 to 4 show a small number of terminals. Further, for easy understanding, FIG. 4 shows a smaller number of solder balls 4 than that of an example shown in FIG. 2. The number of terminals (bonding pads 2PD, ball lands 2LD, solder balls 4) is not limited to that of the embodiments described in FIGS. 1 to 4. For example, the invention can be applied to a semiconductor device including about 100 to 10,000 terminals including the bonding pads 2PD, lands 2D, solder balls 4, and the like.

<Semiconductor Device>

First, the structural outline of a semiconductor device 1 in this embodiment will be described below using FIGS. 1 to 4. The semiconductor device 1 of this embodiment includes a wiring substrate 2, and a semiconductor chip 3 mounted over the wiring substrate 2 (see FIG. 4).

As shown in FIG. 4, the wiring substrate 2 has an upper surface (surface, main surface, first surface, chip mounting surface) 2a with the semiconductor chip 3 mounted thereover, a lower surface (surface, main surface, second surface, lower mounting surface) 2b opposed to the upper surface 2a, and a plurality of side surfaces 2s (see FIGS. 1 to 3) disposed between the upper surface 2a and the lower surface 2b. The wiring substrate 2 has a quadrilateral contour shape in the planar view as shown in FIGS. 2 and 3. In the example shown in FIGS. 2 and 3, the wiring substrate 2 is a square or a rectangle having an appropriate planar size (size in the planar view, specifically, the sizes of the upper surface 2a and the lower surface 2b, or the size of the contour), for example, a side length of about 12 to 60 mm. The thickness (height) of the wiring substrate 2, that is, a distance between the upper surface 2a to the lower surface 2b is, for example, about 0.3 to 1.3 mm.

The wiring substrate 2 is an interposer (relay board) for electrically coupling the semiconductor chip 3 mounted on the upper surface 2a side to a mounting substrate (not shown). The wiring substrate 2 includes a plurality of wiring layers (six layers in the example shown in FIG. 4) for electrically coupling the upper surface 2a side as a chip mounting surface to the lower mounting surface 2b as the mount surface. The wiring substrate 2 is formed by stacking a plurality of wiring layers by a build-up method, over an upper surface 2Ca and a lower surface 2Cb of the insulating layer (core material, core insulating layer) 2CR made of prepreg produced by immersing glass fiber or carbon fiber in resin. The wiring layer on the upper surface 2Ca side of the core insulating layer 2CR is electrically coupled to the wiring layer on the lower surface 2Cb side of the core insulating layer 2CR via a plurality of through hole wirings 2TW embedded in through-bores (through holes) extending from one of the upper and lower surfaces 2Ca and 2Cb to the other.

Over the upper surface 2a of the wiring substrate 2, a plurality of bonding pads (bonding leads, terminals for connection of the semiconductor chip) 2PD are formed to be electrically coupled to the semiconductor chip 3. Over the lower surface 2b of the wiring substrate 2, a plurality of ball lands 2LD serving as an external input/output terminal of the semiconductor device 1 are formed. The bonding pads 2PD and the ball lands 2LD are electrically coupled to each other via wirings 2d and through hole wirings 2TW formed in the wiring substrate 2. The detailed structure of the respective wiring layers included in the wiring substrate 2 will be described later.

In the example shown in FIG. 4, each of the ball lands 2LD is coupled to the solder ball (solder material, external terminal, electrode, or external electrode) 4. The solder ball 4 is a conductive member for electrically coupling the ball lands 2LD to terminals (not shown) on the mounting substrate side in mounting the semiconductor device 1 over the mounting substrate (not shown). The solder ball 4 is made of, for example, the so-called lead-free soldering material which does not substantially contain Pb or a lead (Pb)-containing Sn—Pb soldering material. For example, the lead-free soldering materials include, for example, only tin (Sn), tin-bismuth (Sn—Bi), bismuth-copper-silver (Bi—Cu—Au), tin-copper (Sn—Cu) and the like. The term "lead-free soldering material" as used herein means a soldering material containing 0.1 wt % or less of lead (Pb), which content complies with the criterion for the RoHS (restriction of hazardous substances).

As shown in FIG. 2, a plurality of solder balls 4 are arranged in lines (an array or a matrix). Although not shown in FIG. 2, a plurality of ball lands 2LD (see FIG. 4) to which the solder balls 4 are coupled are also arranged in lines (or a matrix). The thus-obtained semiconductor device including the external terminals (solder balls 4 and ball lands 2LD) arranged in the lines on the lower mounting surface side of the wiring substrate 2 is called the "area array semiconductor device". Preferably, the area array semiconductor device can effectively utilize the lower mounting surface (lower surface 2b) side of the wiring substrate 2 as an arrangement space for the external terminals, which can suppress an increase in mounting area of the semiconductor device even though the number of the external terminals is increased. The semiconductor device including a larger number of external terminals with improved function and high integration density can be mounted in a small space.

The semiconductor device 1 includes the semiconductor chip 3 mounted over the wiring substrate 2. As shown in FIG. 4, each semiconductor chip 3 includes a front surface (main surface, upper surface) 3a, a back surface (main surface, lower surface) 3b opposite to the front surface 3a, and side surfaces 3s positioned between the front surface 3a and the back surface 3b. The semiconductor chip 3 has a quadrilateral contour shape whose plane area is smaller than that of the wiring substrate 2 in the planar view as shown in FIG. 3. In the example shown in FIG. 3, the semiconductor chip 3 is mounted in the center of the upper surface 2a of the wiring substrate 2 such that the respective four side surfaces 3s extend along the four side surfaces 2s of the wiring substrate 2.

As shown in FIG. 4, a plurality of electrode pads 3PD are formed over the front surface 3a of the semiconductor chip 3. In this embodiment, the electrode pads 3PD are arranged in lines (a matrix, an array) over the front surface 3a of the semiconductor chip 3. Preferably, the arrangement of the electrode pads 3PD serving as the electrode of the semiconductor chip 3 in lines can effectively utilize the front surface 3a of the semiconductor chip 3 as the arrangement space for the electrodes. Even though the number of the electrodes of the semiconductor chip 3 is increased, a plane area occupied by the pads can be prevented from increasing. Although not shown, as a modified example of this embodiment, the invention can also be applied to a semiconductor chip of a type in which pads are formed at the peripheral edge of the front surface 3a.

In the example shown in FIG. 4, the semiconductor chip 3 is mounted over the wiring substrate 2 with the front surface 3a of the chip 3 opposed to the upper surface 2a of the wiring substrate 2. Such a mounting method is called face-down mounting or flip-chip bonding.

Although not shown, a plurality of semiconductor elements (circuit elements) are formed at the main surface of the semiconductor chip 3 (specifically, a semiconductor element formation region provided at an element formation surface of the semiconductor substrate serving as a base of the semiconductor chip 3). The electrode pads 3PD are respectively electrically coupled to the semiconductor elements via wirings (not shown) formed in the wiring layers disposed inside the semiconductor chip 3 (specifically, between the surface 3a and the semiconductor element formation region (not shown)).

The semiconductor chip 3 (specifically, the base of the semiconductor chip 3) is formed of, for example, silicon (Si). An insulating film is formed over the front surface 3a to cover the base and the wirings of the semiconductor chip 3. Each of the electrode pads 3PD has its surface exposed from the insulating film at an opening formed in the insulating film. The electrode pads 3PD are made of metal. In this embodiment, the electrode pad 3PD is made of, for example, aluminum (Al).

As shown in FIG. 4, the electrode pads 3PD are respectively coupled to the protruding electrodes 3BP. The electrode pads 3PD of the semiconductor chip 3 are electrically coupled to the bonding pads 2PD of the wiring substrate 2 via protruding electrodes 3BP. The protruding electrode 3BP is a metal member formed to protrude from the front surface 3a of the semiconductor chip 3. The protruding electrode 3BP in this embodiment is the so-called solder bump formed by stacking a soldering material over the electrode pad 3PD via an underlayer metal film (under bump metal). The underlayer metal film can be exemplified as a laminated film including a titanium (Ti) film, a copper (Cu) film, and a nickel (Ni) film stacked over the electrode pad 3PD from a bonding surface side (in some cases, further including a gold (Au) film formed over the nickel film). The soldering material forming the solder bump can be a lead-containing soldering material, or a lead-free soldering material, like the above soldering ball 4. In mounting the semiconductor chip 3 over the wiring substrate 2, the solder bumps are previously formed over both the electrode pads 3PD and bonding pads 2PD, which are then subjected to heat treatment (reflow process) while the solder bumps are in contact with each other, which integrates the semiconductor bumps together to thereby form the protrusion electrodes 3BP. In a modified example of this embodiment, a pillar bump formed of a solder film over a tip of a conductive column made of copper (Cu) or nickel (Ni) can be used as the protrusion electrode 3BP.

In this embodiment, the semiconductor chip 3 includes a circuit into or from which a plurality of signals are input or output at different transmission rates. Although not shown, the semiconductor chip 3 includes a first circuit to and from which a first signal is input or output at a first transmission rate, and a second circuit to and from which a second signal is input or output at a second transmission rate higher than the first transmission rate. As the second signal, a differential signal is transmitted at a transmission rate of about 10 Gbps (Gigabit per second) to 25 Gbps. Now, in this embodiment, a transmission path through which the second signal is transmitted will be described below as a high speed transmission path. In contrast, a transmission path through which the first signal is transmitted at the first transmission rate lower than the second transmission rate will be described below as a low speed transmission path. Not only the first signal, but also a first driving voltage for driving the first circuit is supplied to the first circuit. Not only the second signal, but also a second driving voltage for driving the second circuit is supplied to the second circuit.

As shown in FIG. 4, an underfill resin (insulating resin) 5 is disposed between the semiconductor chip 3 and the wiring substrate 2. The underfill resin 5 is disposed to fill in a space between the front surface 3a of the semiconductor chip 3 and the upper surface 2a of the wiring substrate 2. The underfill resin 5 is made of insulating (non-conductive) material (for example, resin), and disposed to seal an electrical coupling part (junctions of the protrusion electrodes 3BP) between the semiconductor chip 3 and the wiring substrate 2. The underfill resin 5 can be disposed to seal the coupling portions of the protrusion electrodes 3BP to thereby release the stress caused by the electric coupling portion between the semiconductor chip 3 and the wiring substrate 2.

In the example shown in FIG. 4, a heatsink (heat splitter) 6 is bonded to the back surface 3b of the semiconductor chip 3. The heat sink 6 is a metal plate having a higher thermal conductivity than that of the wiring substrate 2, and serves to discharge heat generated by the semiconductor chip 3 outward. The heatsink 6 is bonded to the back surface 3b of the semiconductor chip 3 via an adhesive (heat-dissipating resin) 7. The adhesive 7 contains, for example, a number of metal particles and fillers (for example, alumina and the like), and thus has a thermal conductivity higher than that of the underfill resin 5.

In the example shown in FIGS. 1 and 4, a support frame (for example, stiffener ring) 8 supporting the heatsink 6 surrounds the semiconductor chip 3. The heatsink 6 is bonded and fixed to the back surface 3b and the support frame 8 of the semiconductor chip 3. The metal support frame 8 is preferably fixed to surround the semiconductor chip 3, which can suppress the warpage of the wiring substrate 2 to thereby improve the reliability of mounting. The heatsink 6 can be bonded and fixed to the support frame 8 provided around the semiconductor chip 3 to increase the plane area of the heatsink 6. That is, the heatsink 6 is preferably bonded and fixed to the support frame 8 because the heatsink 6 can ensure its large superficial area to improve the heat radiation performance and can be stably fixed to the semiconductor chip 3.

<Details of Wiring Substrate>

Figure 5:
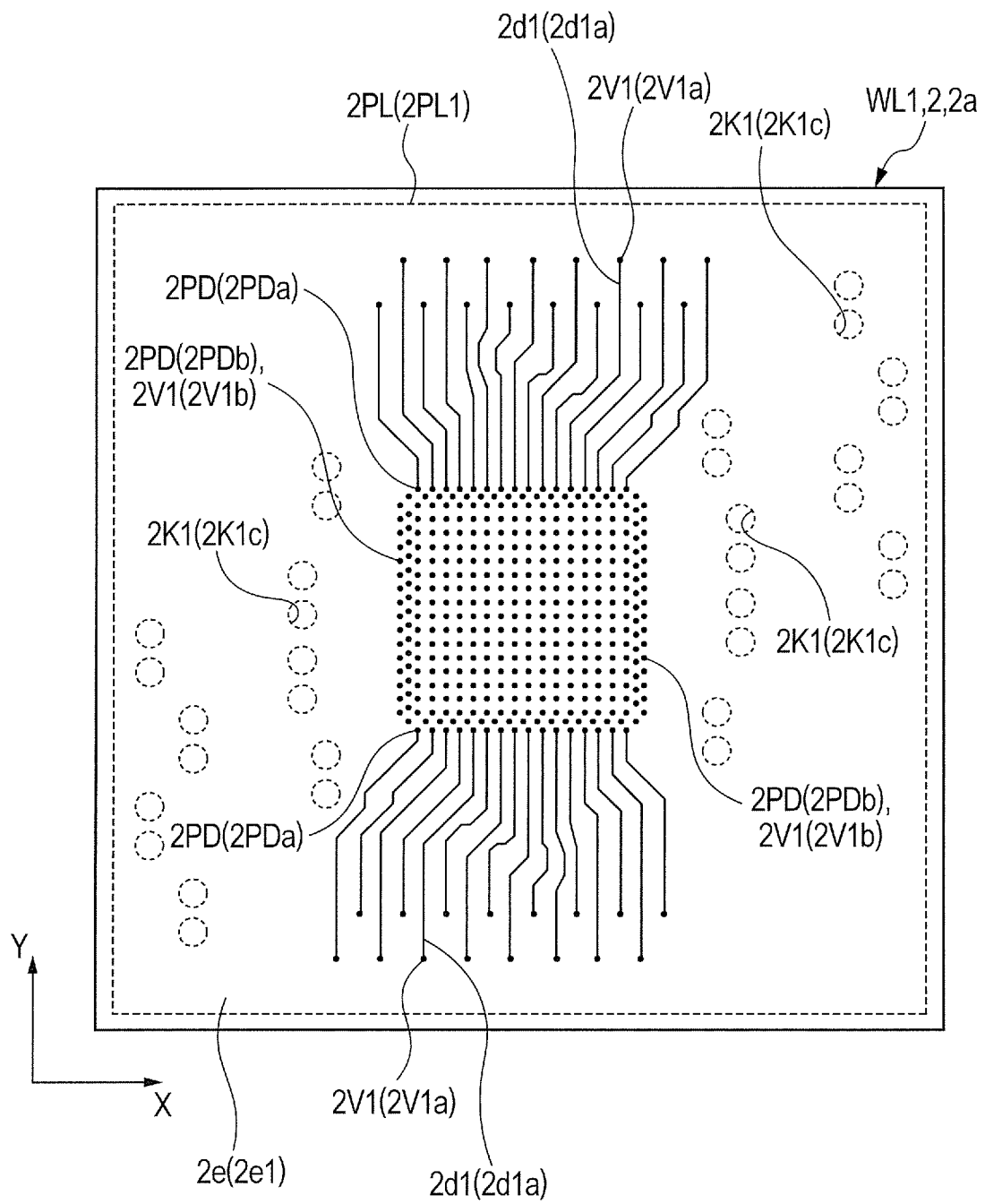
FIG. 5 is a plan view showing a layout of a wiring layer on a chip mounting surface side (first layer) over the wiring substrate shown in FIG. 4.
Figure 6:
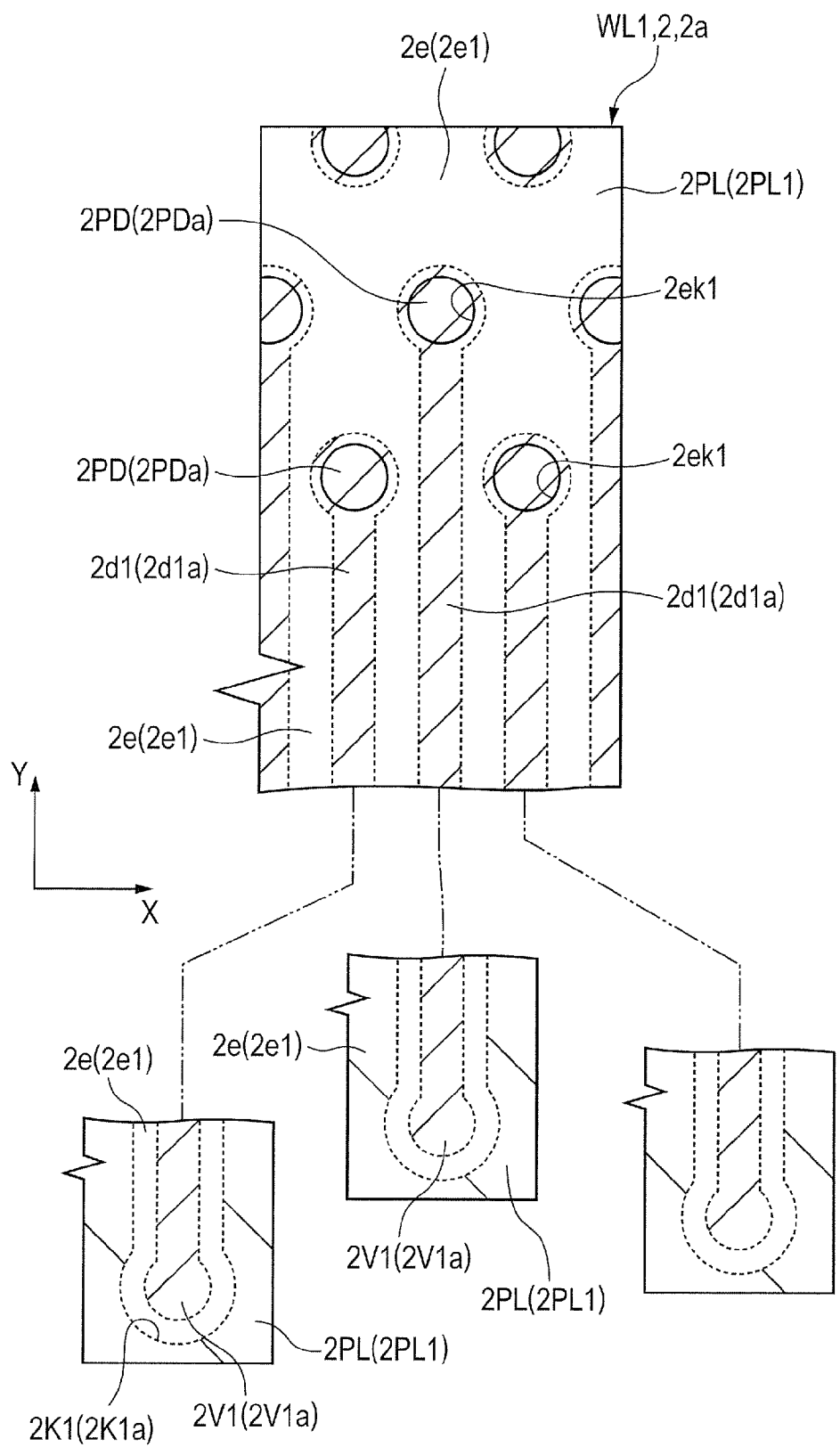
FIG. 6 is an enlarged plan view showing a part of the wiring substrate shown in FIG. 5.
Figure 7:
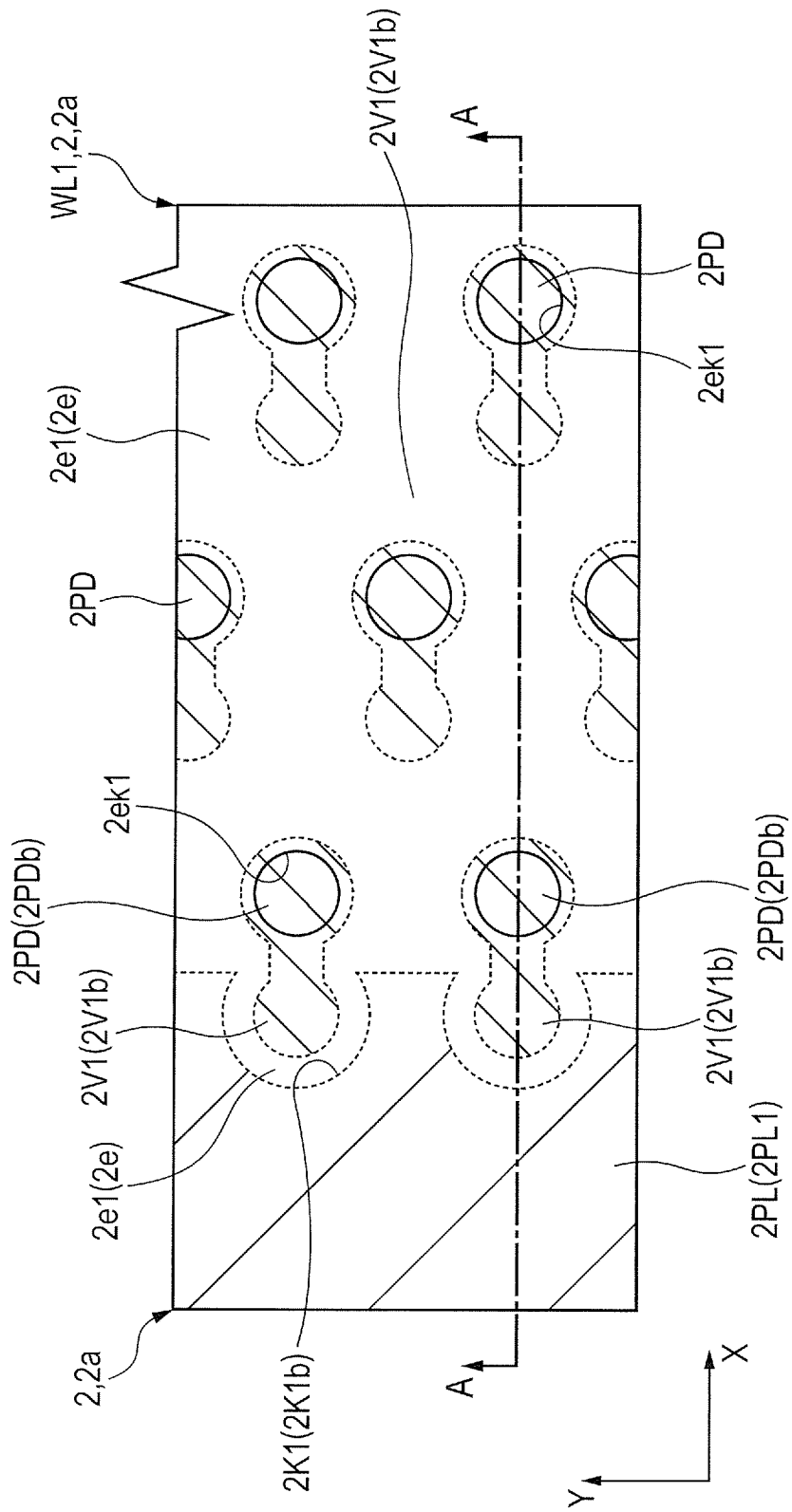
FIG. 7 is an enlarged plan view showing another part of the wiring substrate shown in FIG. 5.
Figure 8:
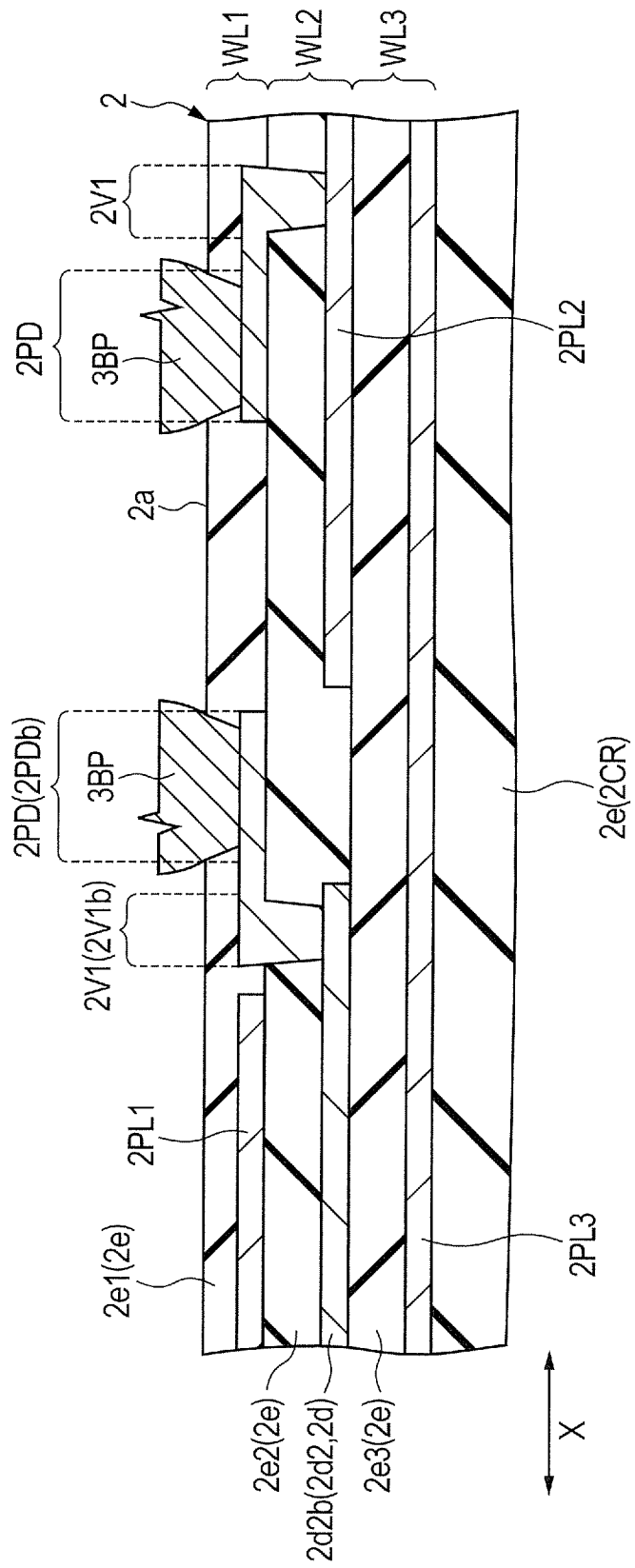
FIG. 8 is an enlarged cross-sectional view taken along the ling A-A of FIG. 7.
Figure 9:
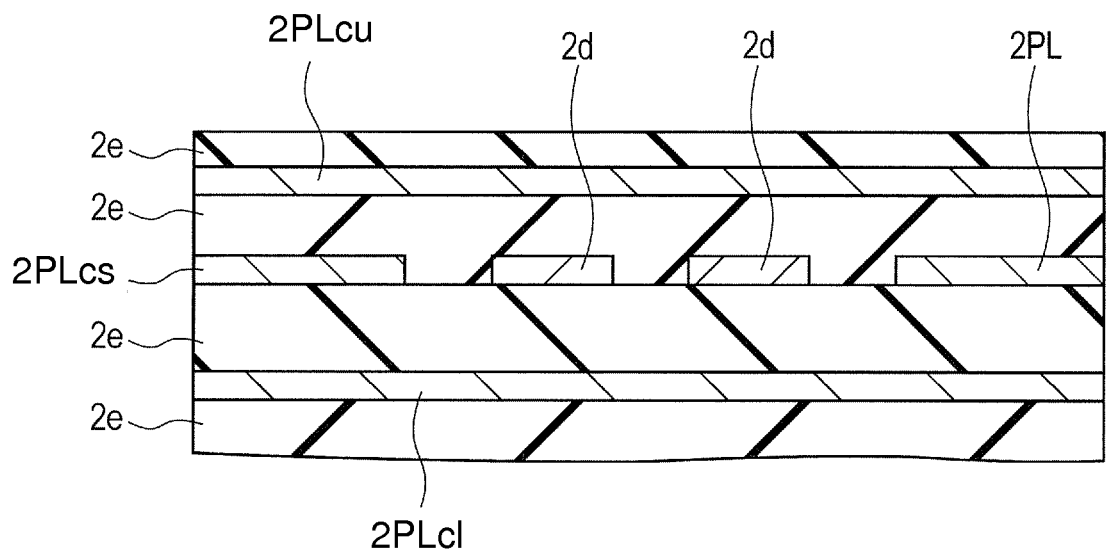
FIG. 9 is an enlarged cross-sectional view showing an example of a strip line wiring structure.
Figure 10:
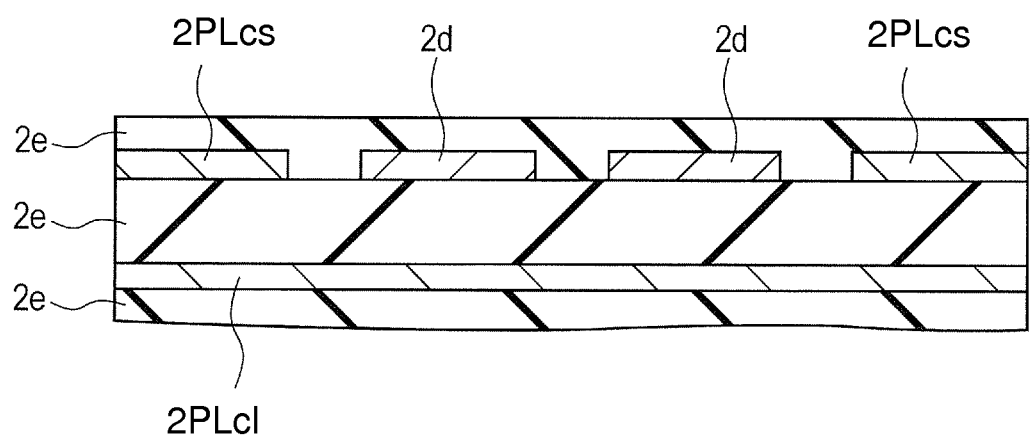
FIG. 10 is an enlarged cross-sectional view showing an example of a microstrip line wiring structure.
Figure 11:
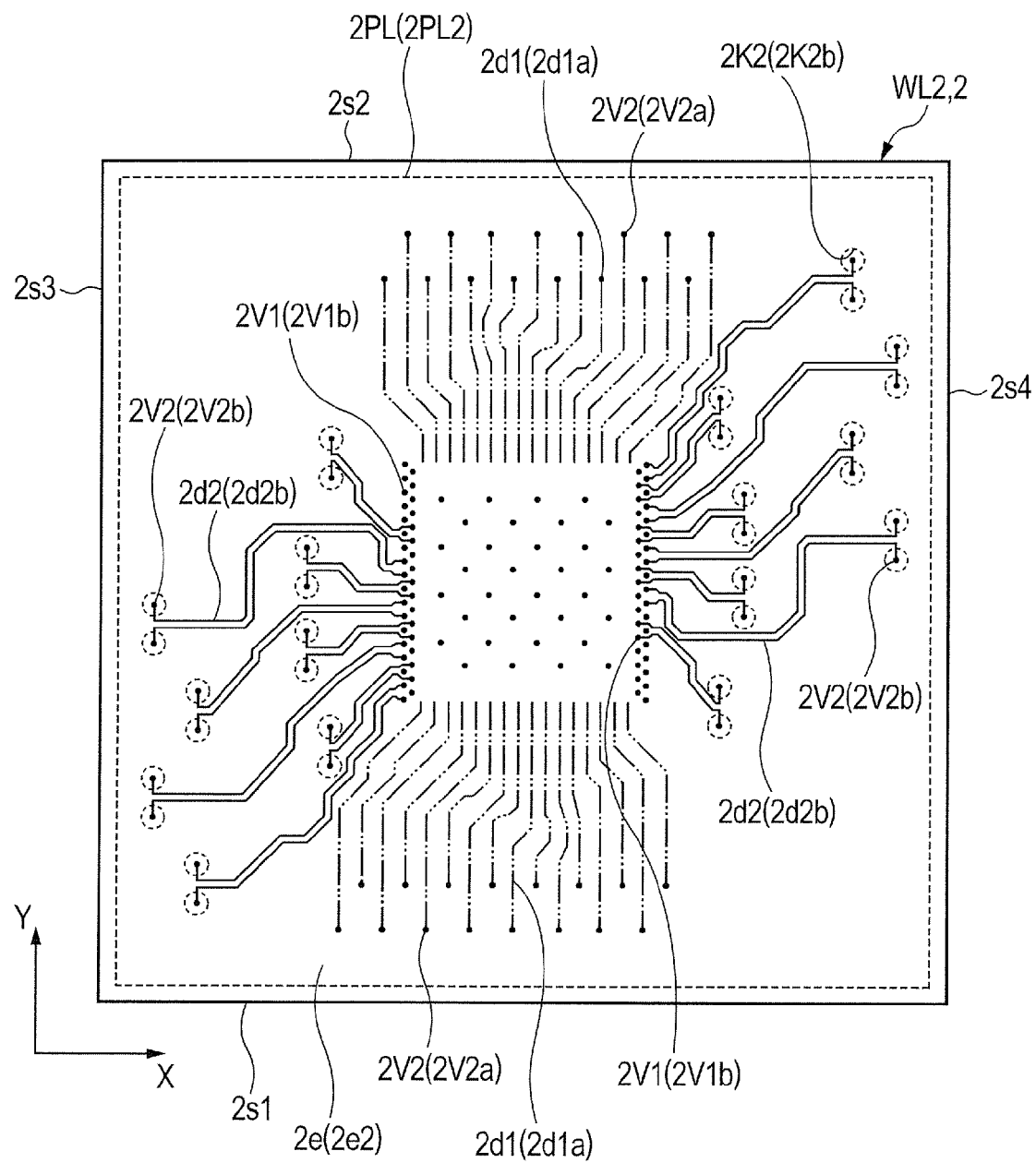
FIG. 11 is a plan view showing a layout of a wiring layer located as one low-level layer (second layer) under the wiring layer shown in FIG. 5.
Figure 12:
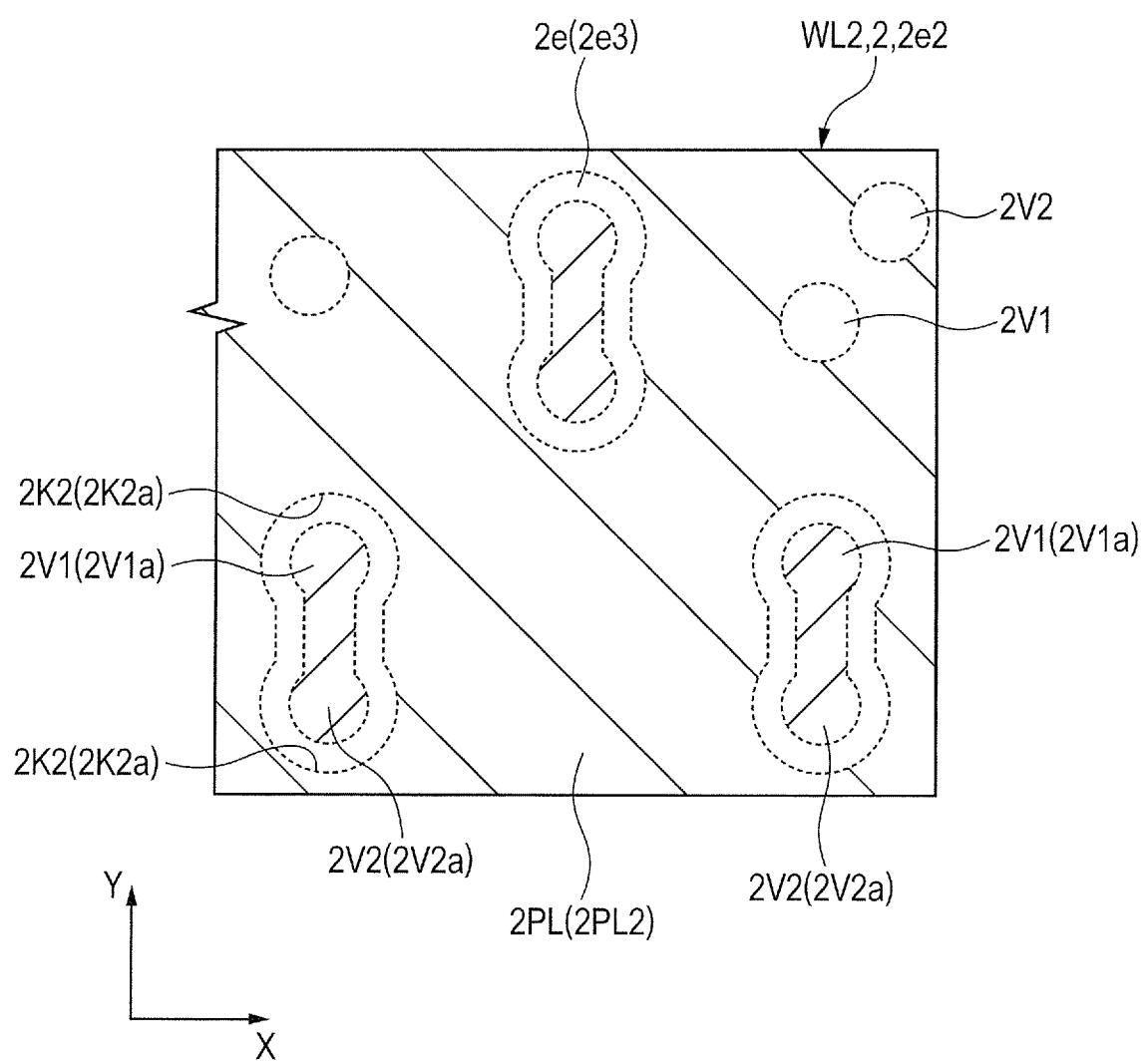
FIG. 12 is an enlarged plan view showing a part of the wiring layer shown in FIG. 11.
Figure 13:
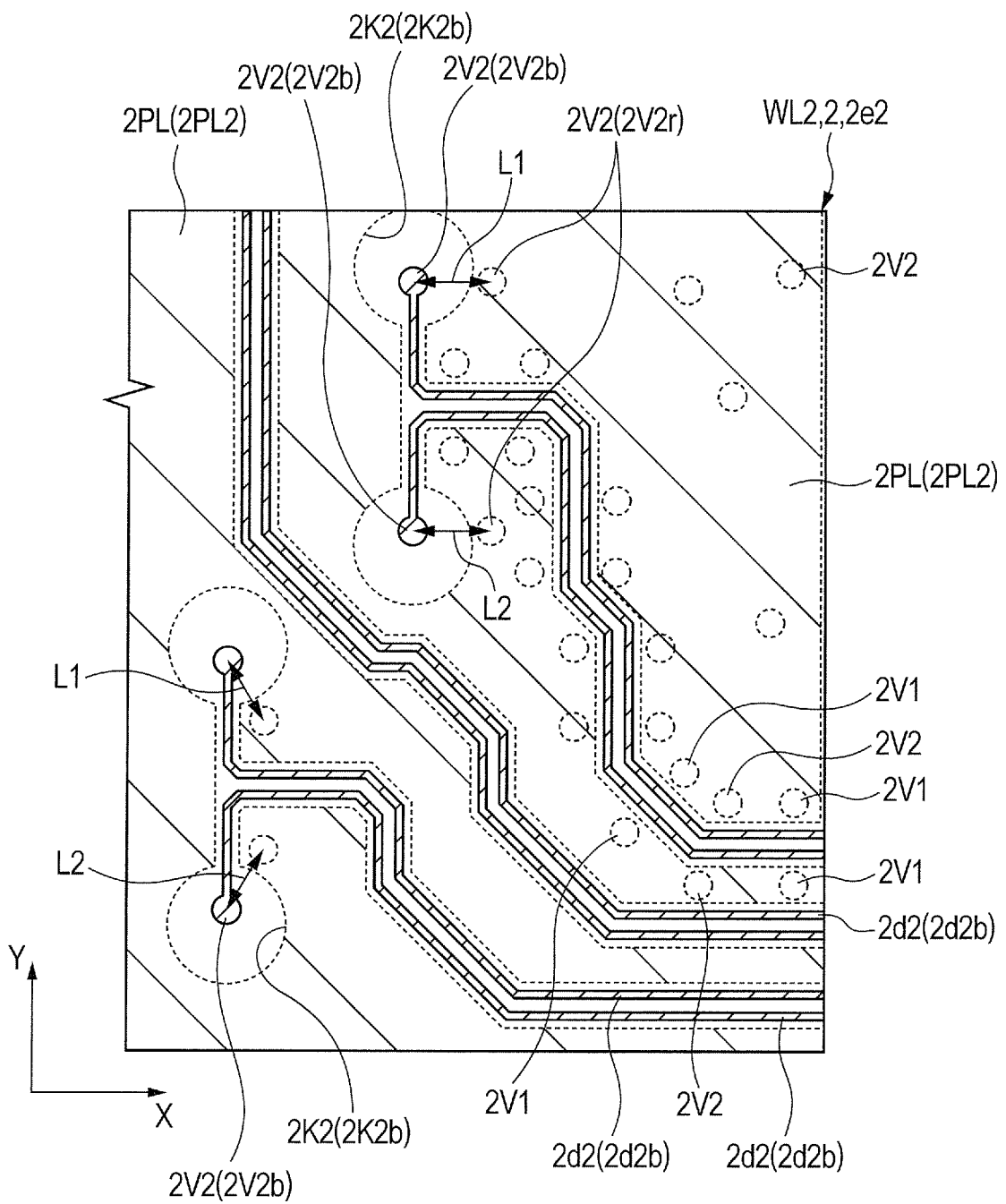
FIG. 13 is an enlarged plan view showing another part of the wiring layer shown in FIG. 11.
Figure 14:
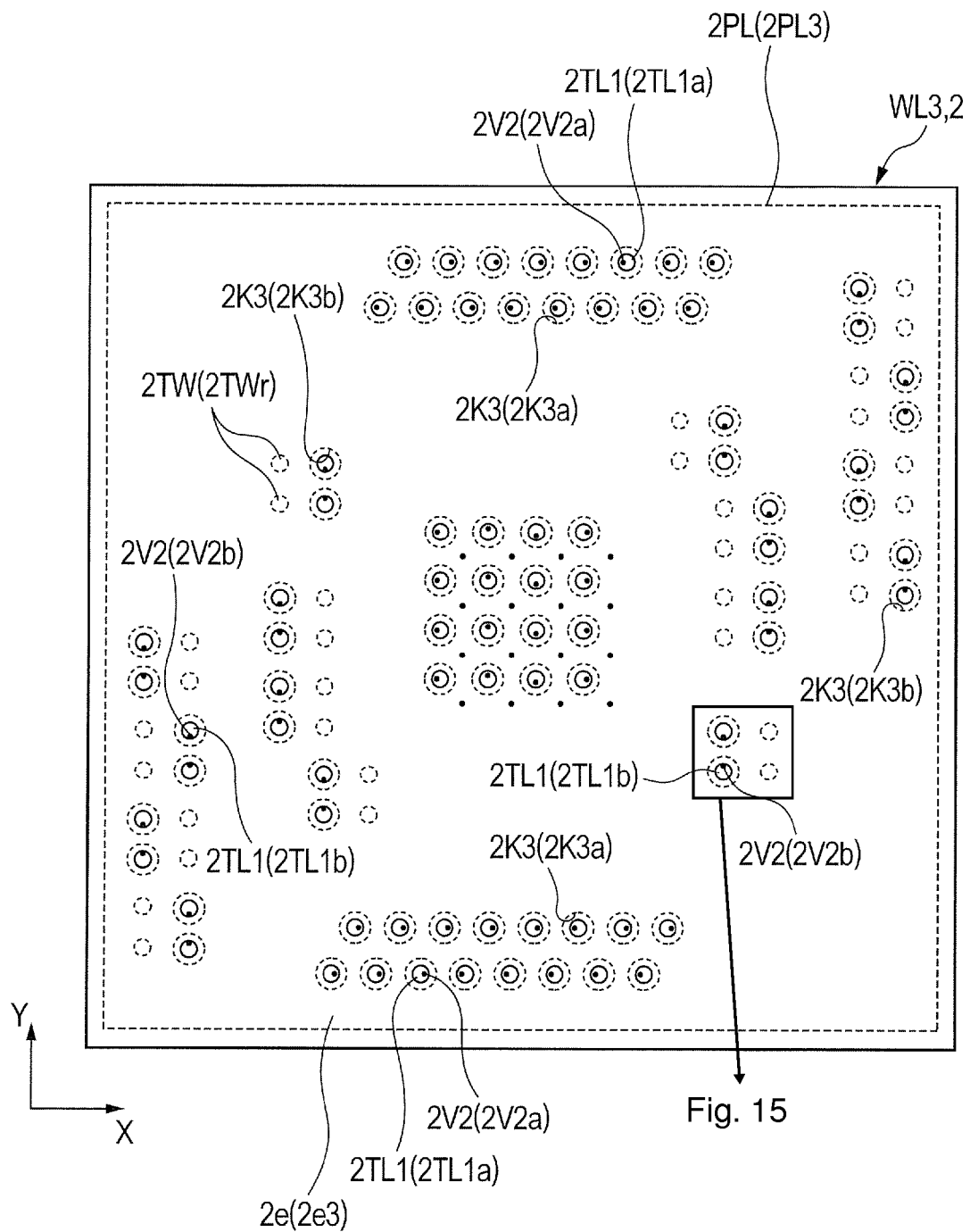
FIG. 14 is a plan view showing a layout of a wiring layer located as one low-level layer (third layer) under the wiring layer shown in FIG. 11.
Figure 15:
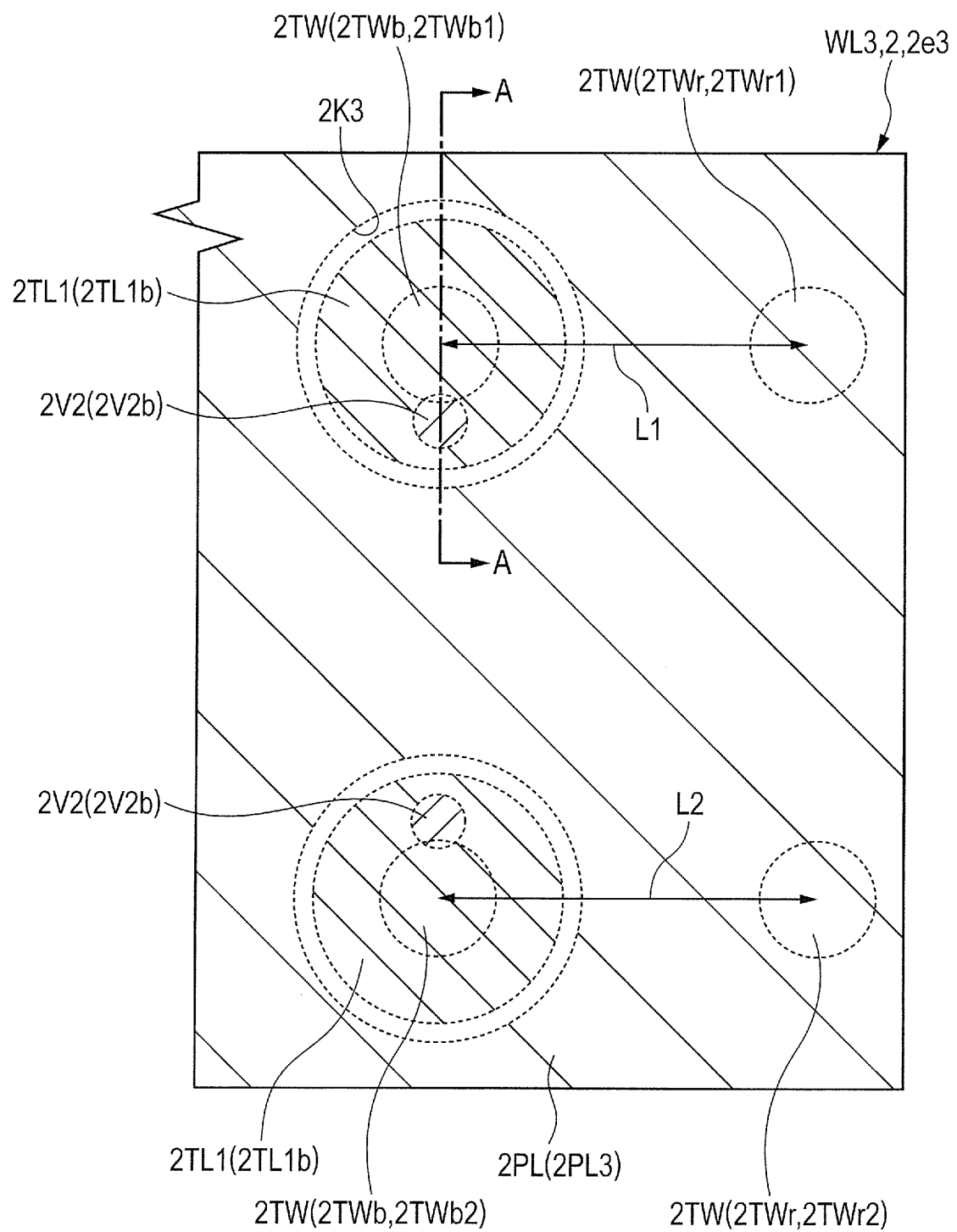
FIG. 15 is an enlarged plan view showing a part of the wiring layer shown in FIG. 14.
Figure 16:
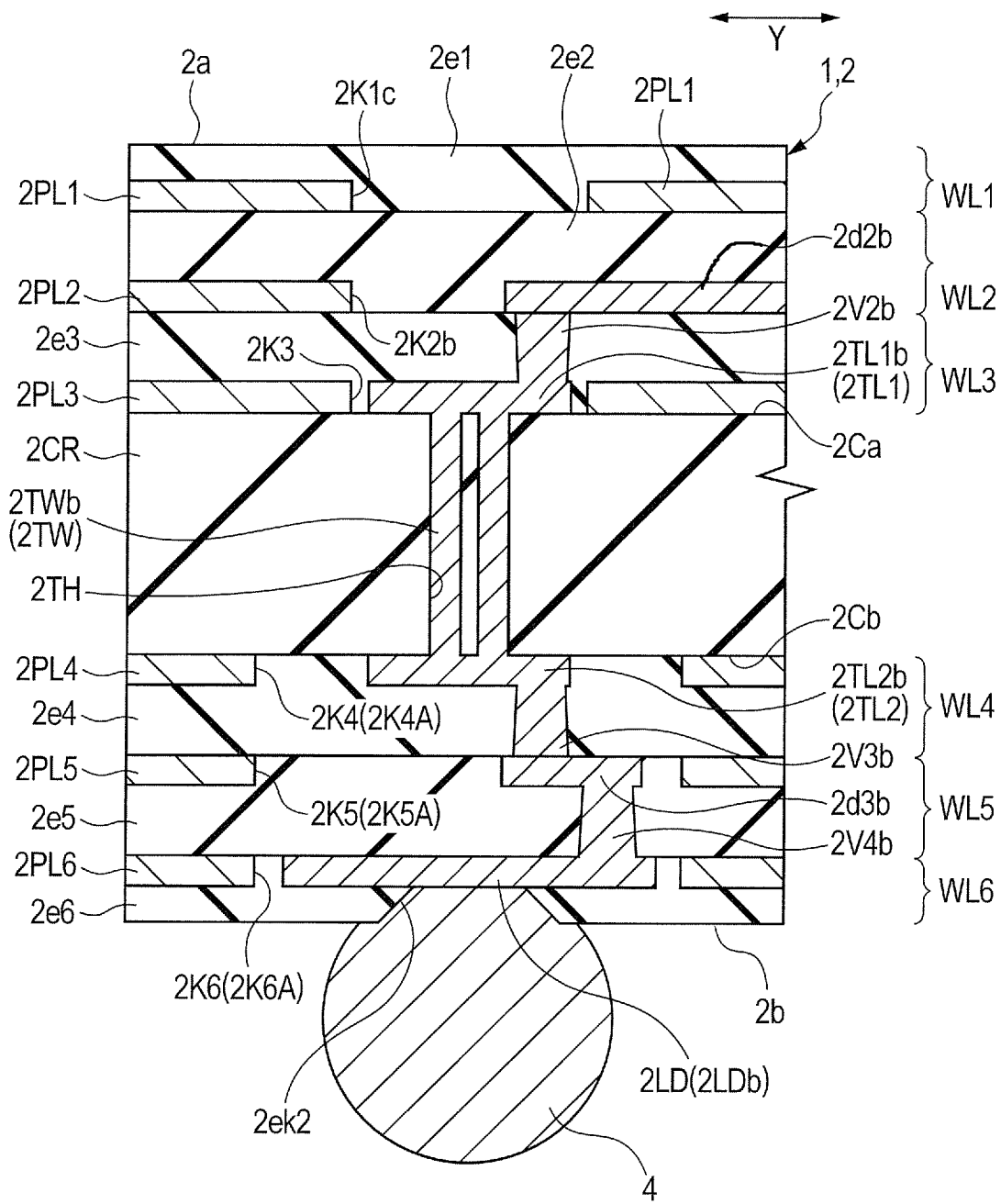
FIG. 16 is an enlarged cross-sectional view taken along the ling A-A of FIG. 15.
Figure 17:
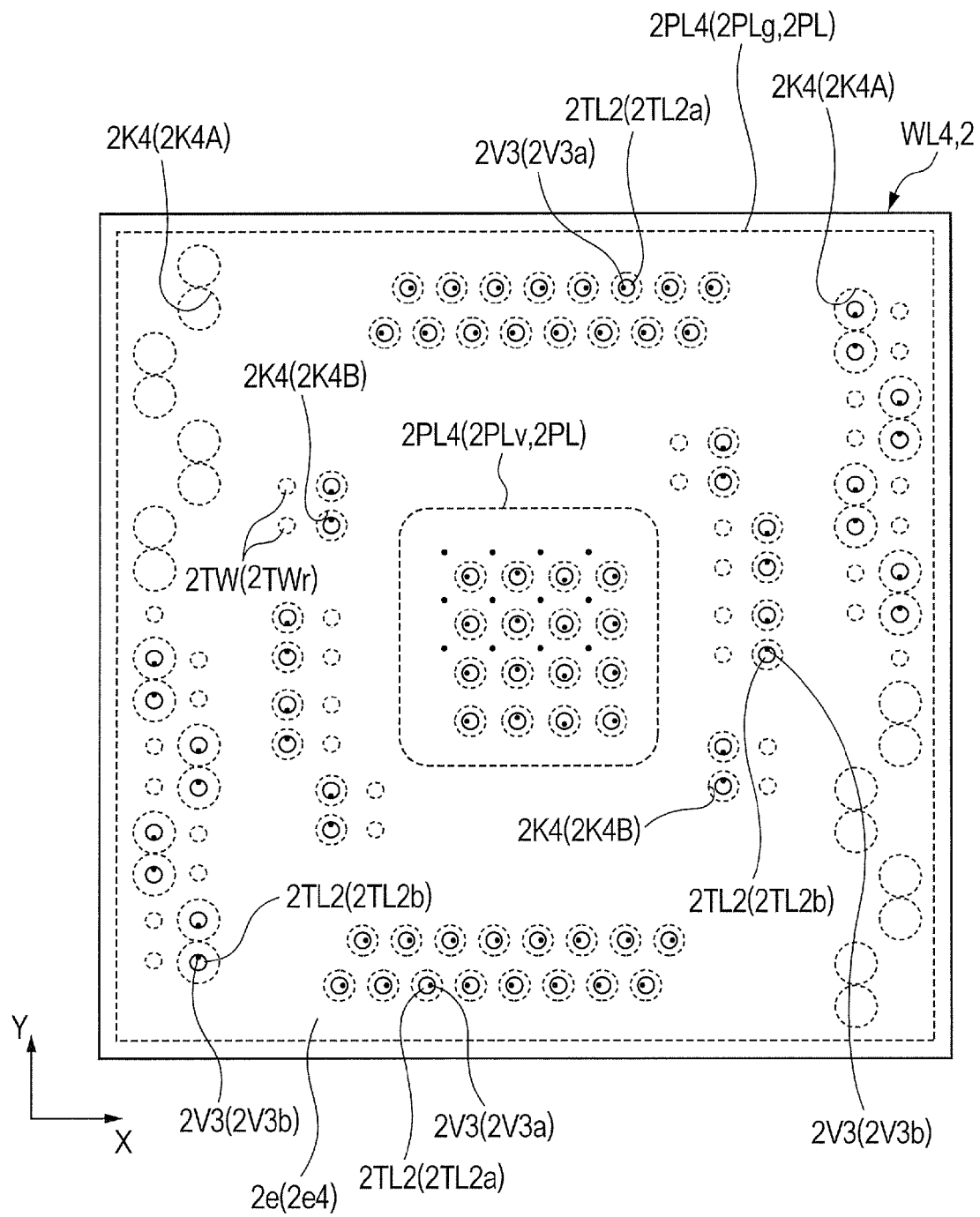
FIG. 17 is a plan view showing a layout of a wiring layer located as one low-level layer (fourth layer) under the wiring layer shown in FIG. 14.
Figure 18:
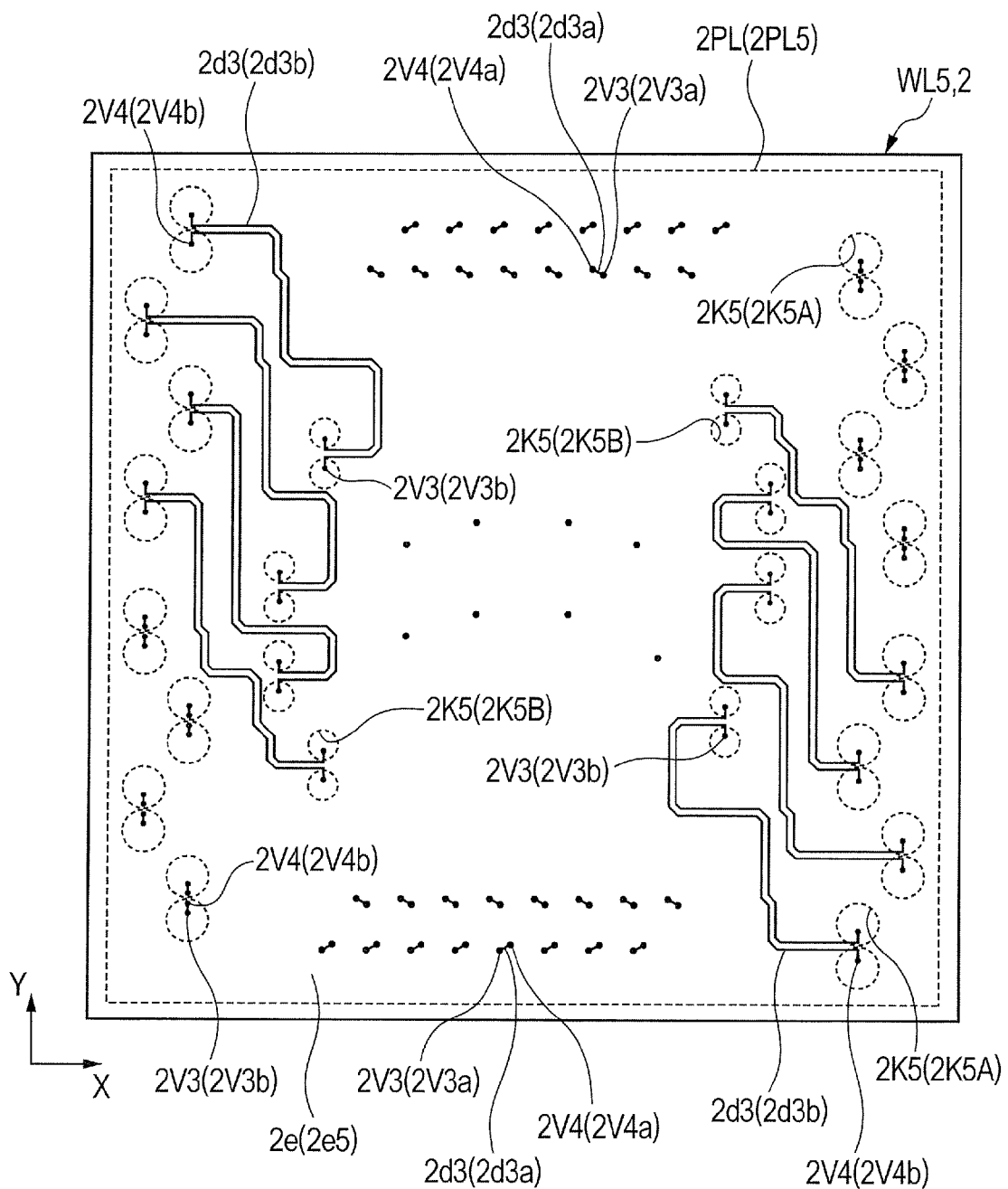
FIG. 18 is a plan view showing a layout of a wiring layer located as one low-level layer (fifth layer) under the wiring layer shown in FIG. 17.
Figure 19:
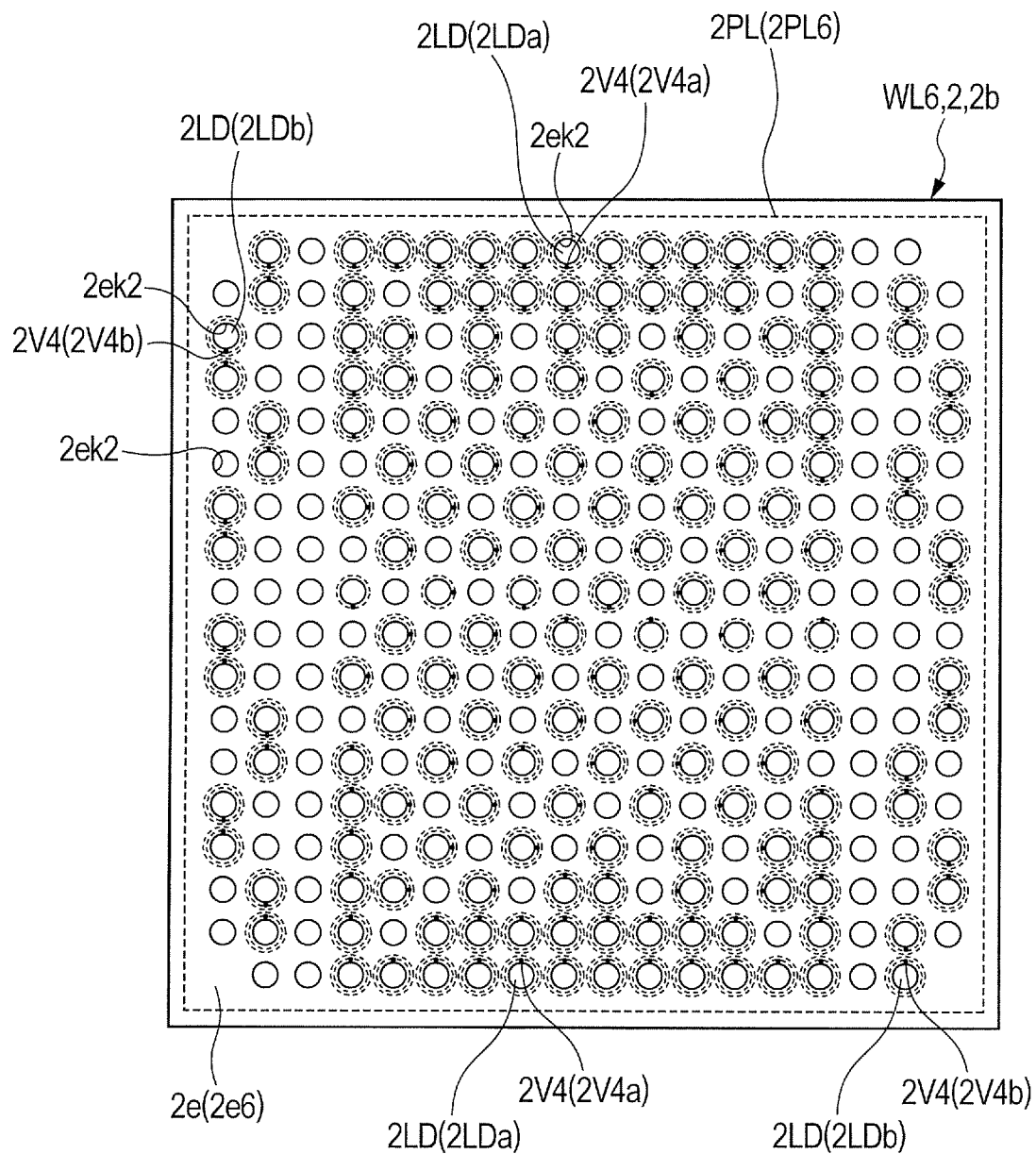
FIG. 19 is a plan view showing a layout of a wiring layer on a lower mounting surface side (sixth layer) over the wiring substrate shown in FIG. 4.

Next, the details of the wiring substrate 2 will be described below with reference to FIGS. 5 to 19. FIG. 5 shows a plan view of a layout of a wiring layer on a chip mounting surface side (first layer) of the wiring substrate shown in FIG. 4. FIG. 6 shows an enlarged plan view of a part of the wiring substrate shown in FIG. 5. FIG. 7 shows an enlarged plan view showing another part of the wiring substrate shown in FIG. 5. FIG. 8 shows an enlarged cross-sectional view taken along the ling A-A of FIG. 7. FIG. 9 shows an enlarged cross-sectional view of an example of a strip line wiring structure. FIG. 10 shows an enlarged cross-sectional view of an example of a microstrip line wiring structure. FIG. 11 shows a plan view of a layout of a wiring layer located as one low-level layer (second layer) under the wiring layer shown in FIG. 5. FIG. 12 shows an enlarged plan view of a part of the wiring substrate shown in FIG. 11. FIG. 13 shows an enlarged plan view of another part of the wiring substrate shown in FIG. 11. FIG. 14 shows a plan view of a layout of a wiring layer located as one low-level layer (third layer) under the wiring layer shown in FIG. 11. FIG. 15 shows an enlarged plan view of a part of the wiring layer shown in FIG. 14. FIG. 16 shows a cross-sectional view taken along the ling A-A of FIG. 15. FIG. 17 shows a plan view of a layout of a wiring layer located as one low-level layer (fourth layer) under the wiring layer shown in FIG. 14. FIG. 18 shows a plan view of a layout of a wiring layer located as one low-level layer (fifth layer) under the wiring layer shown in FIG. 17. FIG. 19 shows a plan view of a layout of a wiring layer on a lower mounting surface side (sixth layer) over the wiring substrate shown in FIG. 4.

Referring to FIGS. 5 and 11, the first-layer wirings 2d1 and the second-layer wirings 2d2 are covered with an insulating layer 2e, but for easy understanding of the wiring layout, the first-layer and second-layer wirings 2d1 and 2d2 are indicated by a solid line (or two-dot chain line). The first-layer wiring 2d1 does not actually exist in the second wiring layer WL2 shown in FIG. 11, but the first-layer wiring 2d1 is represented by the two-dot chain line in FIG. 11 for easy understanding of the planar positional relationship between the first-layer wiring 2d1 and the second-layer wiring 2d2. FIGS. 6, 7, 12, 13, and 15 are all enlarged plan views, but in order to clearly represent the boundary of the conductive pattern, the conductive patterns, including the wirings, via wirings, through hole lands, and conductive plane, are represented by hatching.

<First Wiring Layer>

As shown in FIG. 5, a wiring layer (first wiring layer) WL1 having the upper surface 2a of the wiring substrate 2 as a chip mounting surface includes a plurality of bonding pads 2PD. The bonding pads 2PD include a plurality of bonding pads (low speed bonding pads) 2PDa through which a first signal current flows at the first transmission rate. The bonding pads 2PD include bonding pads (high speed bonding pads) 2PDb through which a second signal current flows at the second transmission rate higher than the first transmission rate. In this embodiment, the differential signal is transmitted to the high speed bonding pads 2PDb at a transmission rate of, for example, 10 to 25 Gbps. Although not shown, the bonding pads 2PD include bonding pads (bonding pads for a power source) which supply a power supply potential or reference potential to the circuit with the semiconductor chip 3 formed thereat as shown in FIG. 4. The bonding pads 2PD include the bonding pad to which the reference potential for reference of the signal transmission path is supplied.

The first wiring layer WL1 includes a plurality of first via wirings 2V1 electrically coupled to the bonding pads 2PD. As shown in FIG. 6, the first via wirings 2V1 include a plurality of low speed first via wirings 2V1a electrically coupled to the low speed bonding pads 2PDa via a plurality of low speed first-layer wirings 2d1a. The low speed first-layer wirings 2d1a and low speed first via wirings 2V1a form the above-mentioned low speed transmission path. As shown in FIG. 7, the first via wirings 2V1 include a plurality of high speed bonding pads 2PDb and a plurality of high speed first via wirings 2V1b electrically coupled to the high speed bonding pads 2PDb. The high speed first via wirings 2V1b form the above-mentioned high speed transmission path.

The first wiring layer WL1 includes a conductive plane (first conductive plane) 2PL1 spaced apart from the first via wirings 2V1 around the first via wirings 2V1. The first conductive plane 2PL1 is a plate-like conductive layer (metal layer, conductive pattern) patterned not to be in contact with the bonding pads 2PD, the first-layer wirings 2d1, and the first via wirings 2V1. In this embodiment, the first conductive plane 2PL1 is formed to cover substantially the entire region of the upper surface 2a of the wiring substrate 2 in which the bonding pads 2PD, the first-layer wirings 2d1, and the first via wirings 2V1 are not formed. The first conductive plane 2PL1 receives the supply of a power supply potential for driving the circuit formed in the semiconductor chip 3 shown in FIG. 4, or a ground potential (GND) as the reference potential. In the example shown in FIG. 5, the first conductive plane 2PL1 receives the supply of the ground potential to be supplied to the first and second circuits in common.

The first wiring layer WL1 includes an insulating layer (first insulating layer, solder resist film) 2e1 covering a plurality of first via wirings 2V1 and the first conductive plane 2PL1. As shown in FIG. 5, the first insulating layer 2e1 is formed to cover the entire upper surface 2a of the wiring substrate 2. As shown in FIG. 6, pad openings 2ek1 are respectively formed at the first insulating layer 2e1 in the regions of the upper surface 2a of the wiring substrate 2 where the bonding pads 2PD are formed. At least parts of the bonding pads 2PD are exposed from the pad openings 2ek1 of the first insulating layer 2e1. The protruding electrodes 3BP shown in FIG. 4 are electrically coupled to the bonding pads 2PD via the pad openings 2ek1 shown in FIG. 6. In this way, the bonding pads 2PD are respectively exposed from the first insulating layer 2e1, so that the electrode pads 3PD of the semiconductor chip 3 can be electrically coupled to the bonding pads 2PD of the wiring substrate 2 as shown in FIG. 4.

A plurality of transmission paths included in the wiring substrate 2 include a transmission path (high speed transmission path) through which the differential signal is transmitted at a transmission rate of, for example, about 10 to 25 Gbps as described above. When the signal is transmitted at high speed in the transmission path in this way, the strip line wiring structure shown in FIG. 9 has more advantages than the microstrip line wiring structure shown in FIG. 10.

In an example of the wiring structure shown in FIG. 9, the conductive planes 2PLcu, 2PLc1 are respectively formed in an upper wiring layer located above the wiring 2d, and a lower wiring layer located under the wiring 2d. In other words, the wiring 2d is sandwiched between the upper conductive plane 2PLc1 formed in the upper wiring layer, and the lower conductive plane 2PLc2 formed in the lower wiring layer in the cross-sectional side view. The conductive plane 2PLcs is formed in the same wiring layer as the wiring 2d to be spaced away from the wiring 2d, and the surroundings of the wiring 2d are enclosed by the conductive plane 2PLcs. The thus-formed wiring structure shown in FIG. 9 is called the "strip line".

In an example of the wiring structure shown in FIG. 10, the conductive plane 2PLc1 is disposed in the wiring layer under the wiring 2d. The conductive plane 2PLcs is formed in the same wiring layer as the wiring 2d to be spaced away from the wiring 2d, and the surroundings of the wiring 2d are enclosed by the conductive plane 2PLcs. In an example of the wiring structure shown in FIG. 10, however, the wiring 2d is formed in the uppermost wiring layer and no conductive plane is formed in the upper layer located above the wiring 2d. The thus-formed wiring structure shown in FIG. 10 is called the "microstrip line".

In the microstrip line shown in FIG. 10, the conductive plane 2PLc1 is disposed in the position that is superimposed over the wiring 2d in the thickness direction under the wiring 2d. Thus, an electric field or a magnetic field is less likely to expand under the wiring 2d. Further, the conductive plane 2PLcs is formed in the same wiring layer as the wiring 2d to be spaced away from the wiring 2d, and the surroundings of the wiring 2d are enclosed by the conductive plane 2PLcs. Thus, the electric field or the magnetic field is less likely to expand around the wiring 2d in the planar view. However, since a conductive plane is not formed above the wiring 2d, the electric field or magnetic field is more likely to expand above the wiring 2d as compared to under the wiring 2d. For this reason, the microstrip line shown in FIG. 10 is more apt to be affected by exogenous noise, or noise transmitted from another wiring disposed near the line, as compared to the strip line shown in FIG. 9.

In order to improve the resistance to noise of a transmission path for a signal current, it is important to perform impedance matching in the transmission path. Particularly, the transmission of the differential signal requires a technique for matching the impedance between opposed signal wirings with high accuracy. When the transmission path for the signal tends to be affected by noise, jitter is caused by crosstalk or exogenous noise. Specifically, in order to increase a signal transmission rate, it is necessary to perform the impedance matching in the transmission path with high accuracy. Without taking the measures against noise, the quality of a transmitted signal might be degraded.

The transmission path to which the microstrip line shown in FIG. 10 is applied is apt to be affected by noise. The microstrip line does not have a conductive plane on one side, and generally needs to include one thick line to achieve the adequate impedance matching, taking into consideration both the differential and common impedances, as compared to the strip line with the same material/thickness.

In contrast, for the strip line shown in FIG. 9, as mentioned above, the wiring 2d is sandwiched between the conductive plane 2PLcu formed in the upper wiring layer, and the conductive plane 2PLcl formed in the lower wiring layer. Also, in the same wiring layer as that including the wiring 2d, another conductive plane 2PLcs is formed spaced apart from the wiring 2d, and the surroundings of the wiring 2d are enclosed by the conductive plane 2PLcs. This wiring structure makes it difficult for the electric field or magnetic field to extend above, under, and around the wiring 2d.

Under conditions with the same wiring width and arrangement distance, the strip line wiring structure shown in FIG. 9 has the high resistance to noise as compared to the microstrip line wiring structure shown in FIG. 10. In other words, the strip line structure can have the smaller width of the wiring 2d than that of the microstrip line structure. For the strip line structure, the distance between the wirings 2d can be made smaller than that of the microstrip line structure. That is, the strip line structure enables the high density design of the high-speed signal path as compared to the microstrip line structure.

As mentioned above, among the transmission paths formed in the wiring substrate 2 of this embodiment, the transmission path including the high speed bonding pads 2PDb and the high speed first via wirings 2V1b as shown in FIG. 7 needs the high speed transmission and high density design for achieving the impedance matching without being affected by noise, as compared to the transmission path including the low speed bonding pads 2PDa, the low speed first-layer wirings 2d1a, and the low speed first via wirings 2V1a as shown in FIG. 6. The transmission path including the high speed bonding pads 2PDb and the high speed first via wirings 2V1b as shown in FIG. 7 takes the strip line wiring structure described above.

Specifically, as shown in FIG. 8, a high speed first via wiring 2V1b serves as an interlayer conductive path for electrically coupling the first wiring layer WL1 to the second wiring layer WL2 in the transmission path (high speed transmission path) including the high speed bonding pads 2PDb. The high speed first via wiring 2V1b is disposed in the vicinity of the high speed bonding pad 2PDb. The high speed first via wiring 2V1b is electrically coupled to the high speed bonding pad 2PDb. The high speed second-layer wiring 2d2b for transmitting a signal at high speed is formed in the second wiring layer WL2. The first conductive plane 2PL1 is formed in the first wiring layer WL1, and the third conductive plane 2PL3 is formed in the wiring layer (third wiring layer) WL3 in the positions where the respective conductive planes are superimposed over the high speed second-layer wirings 2d2b in the thickness direction. In other words, in the cross-sectional side view, the high speed second-layer wiring 2d2b is sandwiched between the first conductive plane 2PL1 of the first wiring layer WL1 and the third conductive plane 2PL3 of the third wiring layer WL3. As shown in FIG. 13, the second conductive plane 2PL2 is formed around the second-layer wiring 2d2 to be spaced apart from the second-layer wiring 2d2. The surroundings of the second-layer wiring 2d2 are enclosed by the second conductive plane 2PL2. In this way, the use of the strip line wiring structure in the high speed transmission path whose transmission rate is very high enables the high density design of the high speed transmission path.

For example, the above microstrip line wiring structure seen in FIG. 10 can be used in the transmission path including the low speed bonding pads 2PDa, low speed first-layer wirings 2d1a, and low speed first via wirings 2V1a, that is, the low speed transmission path whose transmission rate is relatively lower, or the transmission path having a margin of the noise resistance. Thus, for example, as shown in FIG. 6, the low speed bonding pad 2PDa and the low speed first via wiring 2V1a are positioned to be separated by a distance relatively larger than that between the high speed bonding pad 2PDb and the high speed first via wiring 2V1b shown in FIG. 7. The low speed bonding pad 2PDa is electrically coupled to the low speed first via wiring 2V1a via the first-layer wiring 2d1 formed in the first wiring layer WL1. When a space can be ensured for arranging the low speed transmission path in the second wiring layer WL2, the low speed first-layer wiring 2d1a shown in FIG. 6 may be formed in the second wiring layer WL2.

<Second Wiring Layer>

Next, a wiring layer as the second layer (second wiring layer) WL2 shown in FIG. 11 includes a plurality of wirings (second-layer wirings) 2d2 electrically coupled to the first via wirings 2V1, and a plurality of second via wirings 2V2 electrically coupled to the second-layer wirings 2d2. As shown in FIG. 12, the second via wirings 2V2 include a plurality of low speed second via wirings 2V2a electrically coupled to the low speed first via wirings 2V1a formed in the second wiring layer WL2 (see FIG. 6). The low speed second via wirings 2V2a form the above-mentioned low speed transmission path. As shown in FIG. 13, the second via wirings 2V2 include the high speed second via wirings 2V2b electrically coupled to the high speed first via wirings 2V1b via the high speed second wirings 2d2b. The high speed second-layer wirings 2d2b and the high speed second via wirings 2V2b form the above-mentioned high speed transmission path.

As mentioned above, the differential signal is transmitted to the high speed second-layer wirings 2d2b and the high speed second via wirings 2V2b. Thus, among the high speed second-layer wirings 2d2b, respective two high speed second-layer wirings 2d2b that achieve the impedance matching make a pair of wirings to form a differential pair. Thus, among the respective high speed second via wirings 2V2b, two high speed second via wirings 2V2b make a pair of via wirings to form a differential pair.

As shown in FIG. 11, the second-layer wirings 2d2 are disposed not to be superimposed over the first-layer wirings 2d1 in the planar view. In other words, in the planar view, the second-layer wirings 2d2 do not intersect the first-layer wirings 2d1. In an example shown in FIG. 11, the wiring substrate 2 has a quadrilateral shape in the planar view, and includes a first pair of sides 2s1 and 2s2 horizontally extending in the direction X and a second pair of sides 2s3 and 2s4 vertically extending in the direction Y perpendicular to the direction X. The first-layer wirings 2d1 are arranged to extend generally vertically towards the horizontally extending first pair of sides 2s1 or 2s2 from a chip mounting region of the center of the wiring substrate 2 in the planar view. The second-layer wirings 2d2 are arranged to extend generally horizontally towards the vertically extending second pair of sides 2s3 or 2s4 from the chip mounting region of the center of the wiring substrate 2 in the planar view.

In this way, the first-layer wiring 2d1 and the second-layer wiring 2d2 are respectively formed to extend toward the different sides, which can prevent the first-layer wiring 2d1 and the second-layer wiring 2d2 from intersecting each other. When the first-layer wiring 2d1 intersects the second-layer wiring 2d2, the electric field or magnetic field caused in the first-layer wiring 2d1 can cause noise in the second-layer wiring 2d2. That is, in this embodiment, the first-layer wiring 2d1 is disposed not to intersect the second-layer wiring 2d2, which can improve the resistance to noise of the high speed transmission path formed of the high speed second-layer wirings 2d2b.

The second wiring layer WL2 includes a conductive plane (second conductive plane) 2PL2 disposed spaced away from the second-layer wirings 2d2 and second via wiring 2V2, around the second-layer wirings 2d2 and second via wirings 2V2. The second conductive plane 2PL2 is a plate-like conductive layer (metal layer, conductive pattern) patterned not to be in contact with the second-layer wirings 2d2 and the second via wirings 2V2. The second conductive plane 2PL2 receives the supply of the power supply potential for driving the circuit formed in the semiconductor chip 3 shown in FIG. 4, or the grounding potential (GND) as the reference potential. In an example shown in FIG. 11, the second conductive plane 2PL2 receives the supply of the ground potential which is to be commonly supplied to the first and second circuits.

As mentioned above, this embodiment includes a reference path to which a reference potential for reference of the signal transmission path is supplied. For example, in this embodiment, the conductive planes 2PL1 and 2PL3 (see FIG. 8) disposed above and below the second-layer wiring 2d2, and the second conductive plane 2PL2 disposed around the second-layer wiring 2d2 mainly form a reference path. In an example shown in FIG. 13, the reference path via wirings 2V2r are respectively disposed closest to the high speed second via wiring 2V2b disposed in one transmission path forming the differential pair, and the high speed second via wiring 2V2b disposed in the other transmission path. These reference path via wirings 2V2r correspond to the mainly dominant via for reference.

When transmitting the differential signal in a transmission path including the high speed second via wiring 2V2b shown in FIG. 13, a differential delay between one transmission path (for example, on a positive side) forming the differential pair, and the other transmission path (for example, on a negative side) is preferably reduced. For this reason, a distance between the transmission path on the positive side and the corresponding reference path is preferably set equal to that between the transmission path on the negative side and the corresponding reference path. In the example shown in FIG. 13, a first distance (for example, center-to-center spacing) L1 from the high speed second via wiring 2V2b disposed in one transmission path forming the differential pair to the reference path via wiring 2V2r for reference disposed closest to the high speed second via wiring 2V2b is equal to a second distance (for example, center-to-center spacing) L2 from the high speed second via wiring 2V2b disposed in the other transmission path to the reference path via wiring 2V2r for reference disposed closest to the high speed second via wiring 2V2b. This arrangement can reduce the differential delay between one transmission path (for example, on the positive side) and the other transmission path (for example, on the negative side) forming the differential pair to thereby prevent or suppress the difference in skew between the positive and negative sides.

Referring to FIG. 13, for easy understanding, each transmission path is provided with one reference path via wiring 2V2r forming the reference path, but a plurality of reference path via wirings 2V2r can be disposed in each transmission path. In this case, the reference path via wirings 2V2r disposed around one high speed second via wiring 2V2b (for example, on the positive side) are arranged to be symmetric with respect to the reference path via wirings 2V2r disposed around the other high speed second via wiring 2V2b (for example, on the negative side), which can reduce the differential delay described above. As shown in FIG. 13, other second via wirings 2V2 can be connected in addition to the above reference path via wiring 2V2r for reference.

In the example shown in FIG. 13, at the second conductive plane 2PL2, the first via wirings 2V1 and the second via wirings 2V2 are alternatively arranged along the high speed transmission path formed of a pair of paths. FIG. 13 illustrates one typical high speed transmission path. However, the same goes for other high speed transmission paths. In this way, the first via wirings 2V1 and the second via wirings 2V2 are arranged along the one high speed transmission path forming a pair of paths, which can guard the high speed signal, and can also suppress the noise caused by resonance of the conductive plane.

The second wiring layer WL2 includes an insulating layer (second insulating layer) 2e2 covering the second via wirings 2V2 and the second conductive plane 2PL2. As shown in FIG. 11, the second insulating layer 2e2 is formed to cover the entire second wiring layer WL2 of the wiring substrate 2. For example, as shown in FIG. 8, the first via wiring 2V1 serving as an interlayer conductive path for electrically coupling the first wiring layer WL1 shown in FIG. 5 to the second wiring layer WL2 shown in FIG. 11 is formed to penetrate the second insulating layer 2e2. In this way, the bonding pad 2PD formed in the first wiring layer WL1 can be electrically coupled to the second-layer wiring 2d2 formed in the second wiring layer WL2 as shown in FIG. 8.

<Third Wiring Layer>

Next, a wiring layer as the third layer (third wiring layer) WL3 shown in FIG. 14 includes a plurality of through hole lands (first through hole lands, upper through hole lands) 2TL1 electrically coupled to the second via wirings 2V2. As shown in FIG. 14, the first through hole lands 2TL1 include low speed first through hole lands 2TL1a electrically coupled to the low speed second via wirings 2V2a formed in the second wiring layer WL2 (see FIG. 12). The low speed first through hole lands 2TL1a help form the above-mentioned low speed transmission path. As shown in FIG. 15, the first through hole lands 2TL1 includes high speed first through hole lands 2TL1b electrically coupled to the second via wirings 2V2 formed in the second wiring layer WL2 (see FIG. 13). The high speed first through hole lands 2TL1b help form the above-mentioned high speed transmission path. As shown in FIGS. 15 and 16, the high speed first through hole lands 2TL1b are respectively coupled to through main through hole wirings 2TWb forming the high speed transmission path.

The high speed first through hole lands 2TL1b receive the transmission of the differential signal as mentioned above. In the respective high speed first through hole lands 2TL1b, two high speed second via wirings 2V2b form a differential pair.

The third wiring layer WL3 includes a conductive plane (third conductive plane) 2PL3 which is disposed around the first through hole lands 2TL1, and is spaced apart from the first through hole lands 2TL1. The third conductive plane 2PL3 is a plate-like conductive layer (metal layer, conductive pattern) patterned not to be in contact with the first through hole lands 2TL1. In this embodiment, the third conductive plane 2PL3 is formed to cover the entire region of the third wiring layer WL3 of the semiconductor substrate 2 where the first through hole lands 2TL1 are not formed. The third conductive plane 2PL3 receives the supply of the power supply potential for driving the circuit formed in the semiconductor chip 3 shown in FIG. 4, or the grounding potential (GND) as the reference potential. In the example shown in FIG. 14, the third conductive plane 2PL3 receives the supply of the ground potential which is to be commonly supplied to the first and second circuits via the through hole wirings 2TW.

As shown in FIGS. 15 and 16, the third conductive plane 2PL3 formed in the third wiring layer WL3 is provided with third layer openings 2K3 to separate the first through hole lands 2TL1 from the third conductive plane 2PL3.

The third wiring layer WL3 includes an insulating layer (third insulating layer) 2e3 covering the first through hole lands 2TL1. As shown in FIGS. 14 and 15, the third insulating layer 2e3 is formed to cover the entire third wiring layer WL3 of the wiring substrate 2. For example, as shown in FIG. 16, the second via wiring 2V2 serving as an interlayer conductive path for electrically coupling the second wiring layer WL2 shown in FIG. 11 to the third wiring layer WL3 shown in FIG. 14 is formed to penetrate the third insulating layer 2e3. In this way, as shown in FIG. 16, the second-layer wiring 2d2 formed in the second wiring layer WL2 can be electrically coupled to the first through hole land 2TL1 formed in the third wiring layer WL3.

<Core Insulating Layer>

As shown in FIG. 16, the third wiring layer WL3 is formed over an upper surface 2Ca of the core insulating layer 2CR. The core insulating layer 2CR has the upper surface (first surface) 2Ca with the third wiring layer WL3 formed thereover, and a lower surface (second surface) 2Cb positioned opposite to the upper surface 2Ca. The core insulating layer 2CR includes a plurality of through holes 2TH (see FIG. 15) formed to penetrate the layer and extending between the upper first surface 2Ca and the lower second surface 2Cb. The core insulating layer 2CR also has through hole wirings 2TW formed to cover the inner walls of the through holes 2TH. The through hole wirings 2TW are integrally formed with the first through hole land 2TL1 formed at the upper first surface 2Ca of the core insulating layer 2CR, and the second through hole land 2TL2 (lower through hole land) formed at the lower second surface 2Cb of the core insulating layer 2CR.

The core insulating layer 2CR is used as the base when forming the wiring substrate 2, for example, by a build-up method. Thus, the thickness of the core insulating layer 2CR is larger than that of each of the other insulating films 2e1, 2e2, 2e3, 2e4, 2e5, and 2e6. In the example shown in FIG. 16, the thickness of each of the insulating layers 2e2, 2e3, 2e4, and 2e5 is in a range of about 30 to 35 μm. In contrast, the thickness of the core insulating layer 2CR is, for example, in a range of about 200 to 800 μm.

As mentioned above, this embodiment includes a reference path to which a reference potential for reference of the signal transmission path is supplied. For example, referring to FIG. 15 which is an enlarged plan view of a portion of FIG. 14, reference through hole wirings 2TWr are positioned closest to the first main through hole wiring 2TWb1 disposed in one transmission path forming the differential pair, and the second main through hole wiring 2TWb2 disposed in the other transmission path. The reference through hole wiring 2TWr corresponds to the mainly dominant through hole wiring for reference.

As mentioned above, in transmitting a differential signal, a distance between the transmission path on the positive side and the corresponding reference path is preferably set equal to that between the transmission path on the negative side and the corresponding reference path from the viewpoint of reducing a differential delay between one transmission path (for example, on the positive side) and the other path (for example, on the negative side) which form the differential pair. Specifically, as mentioned above, the thickness of the core insulating layer 2CR is more than the thickness of each of other insulating layers 2e2, 2e3, 2e4, and 2e5. The through hole wiring 2TW is largely affected by the connection distance in the thickness direction of the wiring substrate 2 rather than by the second via wiring 2V2 shown in FIG. 13. The asymmetric structure tends to lead to a difference in skew or generation of jitter.

In this embodiment, as shown in FIG. 15, the reference through hole wirings 2TWr are arranged such that the distance between the transmission path on the positive side and the reference path is preferably set equal to that between the transmission path on the negative side and the corresponding reference path. Specifically, a first distance (for example, center-to-center spacing) L1 from the first main through hole wiring 2TWb1 disposed in one transmission path forming the differential pair to the first reference through hole wiring 2TWr1 for reference disposed closest to the through hole wiring first main 2TWb1 is equal to a second distance (for example, center-to-center spacing) L2 from the second main through hole wiring 2TWb2 disposed in the other transmission path to the second reference through hole wiring 2TWr2 for reference disposed closest to the second main through hole wiring 2TWb2. This arrangement can reduce a differential delay between the one transmission path (for example, on the positive side) and the other transmission path (for example, on the negative side) which form the differential pair to thereby prevent or suppress the difference in skew between the positive and negative sides, so that the impedance of the through hole portion on the positive side can be matched with that on the negative side.

FIG. 15 shows one transmission path forming the differential pair, by way of example. As shown in FIG. 14, each of the high speed transmission paths is provided with the reference through hole wiring 2TWr forming the reference path, like FIG. 15.

<Fourth Wiring Layer>

Then, a fourth wiring layer (fourth wiring layer) WL4 is formed over the lower surface 2Cb of the core insulating layer 2CR. As shown in FIG. 17, the fourth wiring layer WL4 includes through hole lands (second through hole lands, lower through hole lands) 2TL2. The second through hole lands 2TL2 are respectively formed integrally with the through holes 2TH shown in FIG. 16. The second through hole lands 2TL2 include low speed second through hole lands 2TL2a electrically coupled to the low speed first through hole lands 2TL1a shown in FIG. 14. The low speed second through hole lands 2TL2a help form the above-mentioned low speed transmission path. The second through hole lands 2TL2 include high speed second through-hole lands 2TL2b electrically coupled to the high speed first through hole lands 2TL1b shown in FIG. 14. The high speed second through hole lands 2TL2b help form the above-mentioned high speed transmission path.

The low speed second through hole lands 2TL2a are electrically coupled to the low speed third via wirings 2V3a. The high speed second through hole lands 2TL2*b* are electrically coupled to the high speed third via wirings 2V3*b*.

The fourth wiring layer WL4 includes a conductive plane (fourth conductive plane) 2PL4 which is disposed around the second through hole lands 2TL2, and is spaced apart from the second through hole land 2TL2. The fourth conductive plane 2PL4 is a plate-like conductive layer (metal layer, conductive pattern) patterned not to be in contact with the second through hole lands 2TL2. In this embodiment, the fourth conductive plane 2PL4 is formed to cover the entire region of the fourth wiring layer WL4 of the semiconductor substrate 2 where the second through hole lands 2TL2 are not formed. In this embodiment, the fourth conductive plane 2PL4 receives the supply of power supply potential for driving the circuit formed in the semiconductor chip 3 shown in FIG. 4, or the ground potential (GND) as the reference potential.

In the example shown in FIG. 17, the ground potential is supplied to the fourth conductive plane 2PL4 at the peripheral edge of the wiring substrate 2, and the power supply potential is supplied to the fourth conductive plane 2PL4 at the center of the wiring substrate 2. In other words, a central conductive plane 2PLv for a power supply potential is disposed at the center of the fourth wiring layer WL4 shown in FIG. 17. The power supply potential for driving the circuit formed in the semiconductor chip 3 shown in FIG. 4 is supplied to the central conductive plane 2PLv for a power supply potential. A peripheral conductive plane 2PLg for a reference potential is disposed at the peripheral edge of the fourth wiring layer WL4. The reference potential for driving the circuit formed in the semiconductor chip 3 shown in FIG. 4 is supplied to the peripheral conductive plane 2PLg. In order to supply the potential in common to the circuits, the central conductive plane 2PLv for the power supply potential can be shared among the circuits. In order to supply different potentials to the circuits formed in the semiconductor chip 3, the peripheral conductive plane 2PLv for the power supply potential shown in FIG. 17 may be divided into a plurality of parts, which are electrically separated from each other.

The fourth wiring layer WL4 includes an insulating layer (fourth insulating layer) 2*e*4 covering the second through hole lands 2TL2. As shown in FIG. 17, the fourth insulating layer 2*e*4 is formed to cover the entire fourth wiring layer WL4 of the wiring substrate 2. For example, the third via wiring 2V3 serving as an interlayer conductive path for electrically coupling the fourth wiring layer WL4 shown in FIG. 16 to the fifth wiring layer WL5 is formed to penetrate the fourth insulating layer 2*e*4. Thus, as shown in FIG. 16, the fifth layer wiring 2*d*3 formed in the fifth wiring layer WL5 can be electrically coupled to the second through hole land 2TL2 formed in the fourth wiring layer WL4 by means of the third via wiring 2V3.

<Fifth Wiring Layer>

Next, a wiring layer as a fifth layer (fifth wiring layer) WL5 shown in FIGS. 16 and 18 is formed as a lower layer under the fourth wiring layer WL4. The fifth wiring layer WL5 includes a plurality of via wirings (third via wirings) 2V3 electrically coupled to the second through hole lands 2TL2 shown in FIG. 17, and a plurality of wirings (fifth layer wirings) 2*d*3 electrically coupled to the third via wirings 2V3. As shown in FIG. 17, the third via wirings 2V3 include a plurality of low speed third via wirings 2V3*a* electrically coupled to the low speed second through hole lands 2TL2*a* formed in the fourth wiring layer WL4 shown in FIG. 17. A plurality of fifth layer wirings 2*d*3 include low speed fifth layer wirings 2*d*3*a* electrically coupled to the low speed third via wirings 2V3*a*. The low speed fifth layer wirings 2*d*3*a* and the low speed third via wirings 2V3*a* form the above-mentioned low speed transmission path.

As shown in FIG. 17, the third via wirings 2V3 include a plurality of high speed third via wirings 2V3*b* electrically coupled to the high speed second through hole lands 2TL2*b* formed in the fourth wiring layer WL4 shown in FIG. 17. The fifth layer wirings 2*d*3 include high speed fifth layer wirings 2*d*3*b* electrically coupled to the high speed third via wirings 2V3*b*. The high speed fifth layer wirings 2*d*3*b* and the high speed third via wirings 2V3*b* form the above-mentioned high speed transmission path.

As mentioned above, the differential signal is transmitted to the high speed fifth layer wirings 2*d*3*b* and the high speed third via wirings 2V3*b*. Thus, among the respective high speed fifth layer wirings 2*d*3*b*, two high speed fifth layer wirings 2*d*3*b* that achieve the impedance matching make a pair of wirings to form a differential pair. Thus, among the respective high speed third via wirings 2V3*b*, two high speed third via wirings 2V3*b* make a pair of via wirings to form a differential pair.

Specifically, as shown in FIG. 16, the fifth layer wirings 2*d*3 are electrically coupled to the fourth via wirings 2V4, which serves as an interlayer conductive path for electrically coupling the sixth wiring layer WL6 to the fifth wiring layer WL5.

As shown in FIG. 18, in the planar view, the fifth layer wirings 2*d*3 are disposed not to be superimposed over the first-layer wirings 2*d*1 shown in FIG. 5. In other words, the fifth layer wirings 2*d*3 do not intersect the first-layer wirings 2*d*1 shown in FIG. 5 in the planar view. In this way, the high speed fifth layer wirings 2*d*3*b* are arranged not to intersect the first-layer wirings 2*d*1, which can improve the resistance to noise of the high speed transmission path formed of the high speed fifth layer wirings 2*d*3*b*.

The fifth wiring layer WL5 includes a conductive plane (fifth conductive plane) 2PL5 which is disposed around the fifth layer wirings 2*d*3 and the third and fourth via wirings 2V3, 2V4, respectively, and is spaced apart from the fifth layer wirings 2*d*3 and the third and fourth via wirings 2V3, 2V4. The fifth conductive plane 2PL5 is a plate-like conductive layer (metal layer, conductive pattern) patterned not to be in contact with the fifth layer wirings 2*d*3 and the third and fourth via wirings 2V3, 2V4. The fifth conductive plane 2PL5 receives the supply of the power supply potential for driving the circuit formed in the semiconductor chip 3 shown in FIG. 4, or the ground potential (GND) as the reference potential. In an example shown in FIG. 18, the firth conductive plane 2PL5 receives the supply of the ground potential which is to be commonly supplied to the first and second circuits.

The fifth wiring layer WL5 includes an insulating layer (fifth insulating layer) 2*e*5 covering the fifth layer wirings 2*d*3, the third and fourth via wirings 2V3, 2V4, and the fifth conductive plane 2PL5. As shown in FIG. 18, the fifth insulating layer 2*e*5 is formed to cover the entire fifth wiring layer WL5 of the wiring substrate 2. The fourth via wiring 2V4, serving as an interlayer conductive path for electrically coupling the fifth wiring layer WL5 to the sixth wiring layer WL6 as shown in FIG. 16, is formed to penetrate the fifth insulating layer 2*e*5. As shown in FIG. 16, the fifth layer wiring 2*d*3 formed in the fifth wiring layer WL5 can be electrically coupled to the ball lands 2LD formed in the sixth wiring layer WL6.

Although not shown in the figure, also in the fifth wiring layer WL5, the fourth via wirings 2V4 for reference are respectively disposed in the high speed transmission paths such that the distance between the transmission path on the positive side and the main dominant reference path forming the differential pair is equal to that between the transmission path on the negative side and the main dominant reference path. The structure of the fourth via wiring 2V4 for reference has the same as that of the reference path via wiring 2V2r for reference described using FIG. 13, and thus a repeated description thereof will be omitted.

<Sixth Wiring Layer>

Next, a wiring layer as a sixth layer (sixth wiring layer) WL6 shown in FIG. 19 is formed as a lower layer under the fifth wiring layer WL5. The sixth wiring layer WL6 includes a plurality of via wirings (fourth via wirings) 2V4 electrically coupled to the third via wirings 2V3 shown in FIG. 18, and a plurality of ball lands 2LD electrically coupled to the fourth via wirings 2V4. The fourth via wirings 2V4 include a plurality of low speed fourth via wirings 2V4a electrically coupled to the low speed third via wirings 2V3a formed in the fifth wiring layer WL5 shown in FIG. 18. The low speed fourth via wirings 2V4a and the low speed ball lands 2LDa electrically coupled to the low speed fourth via wirings 2V4a form the above-mentioned low speed transmission path.

As shown in FIG. 18, the fourth via wirings 2V4 include a plurality of high speed fourth via wirings 2V4b electrically coupled to the high speed third via wirings 2V3b formed in the fifth wiring layer WL5 shown in FIG. 18. The high speed fourth via wirings 2V4b and the high speed ball lands 2LDb electrically coupled to the high speed fourth via wirings 2V4b form the above-mentioned high speed transmission path.

As mentioned above, the differential signal is transmitted to the high speed ball lands 2LDb and the high speed fourth via wirings 2V4b. In the respective high speed fourth via wirings 2V4b, two high speed fourth via wirings 2V4b form a differential pair. In the respective high speed ball lands 2LDb, two high speed ball lands 2LDb form a differential pair.

The sixth wiring layer WL6 includes the conductive plane (sixth conductive plane) 2PL6 which is disposed around the ball lands 2LDa and 2LDb and fourth via wirings 2V4a and 2V4b, and is spaced apart from the ball lands 2LDa and 2LDb and fourth via wirings 2V4a and 2V4b. The sixth conductive plane 2PL6 is a plate-like conductive layer (metal layer, conductive pattern) patterned not to be in contact with the ball lands 2LDa and 2LDb and fourth via wirings 2V4a and 2V4b. The sixth conductive plane 2PL6 receives the supply of the power supply potential for driving the circuit formed in the semiconductor chip 3 shown in FIG. 4, or the grounding potential (GND) as the reference potential. In an example shown in FIG. 19, the sixth conductive plane 2PL6 receives the supply of the ground potential which is to be commonly supplied to the first and second circuits.

The sixth wiring layer WL6 includes the insulating layer (sixth insulating layer, solder resist film) 2e6 covering the ball lands 2LD, fourth via wirings 2V4, and sixth conductive plane 2PL6. As shown in FIG. 19, the sixth insulating layer 2e6 is formed to cover the entire lower surface 2b of the wiring substrate 2. In regions with the ball lands 2LD formed therein in the lower surface 2b of the wiring substrate 2, land openings 2ek2 are formed in the sixth insulating layer 2e6 as shown in FIG. 16. The ball lands 2LD are exposed from the land openings 2ek2 of the sixth insulating layer 2e6. In this way, the ball lands 2LD are exposed from the sixth insulating layer 2e6, so that the solder balls 4 can be connected to the exposed surfaces of the ball lands 2LD.

In this embodiment, a plurality of land openings 2ek2 are formed in the sixth insulating film 2e6 covering the sixth conductive plane 2PL6. A part of the sixth conductive plane 2PL6 is exposed from each land opening 2ek2. In other words, the exposed parts of the sixth conductive plane 2PL6 serves as a land (terminal) that receives the supply of power supply potential for driving the circuit formed in the semiconductor chip 3 shown in FIG. 4, or the ground potential (GND) as the reference potential. That is, the solder ball 4 shown in FIG. 4 is bonded to the exposed part of the sixth conductive plane 2PL6, which is used as a terminal for supplying the power supply potential or reference potential.

Figure 20:
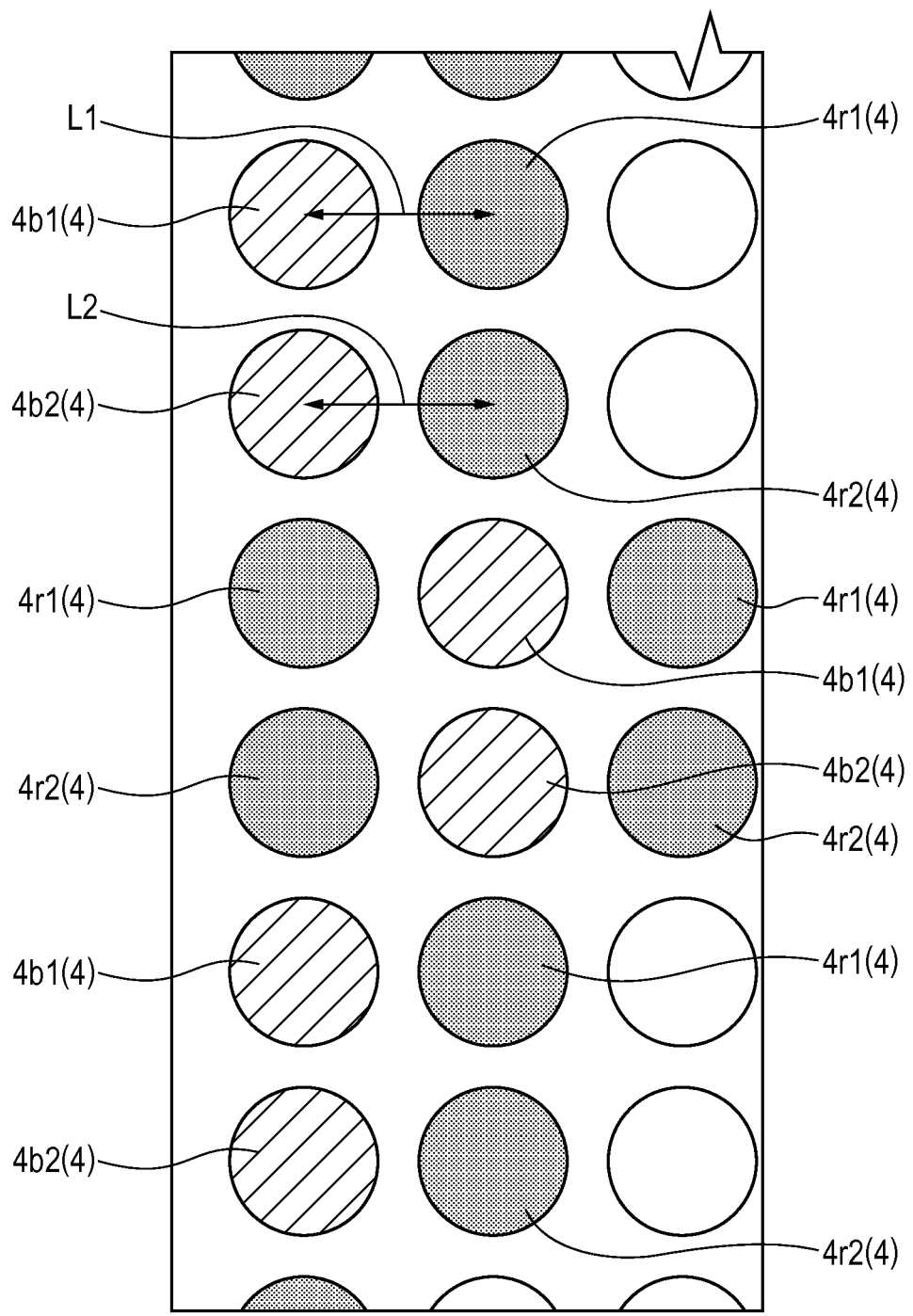
FIG. 20 is an enlarged plan view showing the details of a layout of solder balls shown in FIG. 2.

As shown in FIG. 20, among the solder balls 4, reference potential solder balls 4r1 and 4r2 for reference to which the reference potential is supplied are disposed around the high speed solder balls 4b1 and 4b2 forming the high speed transmission path for transmitting the above-mentioned differential signal. FIG. 20 shows an enlarged plan view of the details of a layout of the solder balls shown in FIG. 2. As shown in FIG. 20, in order to distinguish the high speed solder balls 4b1 and 4b2 forming a differential pair from the reference potential solder balls 4r1 and 4r2 forming the reference path, the high speed solder balls 4b1 and 4b2 are represented by hatching, and the reference potential solder balls 4r1 and 4r2 are represented by a dot pattern.

As shown in FIG. 20, the high speed solder balls 4b1 and 4b2 form one differential pair. The reference potential solder ball 4r1 forms the main dominant reference path corresponding to the high speed solder ball 4b1, while the reference potential solder ball 4r2 forms the main dominant reference path corresponding to the high speed solder ball 4b2.

As mentioned above, this embodiment includes the reference path to which the reference potential for reference of the signal transmission path is supplied. For example, in describing with reference to FIG. 15, the reference through hole wirings 2TWr1, 2Twr2 are respectively disposed closest to the first main through hole wiring 2TWb1 disposed in one transmission path forming the differential pair, and the second main through hole wiring 2TWb2 disposed in the other transmission path. These reference through hole wirings 2TWr correspond to the mainly dominant vias for reference.

As mentioned above, in transmitting a differential signal, the distance between the transmission path on the positive side and the main dominant reference path is preferably set equal to that between the transmission path on the negative side and the corresponding main dominant reference path from the viewpoint of performing impedance matching and reducing a differential delay between the one transmission path (for example, on the positive side) and the other transmission path (for example, on the negative side) forming the differential pair. Specifically, the solder balls 4 are more likely to be affected by the connection distance in the thickness direction of the wiring substrate 2 (in the height direction of the solder ball 4) rather than by the position and configuration of second via wiring 2V2 shown in FIG. 13. The asymmetric structure might tend to cause the jitter or the difference in skew.

In this embodiment, as shown in FIG. 20, the reference potential solder balls 4r are arranged such that the distance between the transmission path on the positive side and the main dominant reference path is preferably set equal to that between the transmission path on the negative side and the corresponding main dominant reference path. A distance (for example, center-to-center spacing) L1 from the high speed solder ball 4b1 disposed in one transmission path forming the differential pair to the mainly dominant reference potential solder ball 4r1 for reference disposed closest to the high speed solder ball 4b1 is equal to a distance (for example, center-to-center spacing) L2 from the high speed solder ball 4b2 disposed in the other transmission path to the mainly dominant reference potential solder ball 4r2 for reference disposed closest to the high speed solder ball 4r2. This arrangement can reduce a differential delay between one transmission path (for example, on a positive side), and the other transmission path (for example, on a negative side) forming the differential pair to thereby prevent or suppress the difference in skew between the positive and negative sides, which can match the impedances.

As shown in FIG. 20, like FIG. 15, the reference potential solder balls 4r forming the reference path are formed in the respective high speed transmission paths. This arrangement can prevent or suppress the difference in skew between the positive and negative sides in the respective transmission paths.

<Impedance Matching of High Speed Transmission Path>

Figure 21:
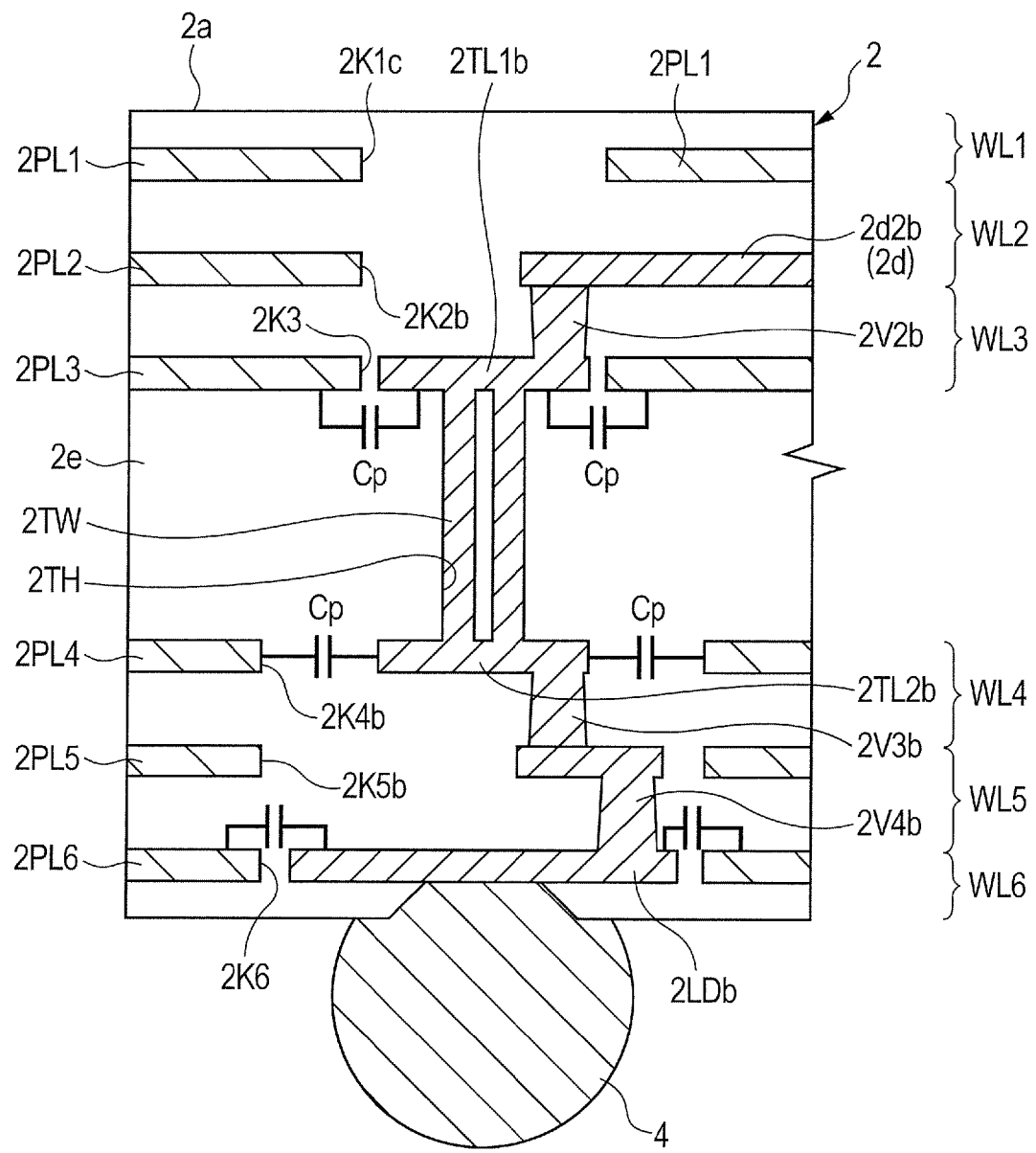
FIG. 21 is an explanatory diagram exemplarily showing an interconnection structure of a high-speed transfer path shown in FIG. 16.
Figure 22:
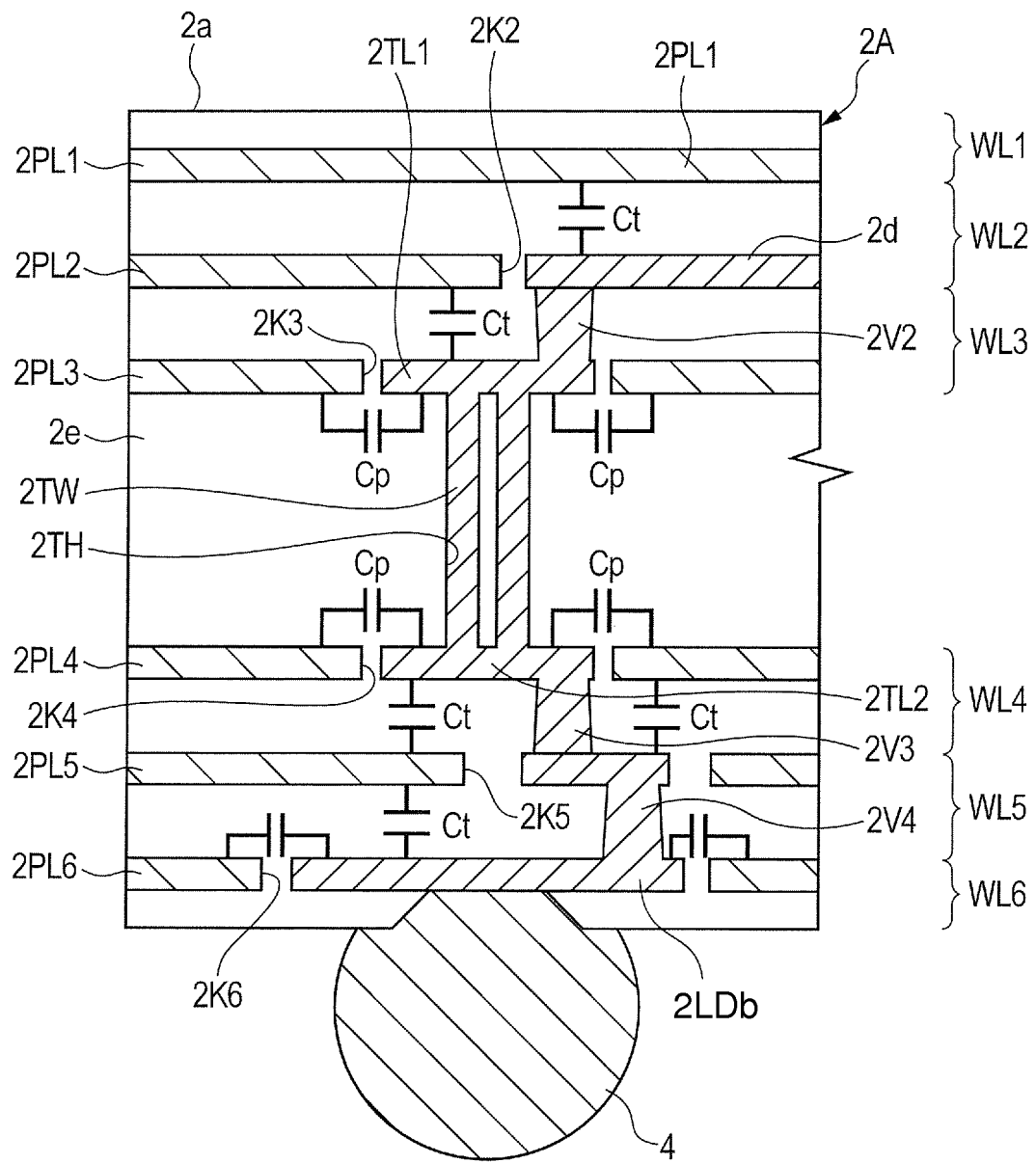
FIG. 22 is an explanatory diagram showing a comparative example corresponding to FIG. 21.
Figure 23:
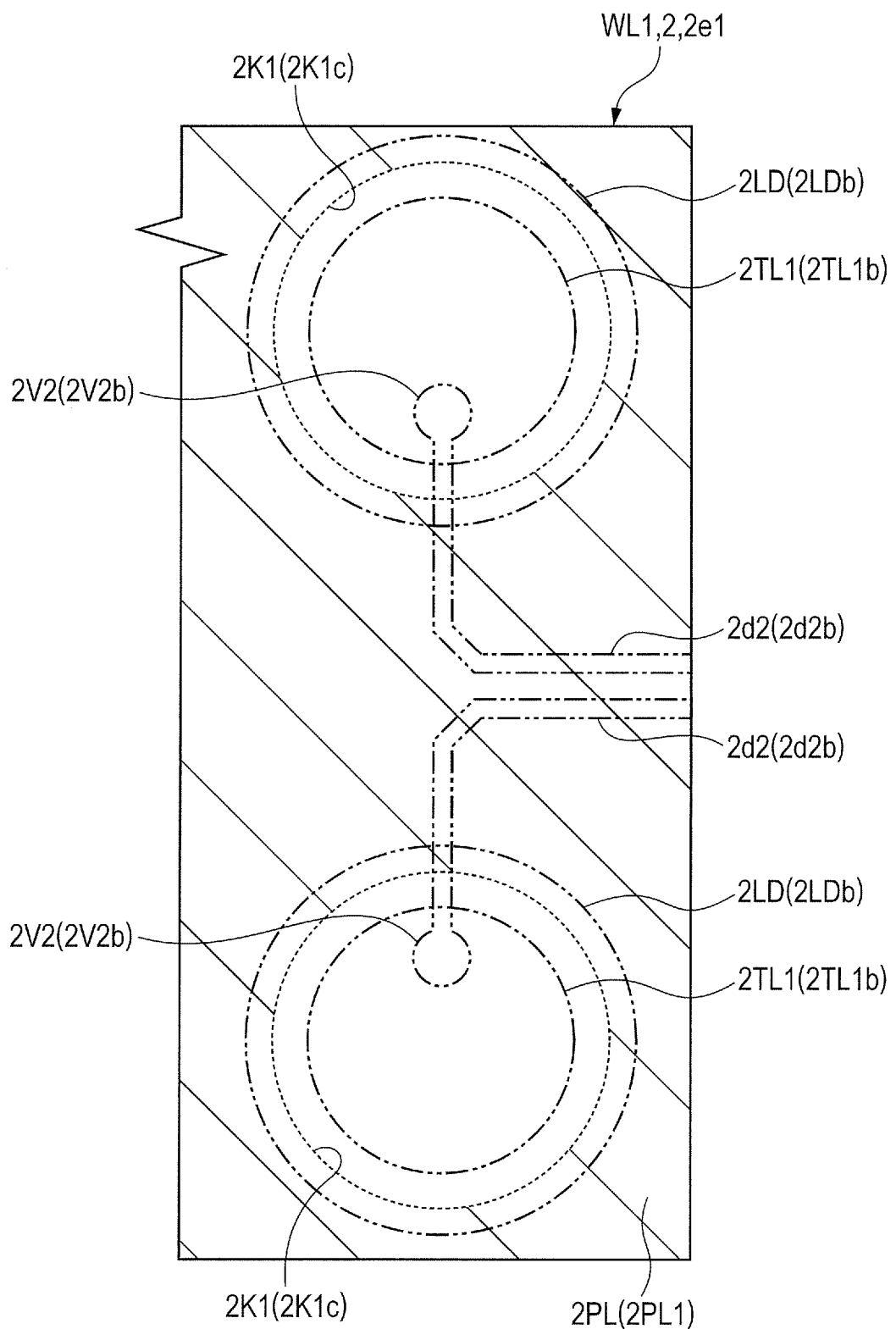
FIG. 23 is an enlarged plan view showing conductive patterning of the first wiring layer in the enlarged plane shown in FIG. 15.
Figure 24:
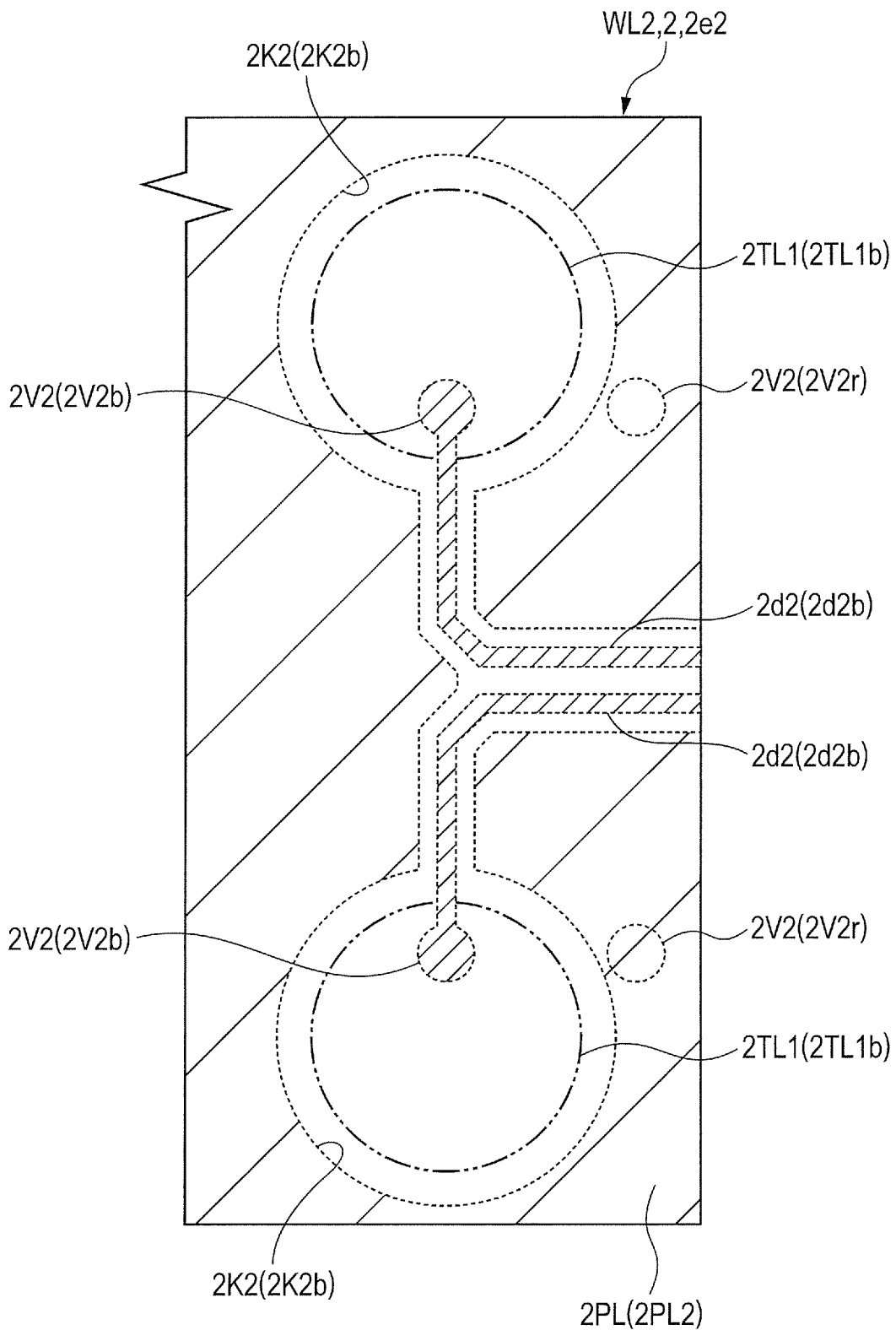
FIG. 24 is an enlarged plan view showing conductive patterning of the second wiring layer in the enlarged plane shown in FIG. 15.
Figure 25:
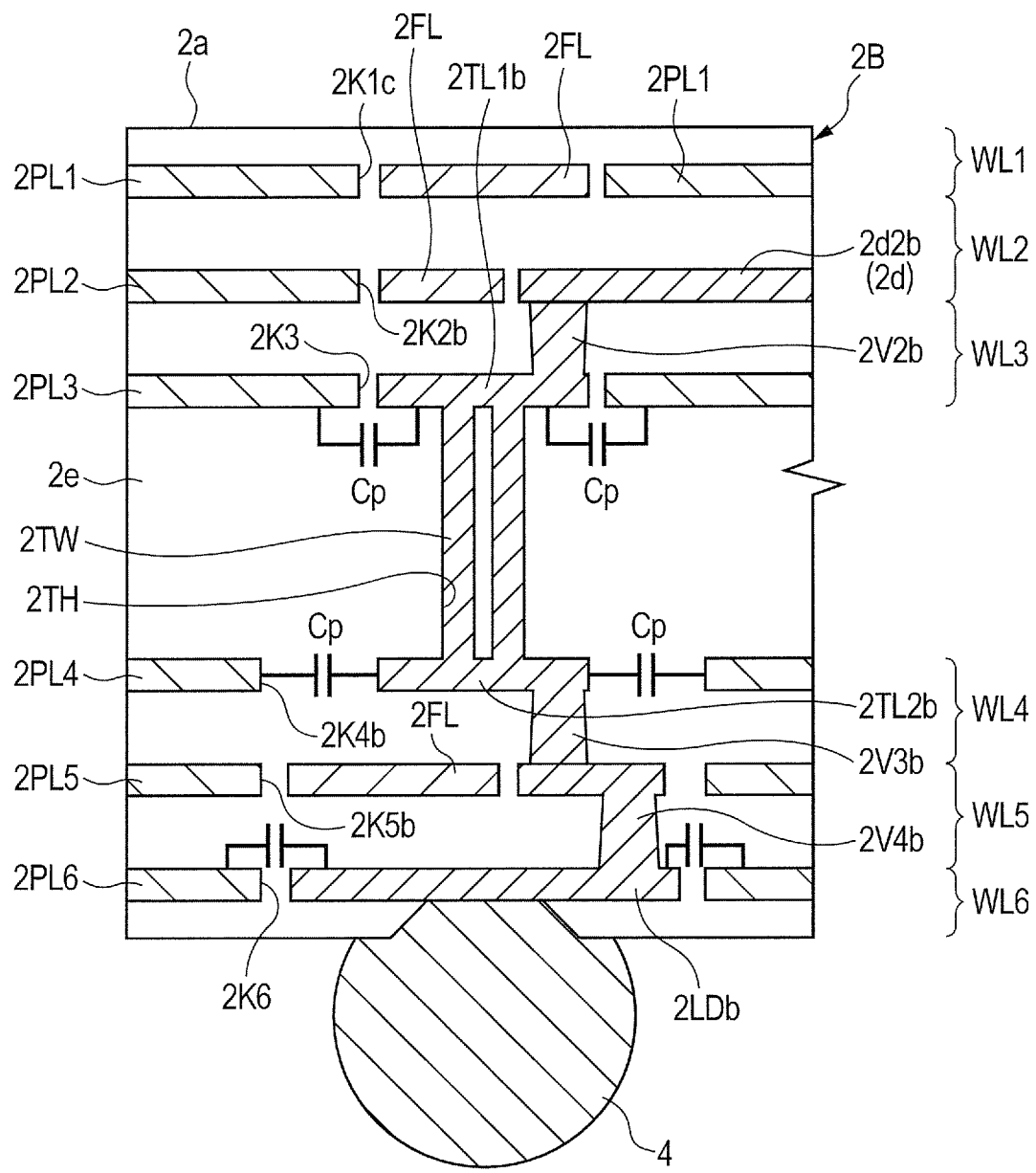
FIG. 25 is an explanatory diagram showing another comparative example corresponding to FIG. 21.

Further, the impedance matching of the high speed transmission path will be described in detail below. FIG. 21 exemplarily shows an explanatory diagram of an interconnection structure of a high speed transfer path shown in FIG. 16. FIG. 22 shows an explanatory diagram of a comparative example to be compared with the interconnection structure of FIG. 21. FIG. 23 shows an enlarged plan view of conductive patterning of the first wiring layer in the enlarged plane shown in FIG. 15. FIG. 24 shows an enlarged plan view of the patterning of a conductor of the second wiring layer in the enlarged plane shown in FIG. 15. FIG. 25 shows an explanatory diagram of another comparative example to be compared with the interconnection structure of FIG. 21.

Referring to FIGS. 23 and 24, in order to clarify the planar positional relationship between the main first opening 2K1c and the high speed second opening 2K2b formed in their respective wiring layers, and the high speed first through hole land 2TL1b, high speed second via wiring 2V2b, and high speed second-layer wiring 2d2b, the contour of the conductive pattern formed in wiring layers other than the wiring layer shown is represented by the two-dot chain line. Specifically, referring to FIG. 23, in order to clarify the magnitude relationship based on a plane area of each of the main first openings 2K1c and the high speed ball lands 2LDb, the contour of the ball land 2LD formed in the sixth wiring layer WL6 is indicated by the two-dot chain line like FIG. 16. FIGS. 23 and 24, which are enlarged plan views, illustrates the conductive patterns, including the wiring, via wiring, through hole land, and conductive plane, by hatching in order to clearly indicate the boundary between the conductive patterns.

As described above using FIGS. 9 and 10, in a high speed transmission path through which the signal is transmitted at a transmission rate of about 10 to 25 Gbps, the conductive plane 2PL to which the reference potential or power supply potential is supplied is disposed around the wiring 2d (upper layer, lower layer, or its surroundings in the planar view), which can reduce the influences of the electric field or magnetic field from the surroundings of the transmission path. The use of the strip line wiring structure shown in FIG. 9 can narrow the width of the wiring, and also can decrease the distance between the wirings 2d, thereby increasing the density of the wiring layout.

As mentioned above, in order to reduce the influence of noise due to the electric field or magnetic field from the surroundings of the high speed transmission path, the distance between each of the conductive planes 2PL1, 2PL2, 2PL3, 2PL4, 2PL5, and 2PL6 disposed around the high speed transmission path, and the corresponding high speed transmission path is proposed to be decreased as much as possible, like the wiring substrate 2A shown in FIG. 22. In this case, the conductive planes 2PL1 and 2PL2 are also arranged in the positions where the planes are superimposed over the first through hole lands 2TL1 in the thickness direction. However, when the conductive planes 2PL1 and 2PL2 are arranged in the positions where the planes are superimposed over the first through hole lands 2TL1 in the thickness direction, a parasitic capacitance is generated between each of the conductive planes 2PL1 and 2PL2 and the corresponding high speed transmission path. For easy understanding, FIG. 22 shows the wiring layers WL2, WL3, WL4, and WL5 thicker than the actual thickness. The thickness of the insulating layer of each of the wiring layers WL2, WL3, WL4, and WL5 is in a range of about 30 to 35 µm, while the conductor-to-conductor distance in the planar direction is about 50 µm. That is, in the wiring layers WL2, WL3, WL4, and WL5, the parasitic capacitance is apt to be generated by the influence in the thickness direction and not in the planar direction.

In order to ensure the reliability of electric coupling, the planar size of the first through hole land 2TL1 is larger than that of the wiring 2d. For example, the width of the wiring 2d is about 25 whereas the diameter of the first through hole land 2TL1 is in a range of about 400 to 500 µm. Thus, a parasitic capacitance Ct generated in the thickness direction of the wiring substrate 2A tends to be larger than a parasitic capacitance Cp generated in the planar direction of the wiring substrate 2.

The parasitic capacitance Ct generated around the first through hole land 2TL1 in the high speed transmission path in this way might cause the degradation of reflection due to the mismatching of the impedance. Thus, like the wiring substrate 2 of this embodiment shown in FIG. 21, preferably, the conductive planes 2PL1 and 2PL2 are not preferably provided in the positions where the planes are not superimposed over the first through hole land 2TL1 in the thickness direction.

That is, as shown in FIGS. 21 and 23, the opening (main first opening) 2K1c is preferably formed in the first conductive plane 2PL1 of the first wiring layer WL1 in the positions where the opening is superimposed over the high speed first through hole land 2TL1b in the thickness direction. As shown in FIGS. 21 and 24, another opening (high speed second opening) 2K2b is preferably formed in the second conductive plane 2PL2 of the second wiring layer WL2 in the positions where the opening is superimposed over the high speed first through hole land 2TL1b in the thickness direction.

In contrast, the high speed second-layer wiring 2d2b (see FIG. 21) forming the high speed transmission path uses the strip line wiring structure described above so as to provide the design with a uniform impedance. In order to achieve the differential impedance matching, the wiring structures of the transmission paths are preferably the same. In the respective wiring layers, the conductive planes 2PL1, 2PL2, 2PL3, 2PL4, 2PL5, and 2PL6 to which the reference potential or power supply potential is supplied preferably intervene in between the high speed transmission paths at the respective wiring layers. Thus, in order to ensure the differential/common impedance matching of the high speed transmission path, while increasing the density of the wiring layout, like the wiring substrate 2 of this embodiment shown in FIG. 21, the distance between the high speed second-layer wiring 2d2b and each of the conductive planes 2PL1, 2PL2, and 2PL3, that is, the distance between the conductive patterns is preferably set small.

As shown in FIG. 23, an area of the main first opening 2K1c is larger than a plane area of the high speed first through hole land 2TL1b. Thus, in the plane area, the high speed first through hole land 2TL1b is positioned within the main first opening 2K1c. As shown in FIG. 24, the area of the high speed second opening 2K2b is larger than the plane area of the high speed first through hole land 2TL1b. In this embodiment, the main first opening 2K1c shown in FIG. 23 has the same shape and area as those of the high speed second opening 2K2b shown in FIG. 24. The main first opening 2K1c and the high speed second opening 2K2b are arranged to have their contours superimposed on each other in the planar view. Thus, in the planar view, the high speed first through hole land 2TL1b is positioned within the high speed second opening 2K2b. As shown in FIGS. 23 and 24, the high speed second via wirings 2V2b are formed within the openings 2K1c and 2K2b. This arrangement can greatly decrease the parasitic capacitance Ct generated in the thickness direction of the wiring substrate 2A as shown in FIG. 22.

The first conductive plane 2PL1 is provided with an opening 2K1 in addition to the main first opening 2K1c shown in FIG. 23. For example, a low speed first opening 2K1a is formed in the first conductive plane 2PL1 disposed around the low speed first via wiring 2V1a shown in FIG. 6. For example, a high speed first opening 2K1b is formed in the first conductive plane 2PL1 disposed around the high speed first via wiring 2V1b shown in FIG. 7. The main first opening 2K1c shown in FIG. 23 has its opening area determined according to a plane area of the high speed first through hole land 2TL1b. Each of the low speed first and high speed first openings 2K1a and 2K1b shown in FIG. 6 or 7 has its opening area determined according to a plane area of each of the first via wirings 2V1a and 2V1b. The area of the main first opening 2K1c is larger than that of each of the low speed first and high speed first openings 2K1a and 2K1b.

In order to increase the density of the wiring layout by getting the conductive planes 2PL1, 2PL2, and 2PL3 close to the wiring 2d, the area of the main first opening 2K1c is preferably small.

In this embodiment, as shown in FIG. 23, the plane area of the high speed ball land 2LDb having the circular shape in the planar view is larger than the plane area of the high speed first through hole land 2TL1b having the circular shape in the planar view. The area of the main first opening 2K1c in the planar view is smaller than the plane area of the high speed ball land 2LDb. For example, in one embodiment, the high speed first through hole land 2TL1b has a diameter of 450 whereas the high speed ball land 2LDb has a diameter of about 650 μm. The main first opening 2K1c has a diameter of, for example, about 500 to 600 μm. In other words, in this embodiment, the area of the main first opening 2K1c is minimized as long as the main first opening 2K1c is not superimposed over the high speed first through hole land 2TL1b in the thickness direction. Thus, a large part of the high speed second-layer wirings 2d2b shown in FIG. 23 is covered with the first conductive plane 2PL1. As a result, the density of the wiring layout can be increased, while ensuring the differential/common impedance matching in the high speed transmission path. That is, the semiconductor device can improve its resistance to noise and reflection characteristics.

As mentioned above, the main first opening 2K1c shown in FIG. 23 and the high speed second opening 2K2b shown in FIG. 24 have the same shape and area, and arranged such that the contours of the main first opening 2K1c and the high speed second opening 2K2b are superimposed over each other in the planar view. That is, in this embodiment, the area of the high speed second opening 2K2b is larger than the plane area of the high speed first through hole land 2TL1b, and smaller than the plane area of the high speed ball land 2LDb shown in FIG. 23.

The second conductive plane 2PL2 is provided with an opening 2K2 in addition to the high speed second opening 2K2b shown in FIG. 24. For example, the second conductive plane 2PL2 disposed around the low speed via wirings 2V1a and 2V2a shown in FIG. 12 is provided with a low speed second opening 2K2a. The high speed second opening 2K2b shown in FIG. 24 has its area determined according to the plane area of the high speed first through hole land 2TL1b. The low speed second opening 2K2a shown in FIG. 12 has its area determined according to the plane area of each of the low speed via wirings 2V1a and 2V2a. Thus, the area of the high speed second opening 2K2b is larger than that of the low speed second opening 2K2a.

As mentioned above, the area of the high speed second opening 2K2b of the second conductive plane 2PL2 formed in the second wiring layer WL2 shown in FIG. 24 is minimized as long as the high speed second opening 2K2b is not superimposed over the high speed first through hole land 2TL1b in the thickness direction. For example, as shown in FIG. 13, when the high speed transmission path of the second wiring layer WL2 has a high density, an increase in area of the high speed second opening 2K2b causes the high speed second-layer wiring 2d2b of the adjacent transmission path to be superimposed over the high speed second opening 2K2b, which makes it difficult to surely dispose the second conductive plane 2PL2 in between the adjacent transmission paths. In other words, the above states makes it difficult to increase the density of the high speed transmission path.

In this embodiment, the area of the high speed second opening 2K2b is minimized as long as the opening is not superimposed over the high speed first through hole land 2TL1b in the thickness direction. Then, when increasing the density of the high speed transmission path in the second wiring layer WL2, the second conductive plane 2PL2 can be surely disposed in between the adjacent transmission paths. FIG. 13 shows the example in which the differential signal is allowed to flow through the high speed transmission path, so that two signal wirings forming one pair serves as one high speed transmission path (differential pair). Thus, the second conductive plane 2PL2 is not disposed between the signal wirings forming the differential pair. The above expression "the second conductive plane 2PL2 is disposed in between the adjacent transmission paths" can be replaced by an expression "the second conductive plane 2PL2 is disposed between the adjacent differential pairs".

In this way, the second conductive plane 2PL2 to which the power supply potential or reference potential (for example, ground potential) is supplied is disposed in between the adjacent transmission paths (differential pair), which can reduce the interaction between the adjacent differential pair. As a result, the high speed transmission path can improve its resistance to noise.

In this embodiment, as shown in FIG. 16, the first insulating layer 2e1 is embedded in the entire inside of the main first opening 2K1c of the first conductive plane 2PL1. In other words, as shown in FIG. 23, no conductive pattern is disposed within the main first opening 2K1c of the first conductive plane 2PL1. As shown in FIG. 16, the insulating layers 2e2 and 2e3 are entirely embedded in the surroundings of the high speed second via wiring 2V2b and the high speed second-layer wiring 2d2b within the main first opening 2K1c of the first conductive plane 2PL1. As shown in FIG. 24, no conductive pattern other than the high speed second via wiring 2V2b and the high speed second-layer wiring 2d2b is disposed within the high speed second opening 2K2b of the second conductive plane 2PL2.

The inventors of the present application have studied embodiments in which a floating conductive pattern 2FL electrically separated from the conductive planes 2PL1 and 2PL2 and the high speed transmission path is disposed within the openings 2K1c and 2K2b, like a wiring substrate 2B shown in FIG. 25. When the conductive patterns 2FL are provided inside the openings 2K1c or 2K2b, like the wiring substrate 2B shown in FIG. 25, the conductor density of the respective wiring layers can be made more uniform to improve the workability of the wiring substrate. The conductive pattern 2FL is disposed spaced apart from the conductive planes 2PL1 and 2PL2 or the high speed transmission path (for example, high speed second-layer wiring 2d2b or high speed second via wiring 2V2b), which can decrease the parasitic capacitance Ct generated in the thickness direction of the wiring substrate 2A as shown in FIG. 22.

As can be seen from the result of the studies performed by the inventors of the present application, the provision of the conductive pattern 2FL inside the opening 2K1c or 2K2b reduces the resistance to noise at high frequency due to the influence of electromagnetic waves in an environment where the semiconductor device 1 (see FIGS. 1 to 4) is set. This is because the conductive pattern 2FL disposed in the openings 2K1c and 2K2b can serve as an antenna in a high frequency band.

In the shown in FIG. 16, the first insulating layer 2e1 is embedded inside the entire main first opening 2K1c of the first conductive plane 2PL1. The second insulating layer 2e2 is entirely embedded in a region in the vicinity of the high speed second via wiring 2V2b and the high speed second-layer wiring 2d2b within the main first opening 2K1c of the first conductive plane 2PL1. In other words, over the high speed first through hole land 2TL1b, there is no conductor other than the conductor (high speed second-layer wiring 2d2b and high speed second via wiring 2V2b) electrically coupled to the high speed first through hole land 2TL1b. This reduces the influence of the electromagnetic wave on the setting environment of the semiconductor device 1 (see FIGS. 1 to 4), which can improve the resistance to noise of the semiconductor device 1.

<Parasitic Capacitance on Mounting Surface Side>

The parasitic capacitance generated around the high speed first through hole land 2TL1b will be described below. In order to easily perform the impedance matching in the high speed transmission path, the parasitic capacitance formed on the lower mounting surface side (on the lower surface 2Cb side shown in FIG. 16) of the core insulating layer 2CR can also be preferably decreased. The following will refer to a detailed structure in which the parasitic capacitance formed on the lower mounting surface side (on the lower surface 2Cb side shown in FIG. 16) of the core insulating layer 2CR is also decreased.

Figure 26:
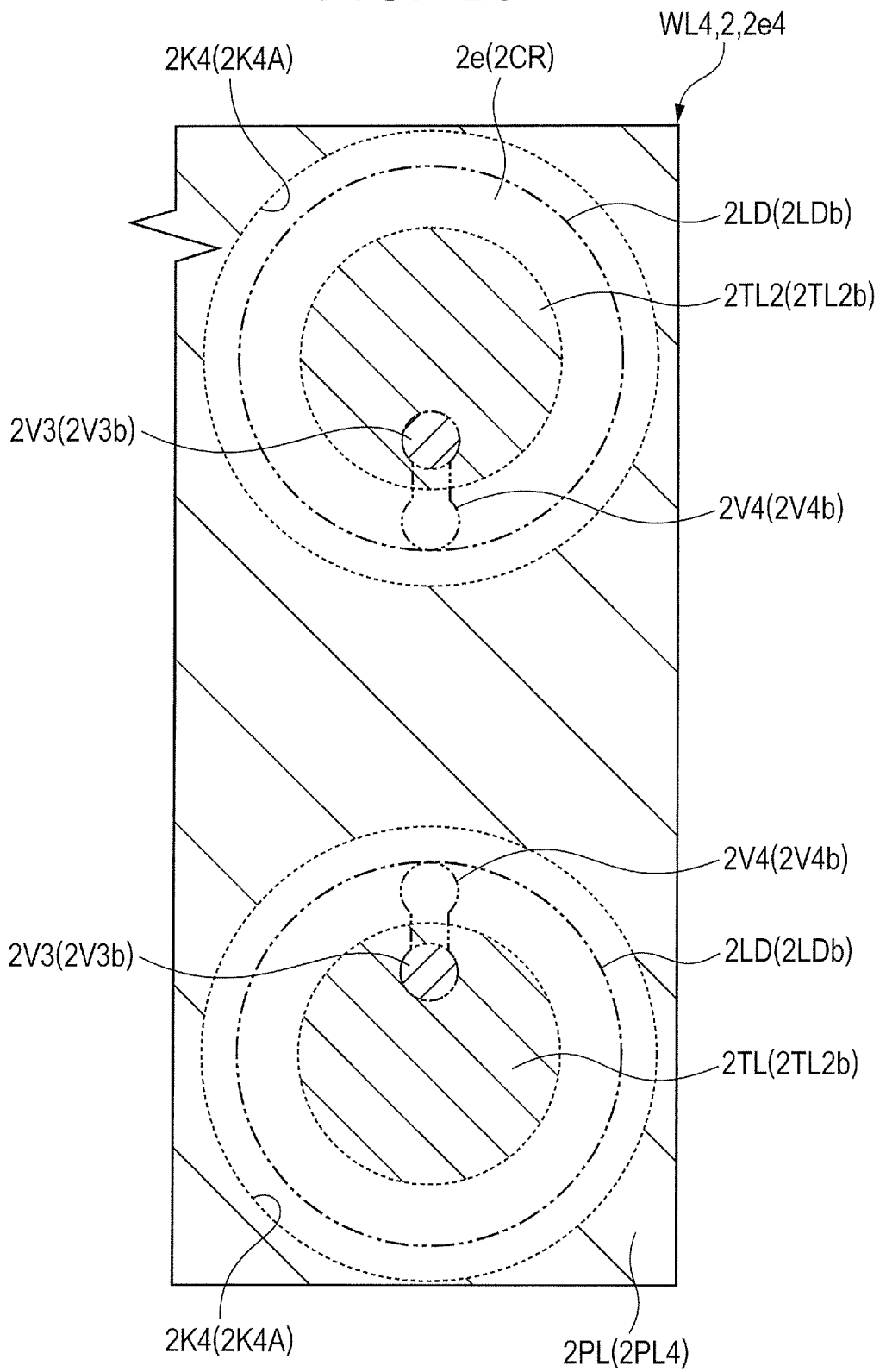
FIG. 26 is an enlarged plan view showing conductive patterning of the fourth wiring layer in the enlarged plane shown in FIG. 15.
Figure 27:
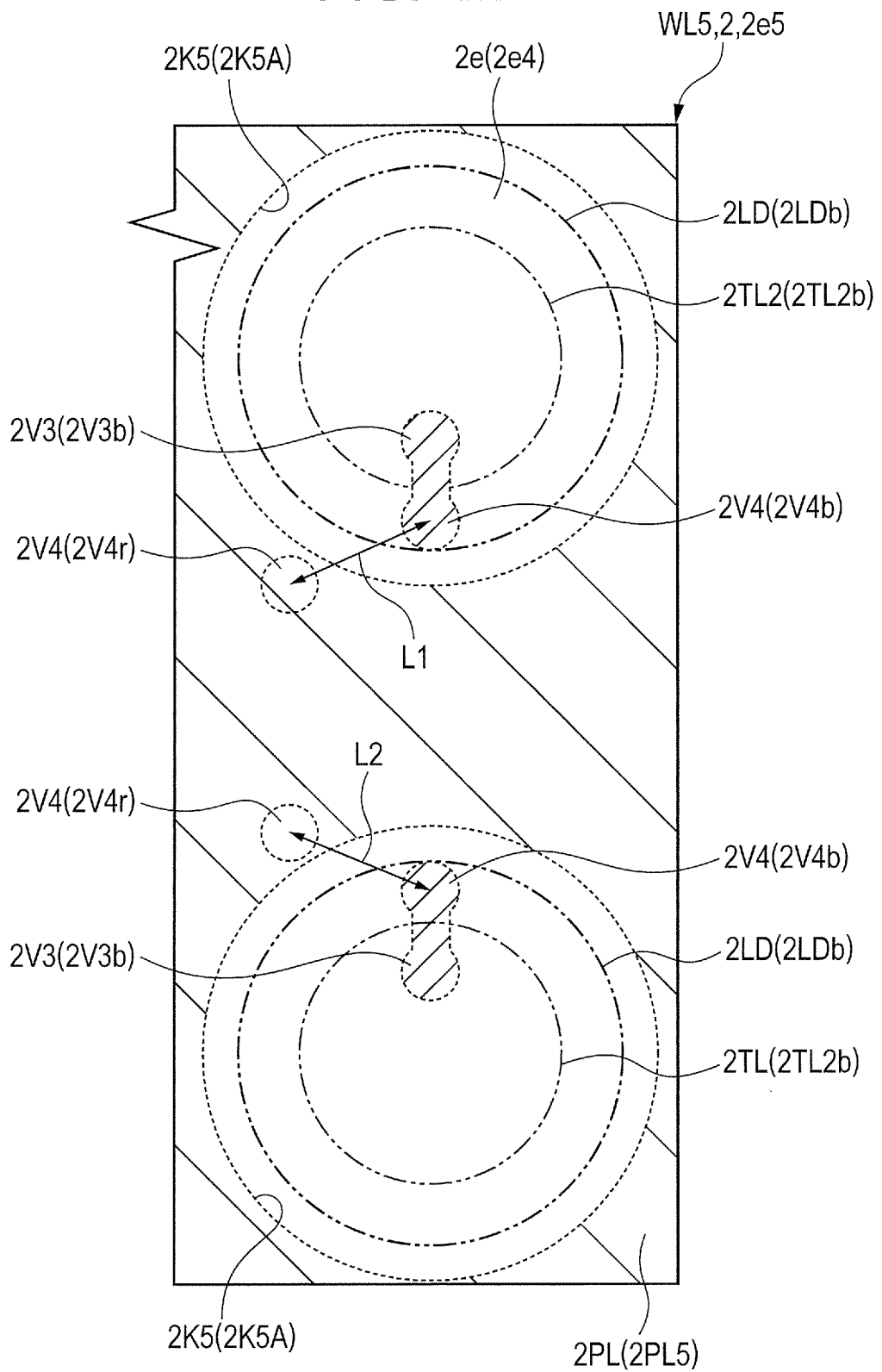
FIG. 27 is an enlarged plan view showing conductive patterning of the fifth wiring layer in the enlarged plane shown in FIG. 15.
Figure 28:
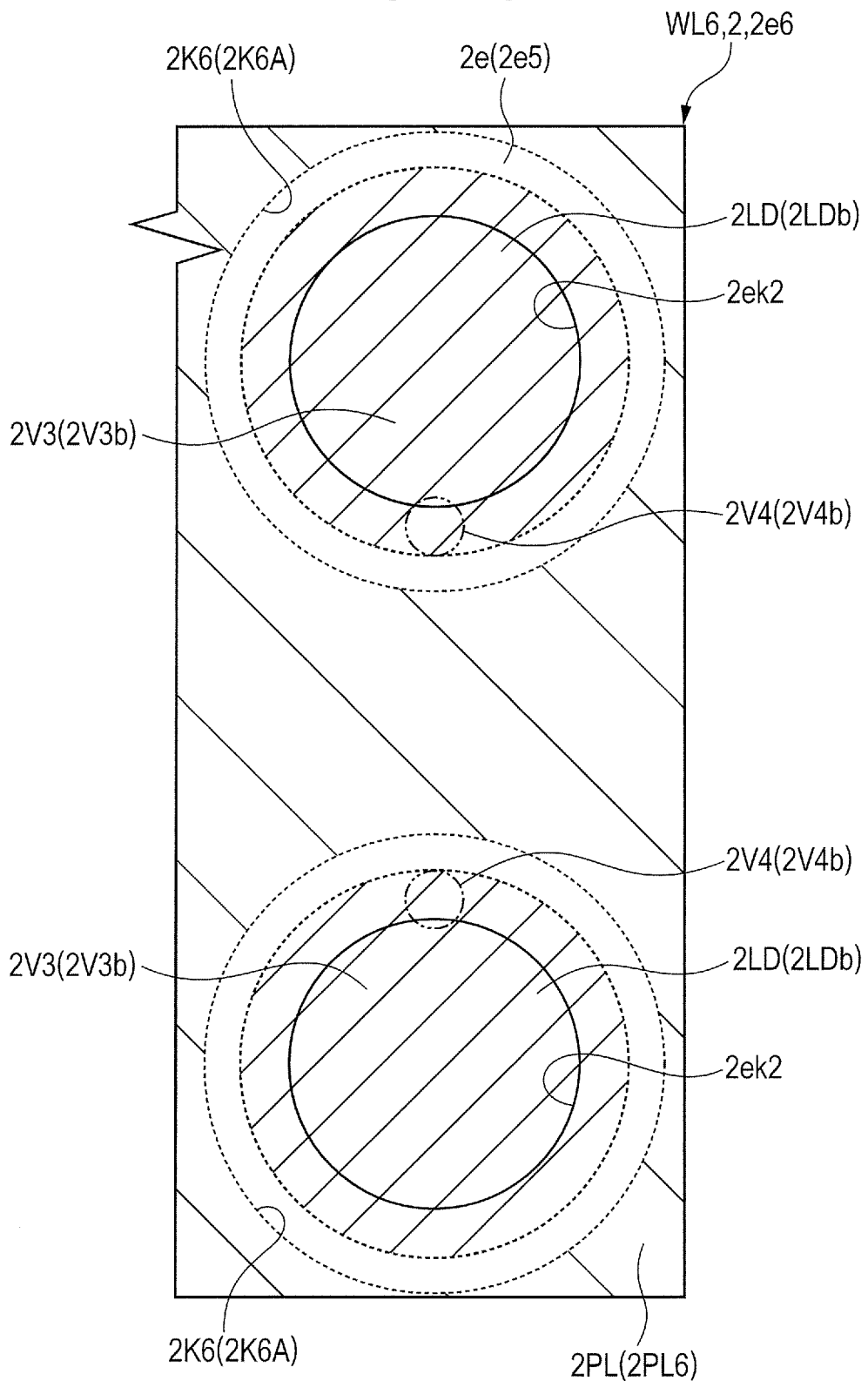
FIG. 28 is an enlarged plan view showing conductive patterning of the sixth wiring layer in the enlarged plane shown in FIG. 15.

FIG. 26 shows an enlarged plan view of the conductive patterning of the fourth wiring layer in the enlarged plane shown in FIG. 15. FIG. 27 shows an enlarged plan view of the conductive patterning of the fifth wiring layer in the enlarged plane shown in FIG. 15. FIG. 28 shows an enlarged plan view of the conductive patterning of the sixth wiring layer in the enlarged plane shown in FIG. 15.

Referring to FIGS. 26 and 27, in order to clarify the planar positional relationship between the fourth-layer opening 2K4A and the fifth-layer opening 2K5A formed in their respective wiring layers, and the high speed second through hole land 2TL2b, high speed via wirings 2V3b and 2V4b, and high speed ball land 2LDb, the contour of the conductive pattern formed in wiring layers other than the wiring layer shown is represented by the two-dot chain line. Like the reference path via 2V2r for reference described using FIG. 13, FIG. 27 also shows reference path vias 2V4r for reference included in the reference path of the high speed transmission path for transmitting the differential signal, by a dotted line. FIGS. 26 to 28 are enlarged plan views, but hatching is added to the conductive patterns, including the wirings, the via wirings, the through hole lands, the lands, and the conductive planes in order to clarify the boundary between the conductive patterns.

As shown in FIG. 16, the through hole wiring 2TW integrally formed with the high speed first through hole land 2TL1b extends along a thickness direction of the wiring substrate 2. A high speed second through hole land 2TL2b formed on the lower surface 2Cb side of the core insulating layer 2CR is formed to be opposed to the high speed first through hole land 2TL1b via the core insulating layer 2CR. As shown in FIG. 26, the fourth conductive plane 2PL4 formed in the fourth wiring layer WL4 is provided with an opening (fourth-layer opening) 2K4A disposed not to bring the high speed second through hole land 2TL2b into contact with the fourth conductive plane 2PL4.

As shown in FIG. 27, the fifth conductive plane 2PL5 formed in the fifth wiring layer WL5 is provided with an opening (fifth-layer opening) 2K5A disposed not to bring the fifth conductive plane 2PL5 into contact with the high speed via wirings 2V3b and 2V4b.

As shown in FIG. 28, the sixth conductive plane 2PL6 formed in the sixth wiring layer WL6 is provided with a sixth layer opening 2K6A disposed not to bring the sixth conductive plane 2PL6 into contact with the via wiring 2V4b and the high speed ball land 2LDb.

In this embodiment, for example, the shape and area of the fifth-layer opening 2K5A shown in FIG. 27, and the shape and area of the fourth-layer opening 2K4A shown in FIG. 26 are the same shape (for example, circular shape) and area of the sixth layer opening 2K6A shown in FIG. 28. In the planar view, the contour of the fourth-layer opening 2K4A, the contour of the fifth-layer opening 2K5A, and the contour of the sixth layer opening 2K6A are respectively formed to be superimposed over each other.

In this embodiment, as shown in FIG. 16, the high speed second through hole land 2TL2b is superimposed over the high speed ball land 2LDb in the thickness direction. As shown in FIG. 26, the plane area of the high speed ball land 2LDb is larger than that of the high speed second through hole land 2TL2b. The plane shape and area of the high speed second through hole land 2TL2b shown in FIG. 26 are the same as those of the high speed first through-hole land 2TL1b shown in FIG. 15. In the planar view, for example, the high speed first through hole land 2TL1b and the high speed second through hole land 2TL2b are arranged so as to have their contours superimposed with each other. Thus, in order to decrease the parasitic capacitance Ct formed in the thickness direction of FIG. 22, the high speed ball land 2LDb whose plane area is larger than that of the high speed second through hole land 2TL2b is preferably arranged not to be superimposed over the fourth and fifth conductive planes 2PL4 and 2PL5 in the thickness direction. That is, when the high speed second through hole land 2TL2b is superimposed over the high speed ball land 2LDb in the thickness direction, the area of each of the openings 2K4A and 2K5A in the conductive planes 2PL4 and 2PL5 is preferably determined according to the plane area of the relatively large high speed ball land 2LDb.

As shown in FIG. 26, the area of the fourth-layer opening 2K4A is larger than the plane area of the high speed ball land 2LDb, and is positioned to be superimposed over the high speed ball land 2LDb in the thickness direction. In other words, in the planar view, the high speed ball land 2LDb is disposed within the fourth-layer opening 2K4A. Each of the high speed via wirings 2V3b and 2V4b is formed within the fourth-layer openings 2K4A. As shown in FIG. 16, the high speed ball land 2LDb is not superimposed over the fourth conductive plane 2PL4 in the thickness direction, which can decrease the parasitic capacitance Ct formed in the thickness direction shown in FIG. 22.

As shown in FIG. 27, the area of the fifth-layer opening 2K5A is larger than the plane area of the land high speed ball 2LDb, and positioned to be superimposed over the high speed ball land 2LDb in the thickness direction. In other words, in the planar view, the high speed ball land 2LDb is disposed within the fifth-layer opening 2K5A. Each of the high speed via wirings 2V3b and 2V4b is formed within the fifth-layer opening 2K5A. As shown in FIG. 16, the high speed ball land 2LDb is not superimposed over the fifth conductive plane 2PL5 in the thickness direction, which can decrease the parasitic capacitance Ct formed in the thickness direction shown in FIG. 22.

<Effect of Improvement of Noise Resistance>

The inventors have studied the effect of improvement of the resistance to noise by use of the structure of the wiring substrate 2 shown in FIG. 21. Now, the results of studies performed by the inventors will be described below. FIG. 29 shows an explanatory diagram of the result of evaluation of the electric characteristics on the wiring substrate shown in FIG. 21 and the wiring substrate shown in the comparative example of FIG. 22. In the evaluation as shown in FIG. 29, the structure of the wiring substrate 2 shown in FIG. 21, and the structure of the wiring substrate 2A shown in FIG. 22 are evaluated with respect to differential impedance Zdiff [Ω], differential reflection characteristics Sdd11 [dB], and differential transmission characteristics Sdd21 [dB].

Based on the result of evaluation shown in FIG. 29, an ideal value of a differential impedance is 100Ω. Thus, the differential impedance is preferably close to 100Ω. As to the differential reflection characteristic Sdd11, the maximum loss of the transmission in each substrate was evaluated by changing the frequency until about 10 GHz corresponding to the transmission rate of 20 Gbps, and the result of each substrate was described in Table of FIG. 29. The result shows that as the differential reflection characteristic Sdd11 approaches 0 dB, the reflection becomes larger. As to the differential transmission characteristic Sdd21, a loss of the transmission in each substrate was evaluated at a frequency of 10 GHz, and the result of evaluation was described in Table of FIG. 29. The result shows that as the differential reflection characteristic Sdd21 is further away from 0 dB, the transmission loss becomes larger.

As can be seen from FIG. 29, the wiring substrate 2 shown in FIG. 21 can improve its differential impedance by about 30Ω, its differential reflection characteristic Sdd11 by a maximum −5 dB, and its differential transmission characteristic by about −3 dB, as compared to the wiring substrate 2A shown in FIG. 22. That is, the use of the wiring structure shown in FIG. 21 can improve the transmission characteristics of the semiconductor device to thereby suppress the reflection of the signal.

<Embodiments of High Speed Transmission Paths Routed Through Wiring Layers>

In the above description of one embodiment with reference to FIG. 16, the through hole lands 2TL1 and 2TL2 are arranged over the ball land 2LD. In a modified example of this embodiment, all high speed transmission paths can be routed up to the ball land 2LD in the second wiring layer WL2 shown in, for example, FIG. 11 (see FIG. 19). In this case, the fifth wiring layer WL5 shown in FIG. 18 can be omitted.

In this embodiment, some of the high speed transmission paths are routed to above the ball lands 2LD (see FIG. 19) in the fifth wiring layer WL5 shown in FIG. 18. Thus, some high speed second through hole lands 2TL2b forming the transmission paths routed in the fifth wiring layer WL5 among the high speed second through hole lands 2TL2b shown in FIG. 17 are not disposed above the ball lands 2LD shown in FIG. 19.

Since in the cross section shown in FIG. 16, the high speed second through hole lands 2TL2b are positioned above the high speed ball lands 2LDb, the area of each of the openings 2K4A and 2K5A needs to be larger than the plane area of the high speed ball land 2LDb. When the high speed second through hole land 2TL2b is not disposed over the high speed ball land 2LDb, the area of each of the openings 2K4A and 2K5A may be smaller than the plane area of the high speed ball land 2LDb (see FIG. 28) as long as the opening area is larger than the plane area of the high speed second through hole land 2TL2b.

Figure 30:
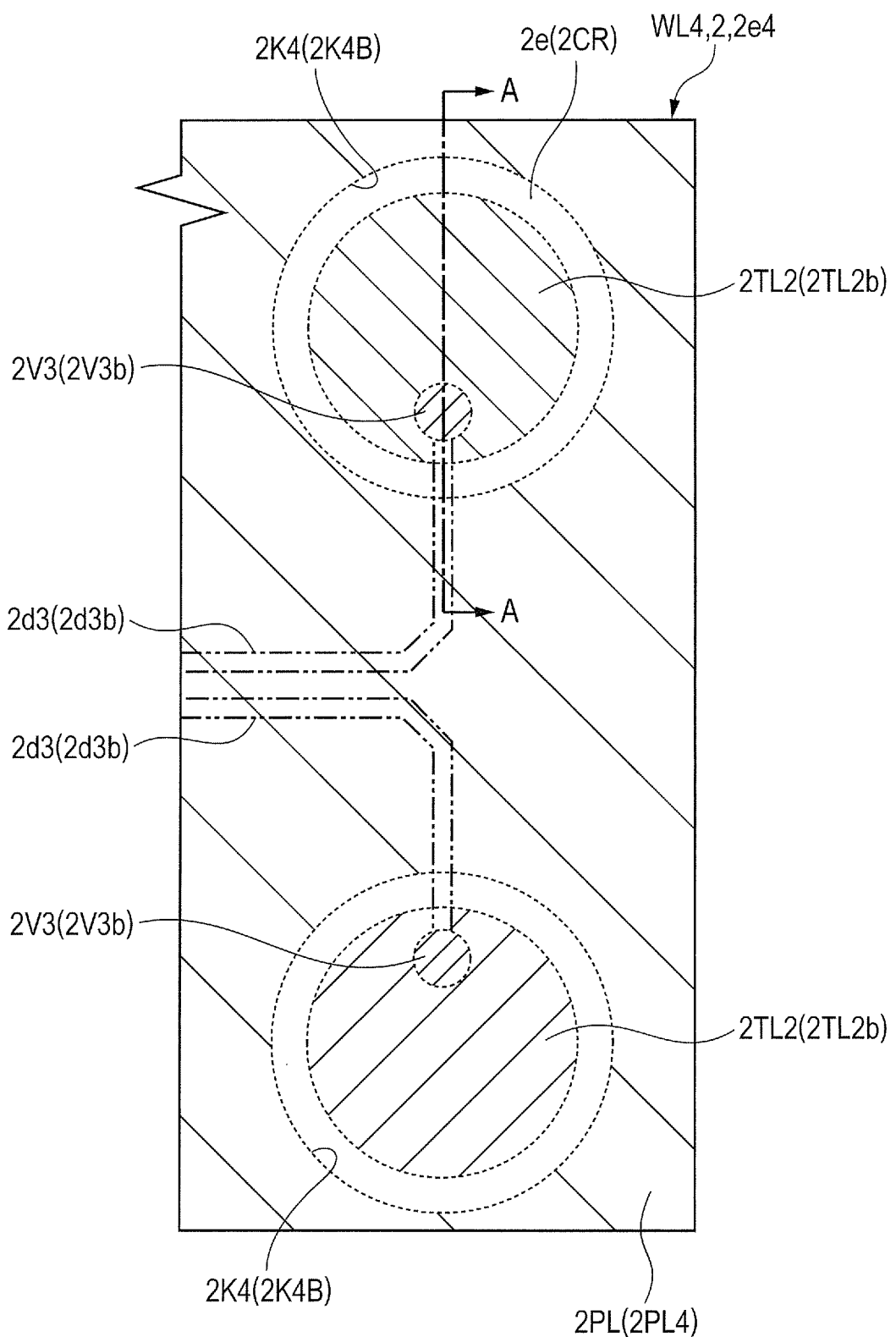
FIG. 30 is an enlarged plan view showing conductive patterning of the fourth wiring layer in a different region from that in shown in FIG. 26.
Figure 31:
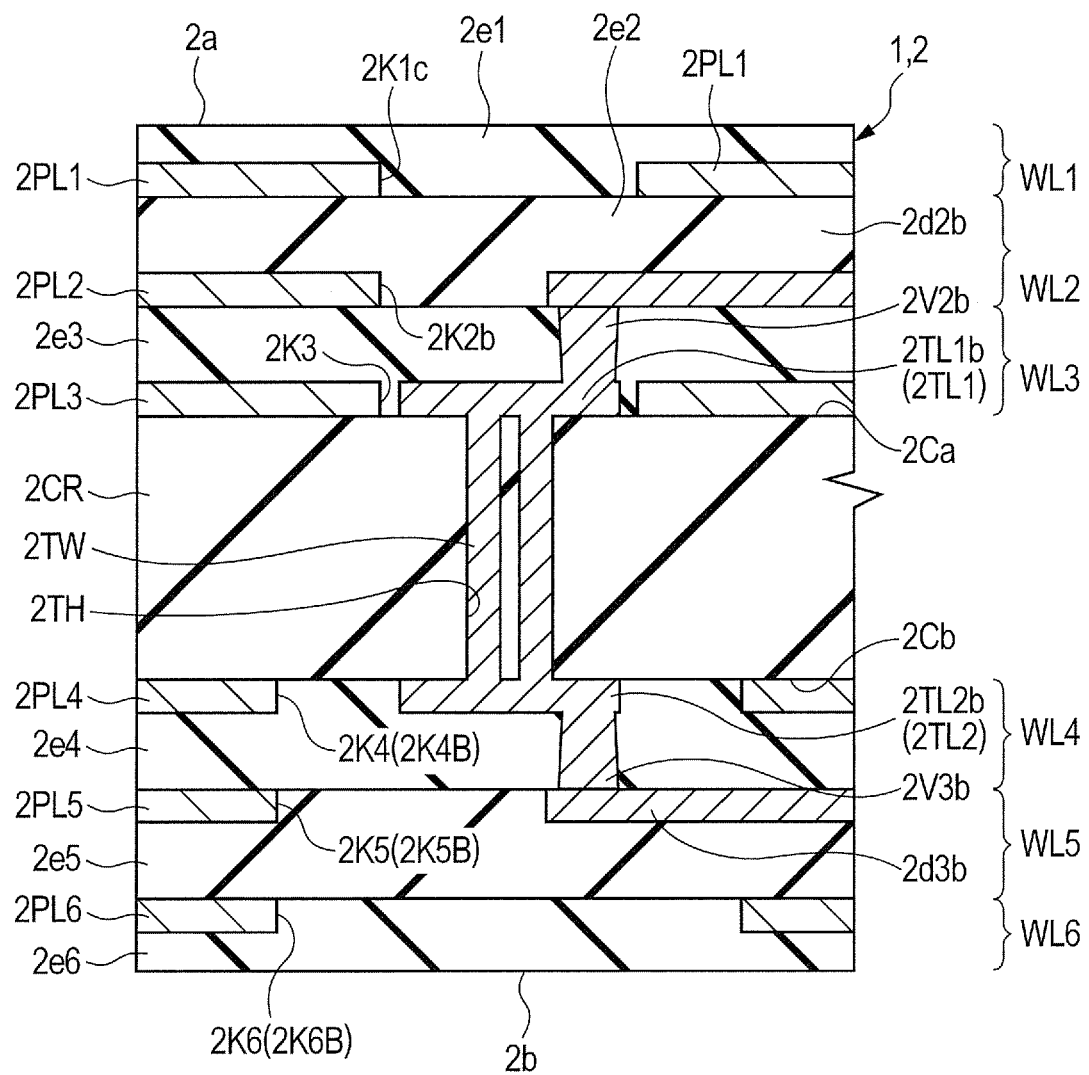
FIG. 31 is an enlarged cross-sectional view taken along the ling A-A of FIG. 30.
Figure 32:
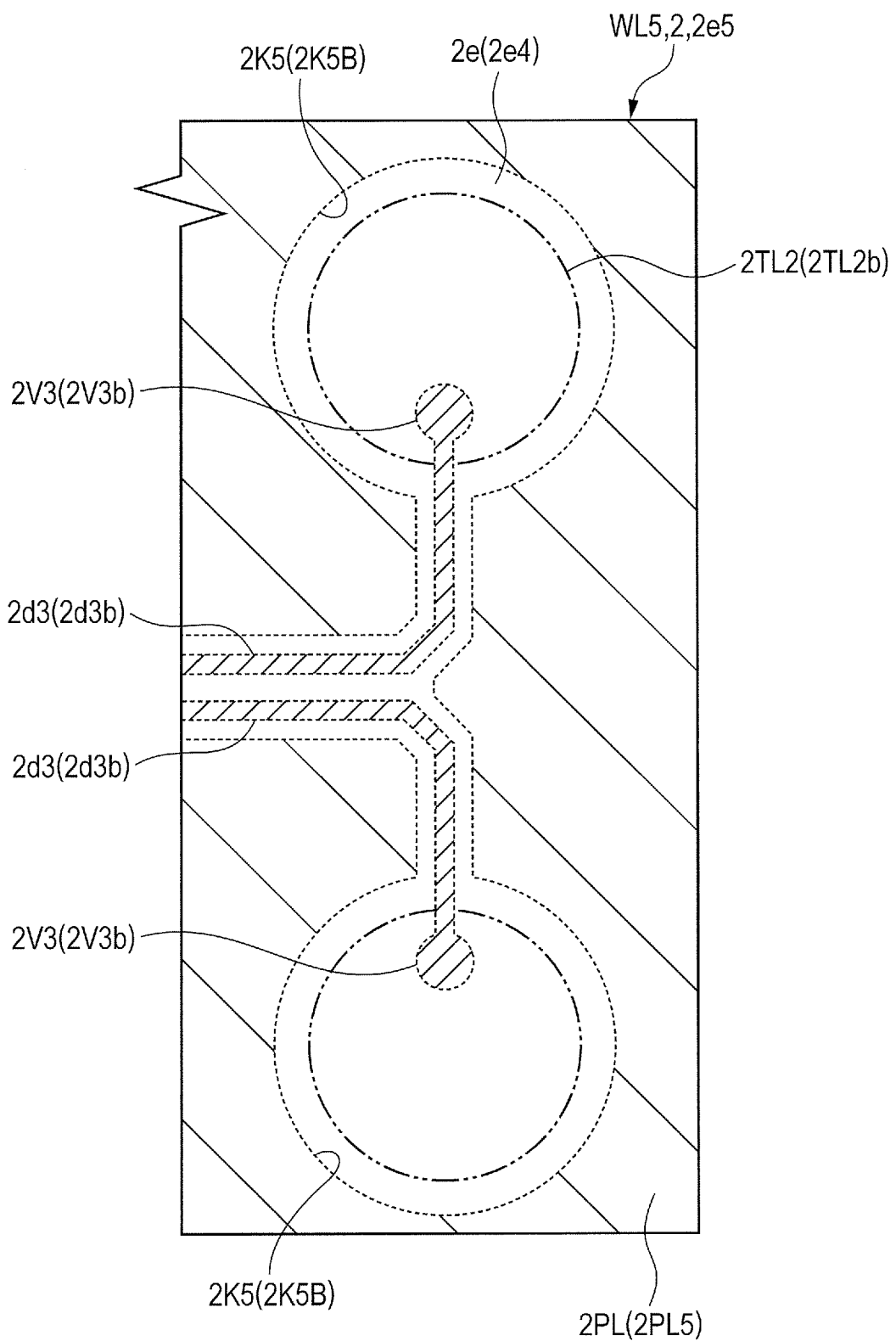
FIG. 32 is an enlarged plan view showing conductive patterning of the fifth wiring layer in the enlarged plane shown in FIG. 30.
Figure 33:
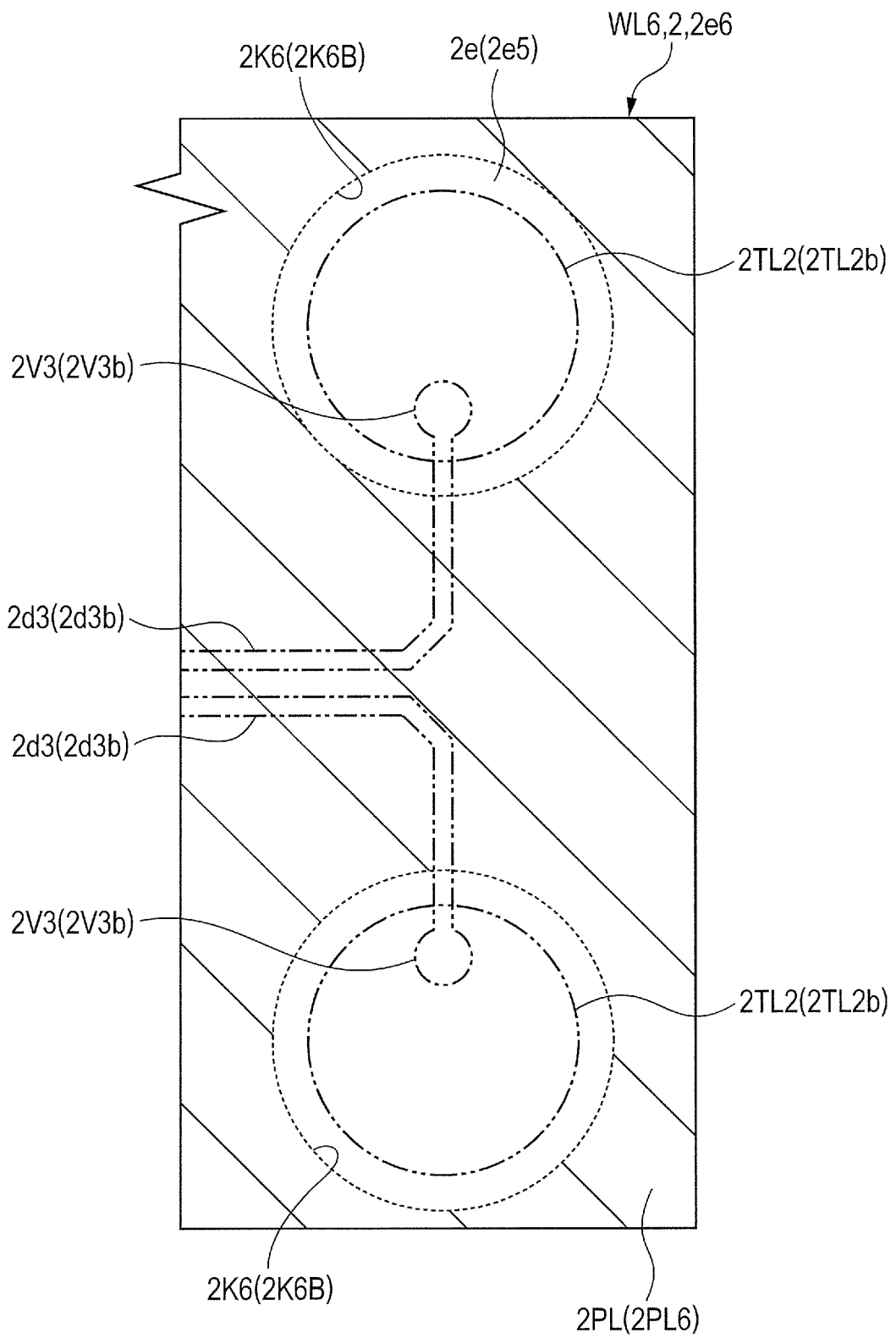
FIG. 33 is an enlarged plan view showing conductive patterning of the sixth wiring layer in the enlarged plane shown in FIG. 30.
Figure 34:
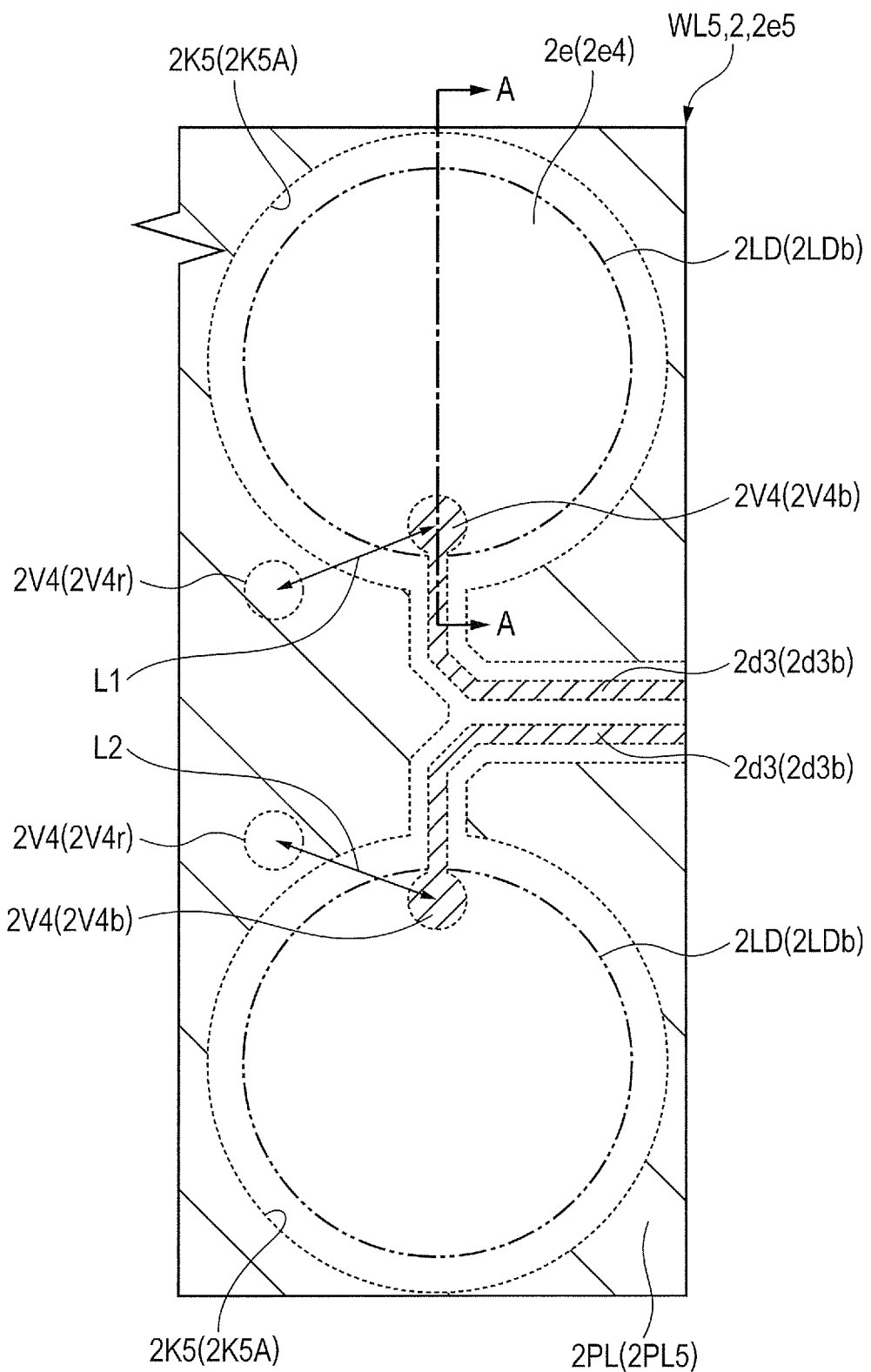
FIG. 34 is an enlarged plan view showing the surroundings of a via wiring coupled to the wiring shown in FIG. 32.
Figure 35:
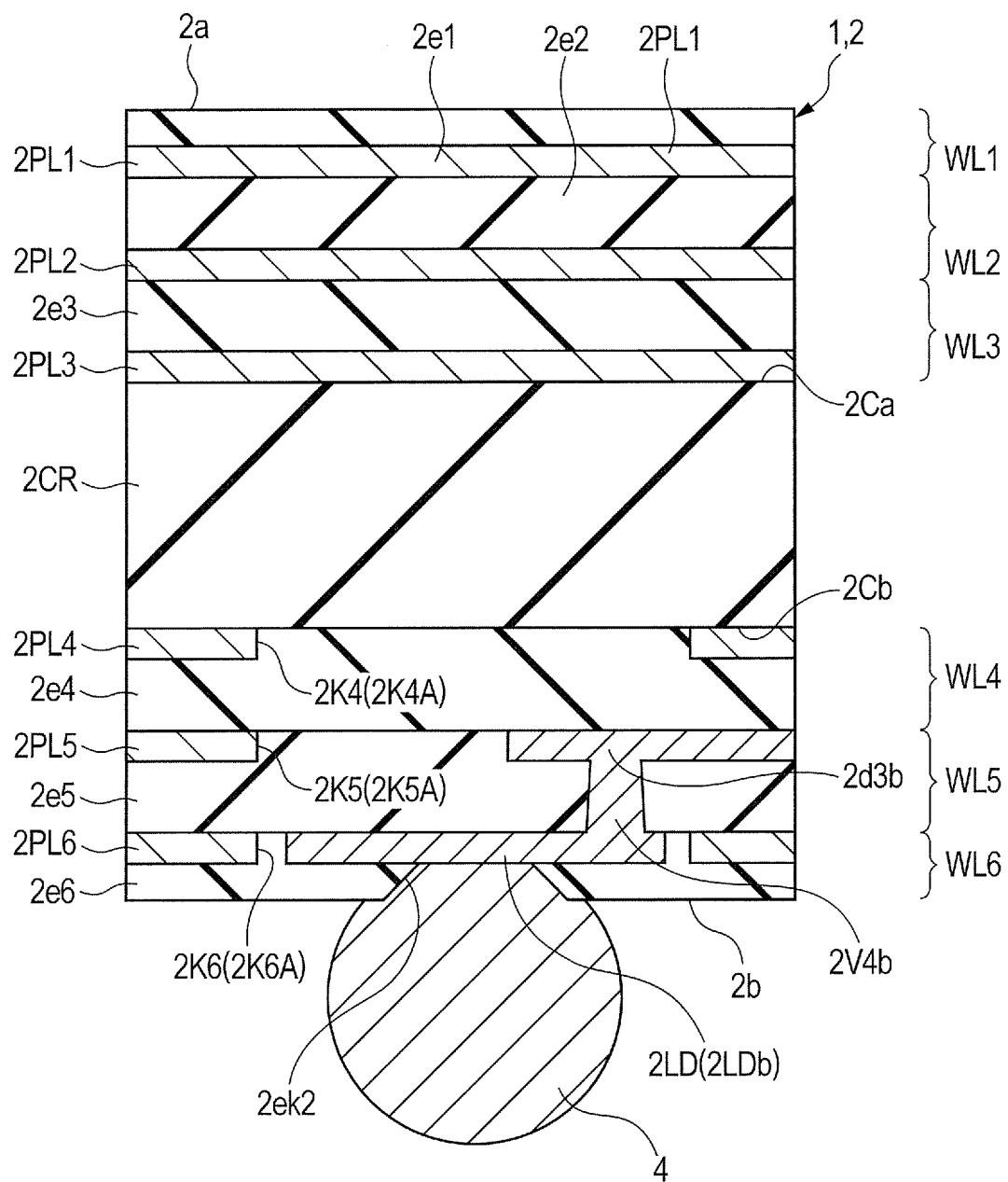
FIG. 35 is an enlarged cross-sectional view taken along the ling A-A of FIG. 34.
Figure 36:
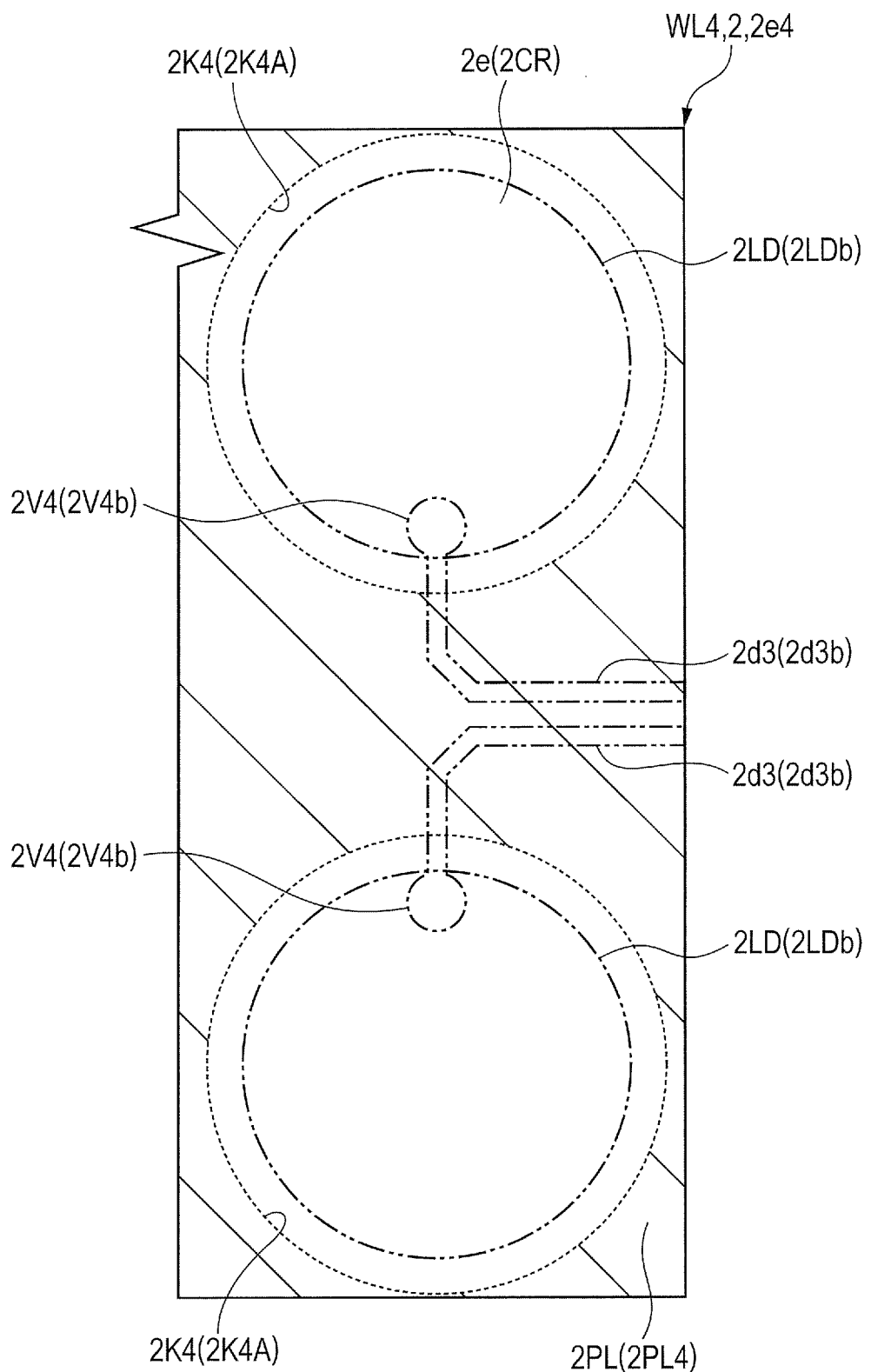
FIG. 36 is an enlarged plan view showing conductive patterning of the fourth wiring layer in the enlarged plane shown in FIG. 34.
Figure 37:
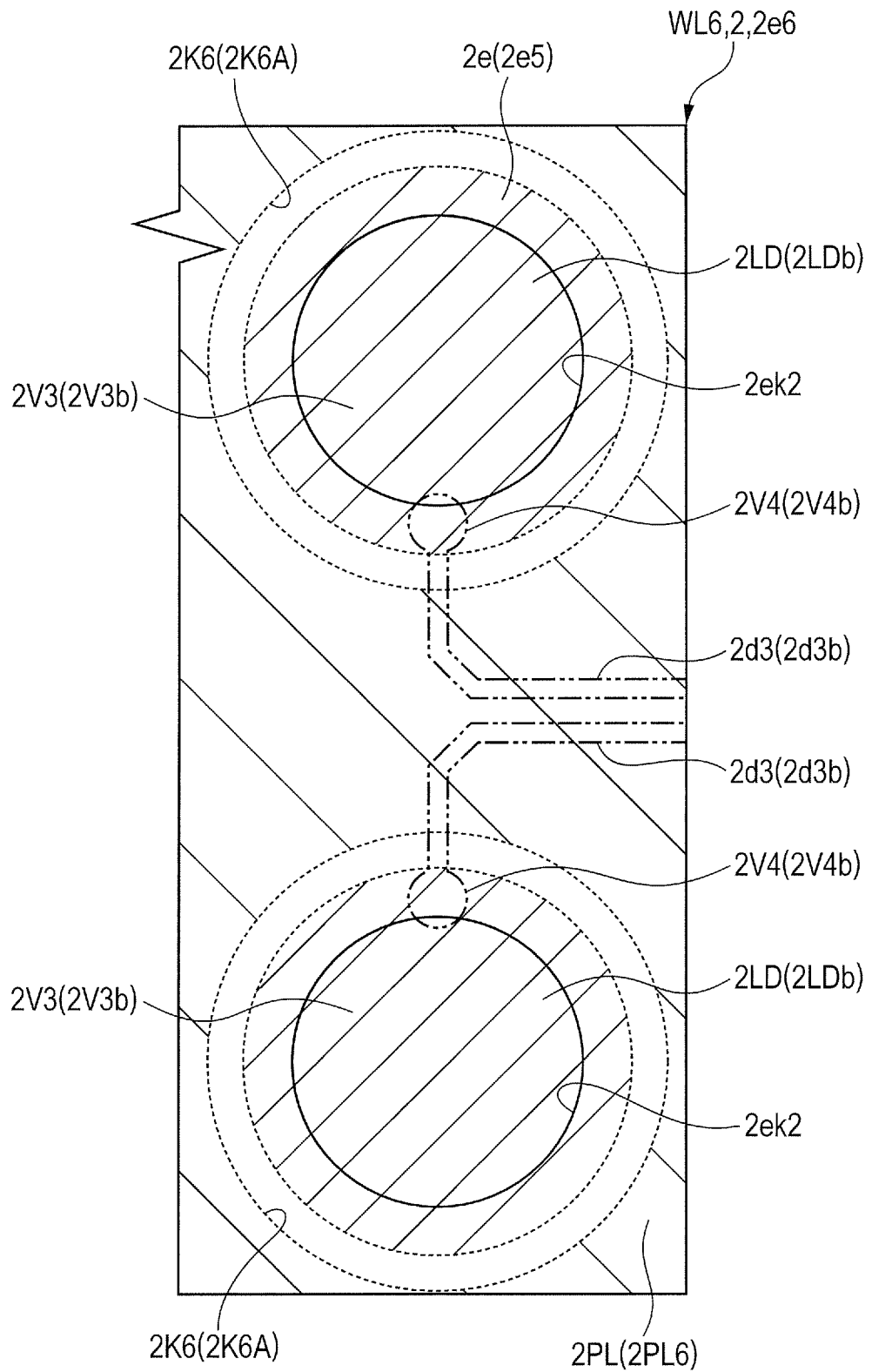
FIG. 37 is an enlarged plan view showing conductive patterning of the sixth wiring layer in the enlarged plane shown in FIG. 34.

FIG. 30 shows an enlarged plan view of the conductive patterning of the fourth wiring layer WL4 (third lowermost wiring layer) in a region different from that shown in FIG. 26. FIG. 31 shows an enlarged cross-sectional view taken along the ling A-A of FIG. 30. FIG. 32 shows an enlarged plan view of the conductive patterning of the fifth wiring layer (second lowermost wiring layer) in the enlarged plane shown in FIG. 30. FIG. 33 shows an enlarged plan view of the conductive patterning of the sixth wiring layer (first lowermost wiring layer) in the enlarged plane shown in FIG. 30. FIG. 34 shows an enlarged plan view of the surroundings of the via wiring connected to the wiring shown in FIG. 32. FIG. 35 shows an enlarged cross-sectional view taken along the ling A-A of FIG. 34. FIG. 36 shows an enlarged plan view of the conductive patterning of the fourth wiring layer (third lowermost wiring layer) in the enlarged plane shown in FIG. 34. FIG. 37 shows an enlarged plan view of the conductive patterning of the sixth wiring layer (first lowermost wiring layer) in the enlarged plane shown in FIG. 34.

Through FIGS. 30 and 37, in order to clarify the planar positional relationship between the openings 2K4A (fourth layer opening, third lowermost layer opening) and 2K5A (fifth layer opening, second lowermost layer opening) formed in the respective wiring layers, and the high speed second through hole land 2TL2b (high speed lower through hole land), high speed third and fourth via wirings 2V3b and 2V4b (high speed second lowermost via wiring and high speed first lowermost via wiring), and high speed ball land 2LDb, the contour of the conductive pattern formed in wiring layers other than the wiring layer shown is represented by the two-dot chain line. FIGS. 30, 32 to 34, and 36 and 37 are enlarged plan views, but hatching is added to the conductive patterns, including the wirings, the via wirings, the through hole lands, the lands, and the conductive planes in order to clarify the boundary between the conductive patterns. Like the reference path via 2V2r for reference described with reference to FIG. 13, FIG. 34 also shows reference path vias 2V4r for reference included in the reference path of the high speed transmission path for transmitting the differential signal, by a dotted line.

In the high speed transmission path shown in FIGS. 30 to 37, first, as shown in FIGS. 30 and 31, the fourth wiring layer WL4 (third lowermost wiring layer) formed over the lower surface 2Cb (see FIG. 31) of the core insulating layer 2CR (fourth lowermost insulation layer) is provided with the high speed second through hole land 2TL2b (high speed lower through hole land). The structure located over the high speed second through hole land 2TL2b (high speed lower through hole land) has the same structure as the wiring structure described with reference to FIGS. 15, 16, 23, and 24, and a redundant description thereof will be described below.

The fifth wiring layer WL5 (second lowermost wiring layer) shown in FIGS. 31, 32, 34, and 35 is provided with the high speed third via wirings 2V3b (high speed second lowermost via wirings) (see FIGS. 31 and 32) electrically coupled to the high speed second through hole lands 2TL2b (high speed lower through hole land), and wirings (high speed fifth-layer wirings, high speed second lowermost layer wirings) 2d3b electrically coupled to the high speed third via wirings 2V3b.

As shown in FIGS. 35 and 37, the sixth wiring layer WL6 (first lowermost wiring layer) is provided with the high speed fourth via wiring 2V4b (high speed first lowermost via wiring) electrically coupled to the high speed fifth-layer wiring 2d3b (high speed second lowermost layer wiring), and a high speed ball land 2LDb electrically coupled to the high speed fourth via wiring 2V4b. The high speed fourth via wirings 2V4b (high speed first lowermost via wiring) shown in FIG. 37 are electrically coupled to the high speed third via wirings 2V3b (high speed second lowermost via wiring) shown in FIG. 32 via the high speed fifth-layer wirings 2d3b (high speed second lowermost layer wiring).

That is, the high speed transmission path shown in FIGS. 30 to 37 is routed not to be superimposed over the high speed ball land 2LDb (see FIG. 37) in the second wiring layer WL2 shown in FIG. 11, and routed to be superimposed over the high speed ball land 2LDb (see FIG. 37) in the fifth wiring layer WL5 (second lowermost wiring layer) shown in FIG. 18. Thus, as shown in FIG. 31, no ball land exists directly below the second through hole land 2TL2 (lower through hole land). And as shown in FIG. 35, no second through hole land 2TL2 exists directly above the ball land 2LD.

When the wiring is routed in the fifth wiring layer WL5 (second lowermost wiring layer) as mentioned above, the length of the high speed fifth-layer wirings 2d3b (high speed second lowermost layer wiring) formed in the fifth wiring layer WL5 shown in FIG. 18 is increased according to the distance of the routing. In the example shown in FIG. 18, the fifth wiring layer WL5 is provided with the low speed fifth-layer wirings 2d3a (low speed second lowermost layer wiring) for electrically coupling the low speed third via wirings 2V3a (low speed second lowermost via wiring) to the low speed fourth via wirings 2V4a (low speed first lowermost via wiring). The low speed third via wirings 2V3a, the low speed fourth via wirings 2V4a, and the low speed fifth-layer wirings 2d3a form wiring paths electrically connected to the low speed first-layer wirings 2d1a shown in FIG. 5, and are routed to the vicinity of the low speed ball lands 2LDa (see FIG. 19) in the first wiring layer WL1, so that the length of the low speed fifth-layer wiring 2d3a shown in FIG. 18 can be shortened. Thus, the length (path length) of each of the high speed fifth-layer wirings 2d3b shown in FIG. 18 is larger than that (path length) of the low speed fifth-layer wiring 2d3a.

In this embodiment, as shown in FIGS. 31 and 35, in order to be superimposed over the high speed fifth-layer wiring 2d3b (high speed second lowermost layer wiring) in the thickness direction, the fourth conductive plane 2PL4 (third lowermost conductive plane) is formed in the fourth wiring layer WL4 (third lowermost wiring layer), and the sixth conductive plane 2PL6 (first lowermost conductive plane) is formed in the sixth wiring layer WL6 (first lowermost wiring layer). In other words, in the side view, the high speed fifth-layer wiring 2d3b (high speed second lowermost layer wiring) is sandwiched between the fourth conductive plane 2PL4 (third lowermost conductive plane) of the fourth wiring layer WL4 (third lowermost wiring layer) and the sixth conductive plane 2PL6 (first lowermost conductive plane) of the sixth wiring layer WL6 (first lowermost wiring layer). As shown in FIGS. 32 and 34, the fifth conductive plane 2PL5 (second lowermost conductive plane) is formed around the high speed fifth-layer wiring 2d3b (high speed second lowermost layer wiring) to be spaced away from the high speed fifth-layer wiring 2d3b, and the high speed fifth-layer wiring 2d3b is enclosed by the fifth conductive plane 2PL5 (second lowermost conductive plane).

That is, the high speed fifth-layer wiring 2d3b (high speed second lowermost layer wiring) takes the strip line wiring structure. In this way, the strip line wiring structure is applied to the transmission path achieving a high transmission rate, which enables the high density design of the high speed signal path.

The transmission path comprised of the low speed third via wiring 2V3a (low speed second lowermost via wiring), the low speed fourth via wiring 2V4a (low speed first lowermost via wiring), and the low speed fifth-layer wiring 2d3a (low speed second lowermost layer wiring) has a relative low transmission rate as compared to that of the transmission path comprised of the high speed third via wiring 2V3b (high speed second lowermost via wiring), the high speed fourth via wiring 2V4b (high speed second lowermost via wiring), and the high speed fifth-layer wiring 2d3b (high speed second lowermost layer wiring) as mentioned above. A wiring structure other than the strip line structure (not shown, bur for example, a wiring structure including a plurality of wirings adjacent to each other without any conductive plane) can be used for the low speed fifth-layer wirings 2d3a (low speed second lowermost layer wirings). Unless restricted based on the layout, the strip line structure can also be applied to the low speed fifth-layer wiring 2d3a (low speed second lowermost layer wiring).

As shown in FIGS. 30 to 33, when no high speed ball land 2LDb (see FIGS. 34 to 37) is superimposed over the high speed second through hole land 2TL2b (high speed lower through hole land) in the thickness direction, an opening, which is formed so as to decrease the parasitic capacitance of the surroundings of the second through hole land 2TL2, can be determined by the relationship with the plane area of the high speed second through hole land 2TL2b. That is, the area of each of the fourth-layer opening 2K4B (third lowermost layer opening) shown in FIG. 30, the fifth-layer opening 2K5B (second lowermost layer opening) shown in FIG. 32, and the sixth layer opening 2K6B (first lowermost layer opening) shown in FIG. 33 is preferably larger than the plane area of the high speed second through hole land 2TL2b. In the example shown in FIGS. 30 to 33, the shape and area of each of the openings 2K4B, 2K5B, and 2K6B are the same as those of, for example, the third layer opening 2K3 shown in FIG. 15.

In the planar view, the contours of the openings 2K4B, 2K5B, and 2K6B are arranged to be superimposed over each other. In the planar view, the high speed second through hole land 2TL2b (high speed lower through hole land) is disposed within the openings 2K4B, 2K5B, and 2K6B. The high speed third via wirings 2V3b (high speed second lowermost via wirings) are formed within the openings 2K4B, 2K5B, and 2K6B. As described above using FIG. 22, the parasitic capacitance Ct (see FIG. 22) caused around the second through hole land 2TL2 in the thickness direction of the wiring substrate 2 can be reduced.

As shown in FIGS. 31 and 32, the fifth wiring layer WL5 (second lowermost wiring layer) is provided with the high speed fifth-layer wiring 2d3b (high speed second lowermost layer wiring) forming the high speed transmission path. The area of each of the openings 2K4B, 2K5B, and 2K6B is preferably minimized as long as the opening is not superimposed over the high speed first through hole land 2TL1*b* (high speed upper through hole land) in the thickness direction.

In this embodiment, the area of each of the openings 2K4B, 2K5B, and 2K6B is smaller than that of the openings 2K4A, 2K5A, and 2K6A shown in FIGS. 34 to 37. In the examples shown in FIGS. 30 to 33, the area of each of the openings 2K4B, 2K5B, and 2K6B is smaller than the plane area of the ball land 2LD shown in FIGS. 34 to 37. The area of each of the openings 2K4B, 2K5B, and 2K6B is preferably minimized, whereby the above strip line wiring structure can be applied to most of the high speed fifth-layer wiring 2*d*3*b* (high speed second lowermost layer wirings). Even when a number of high speed transmission paths are integrated in the fifth wiring layer WL5 (second lowermost wiring layer), the fifth conductive plane 2PL5 (second lowermost conductive plane) can be surely disposed between the adjacent high speed transmission paths (differential pairs) to reduce the influence between the adjacent differential pairs.

When another ball land 2LD (for example, a land for supply of a power source potential or a land for supply of a reference potential) needs to be disposed in the position where the sixth layer opening 2K6B (first lowermost layer opening) shown in FIG. 31 is formed, a modified embodiment can take a structure without the sixth layer opening 2K6B. Also in this case, the provision of the fifth-layer opening 2K5B (second lowermost layer opening) can decrease the parasitic capacitance of the surroundings of the second through hole land 2TL2 (lower through hole land).

From the viewpoint of decreasing the parasitic capacitance generated around the high speed ball land 2LDb shown in FIGS. 34 to 37, the openings 2K4A, 2K5A, and 2K6A (third lowermost layer opening, second lowermost layer opening and first lowermost layer opening, respectively) are preferably formed not to be superimposed over the high speed ball land 2LDb in the thickness direction as shown in FIG. 35. The area of each of the openings 2K4A, 2K5A, and 2K6A can be determined according to the plane area of the high speed ball land 2LDb. In the examples shown in FIGS. 34 to 37, the area of each of the openings 2K4A, 2K5A, and 2K6A is the same as that of each of the openings 2K4A, 2K5A, and 2K6A shown in FIG. 16.

In the planar view, the contours of the openings 2K4A, 2K5A, and 2K6A (third lowermost layer opening, second lowermost layer opening and first lowermost layer opening, respectively) are arranged to be superimposed over each other. Also, in the planar view, the high speed ball land 2LDb is disposed within the openings 2K4A, 2K5A, and 2K6A. The high speed fourth via wirings 2V4*b* are respectively disposed within the openings 2K4A, 2K5A, and 2K6A. As described above with reference to FIG. 22, the parasitic capacitance Ct (see FIG. 22) generated around the high speed ball land 2LDb (see FIG. 35) in the thickness direction of the wiring substrate 2 can be reduced.

In a modified example (not shown) of the embodiment corresponding to FIG. 35, openings can be formed in the wiring layers WL1, WL2, and WL3 to be superimposed over the high speed ball land 2LDb in the thickness direction. As shown in FIG. 35, a distance between each of the wiring layers WL1, WL2, and WL3 and the high speed ball land 2LDb is large because of the presence of the core insulating layer 2CR (fourth lowermost insulating layer). For this reason, even when the conductive planes 2PL1, 2PL2, and 2PL3 are superimposed over the high speed ball land 2LDb in the thickness direction, the parasitic capacitance generated between the high speed ball land 2LDb and the conductive planes 2PL1, 2PL2, and 2PL3 in the thickness direction is small.

Figure 38:
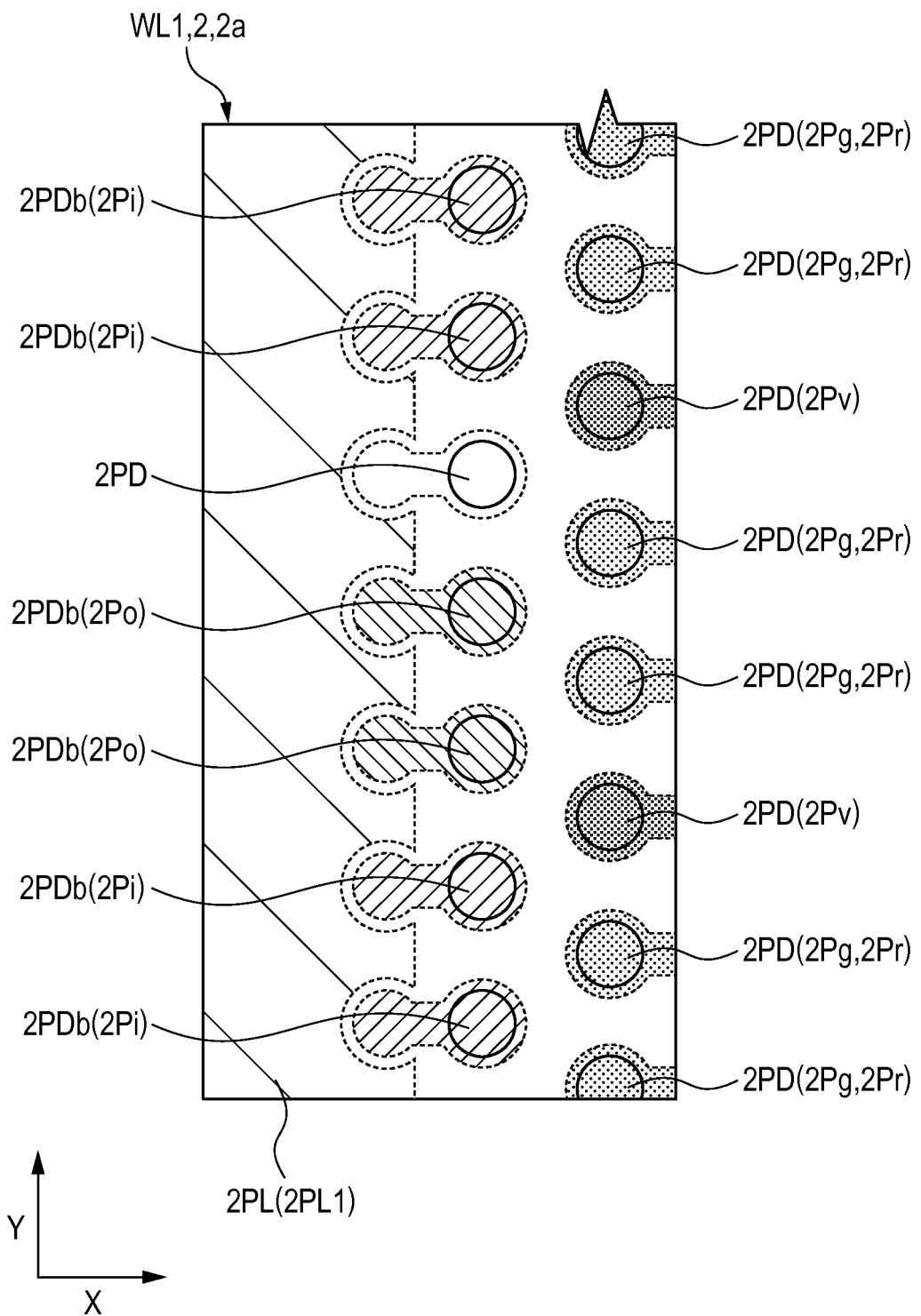
FIG. 38 is an exemplary plan view showing an example of a pad arrangement on the chip mounting surface side of the wiring substrate shown in FIG. 4.
Figure 39:
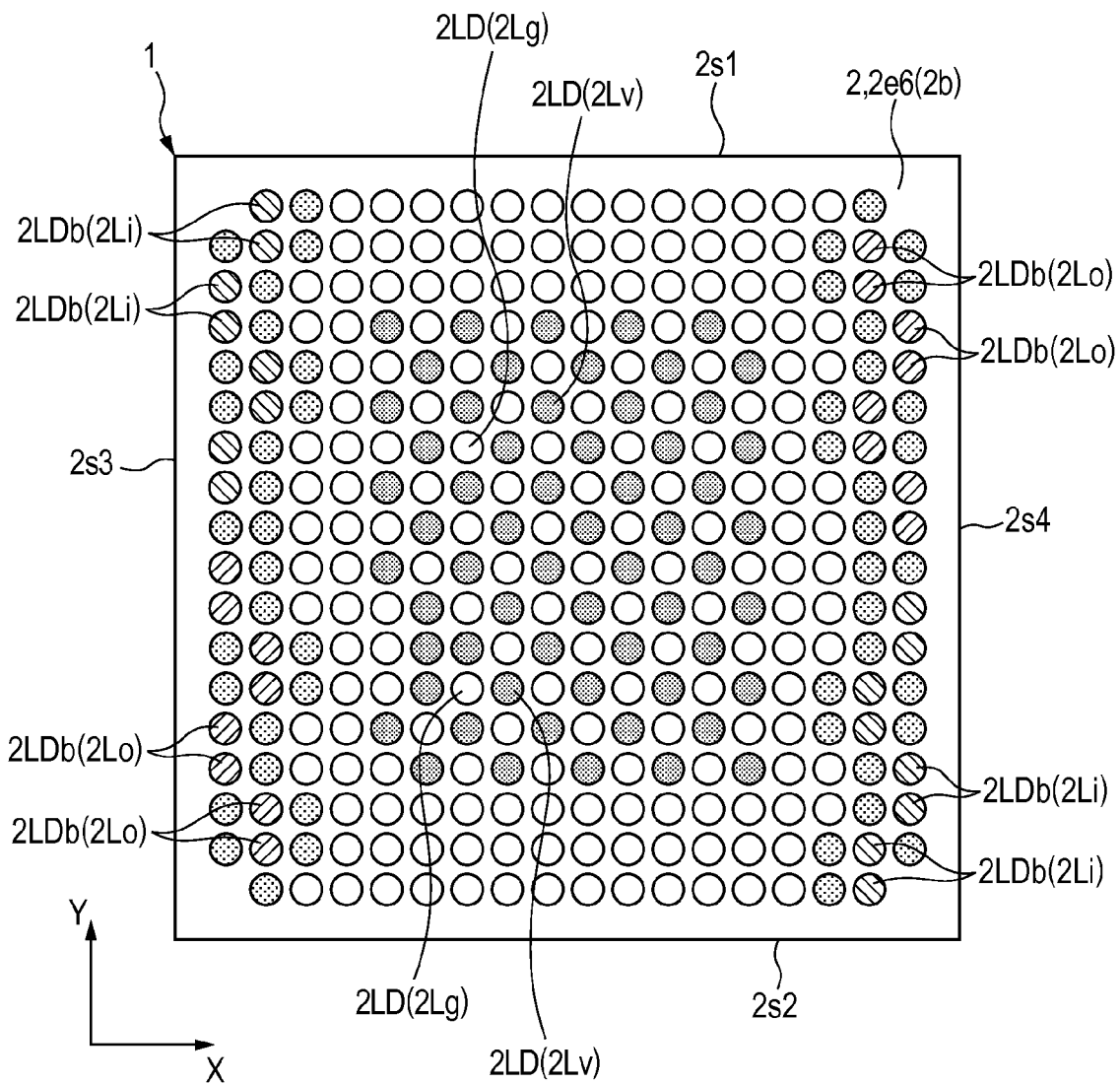
FIG. 39 is an exemplary enlarged plan view showing an example of a ball land arrangement on the lower mounting surface side of the wiring substrate shown in FIG. 4.
Figure 40:
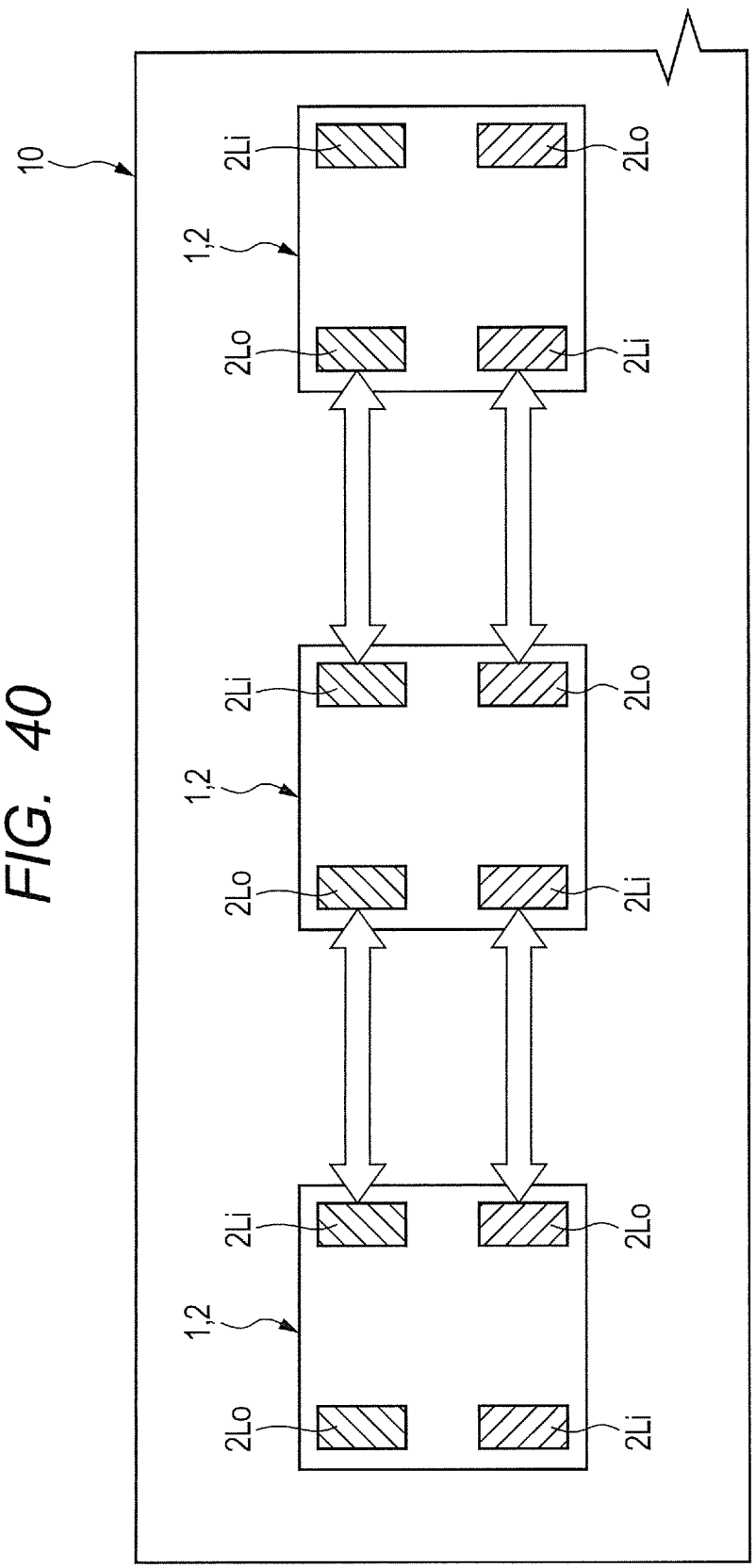
FIG. 40 is an explanatory diagram exemplarily showing the state in which a plurality of semiconductor devices shown in FIG. 39 are mounted and bonded over the mounting substrate by a Cascade interconnection.

Like the high speed transmission path shown in FIGS. 30 to 37, the following will refer to the example to which a structure including wirings routed through wiring layers is effectively applied. FIG. 38 is an exemplary diagram showing one example of a pad arrangement on the chip mounting surface side of the wiring substrate shown in FIG. 4. FIG. 39 shows an exemplary enlarged plan view of one example of a land arrangement on the lower mounting surface side of the wiring substrate shown in FIG. 4. FIG. 40 shows an exemplary explanatory diagram of the state of mounting a plurality of the semiconductor devices shown in FIG. 39 over the mounting substrate by cascading connection.

In order to clearly distinguish among different types of terminals, including a terminal for an input signal, a terminal for an output signal, a signal for a reference potential, and a terminal for a power supply potential, FIGS. 38 to 40 show different hatching depending on the type of the terminal even in plan views. A bonding pad 2PD shown as a plain area in FIG. 38, and a ball land 2LD shown as another plain area in FIG. 39 include lands for input of a signal, for supply of a reference potential, or for supply of a power supply potential except for the high speed transmission path.

In the example shown in FIG. 38, the high speed bonding pads 2PDb on the chip mounting surface side (upper surface 2*a* side) of the wiring substrate 2 include a plurality of input bonding pads 2Pi for input to which an input signal to be supplied to the semiconductor chip 3 shown in FIG. 4 is transmitted. The high speed bonding pads 2PDb include a plurality of output bonding pads 2Po for output to which an output signal supplied from the semiconductor chip 3 shown in FIG. 4 is transmitted. The bonding pads 2PD include a ground bonding pad 2Pg for a reference potential for supplying the reference potential (for example, ground potential) to the semiconductor chip 3 shown in FIG. 4. The bonding pads 2PD include a voltage bonding pad 2Pv for a power supply potential for supplying a power supply potential to the semiconductor chip 3 shown in FIG. 4.

The input bonding pads 2Pi for input and the output bonding pads 2Po for output are electrically coupled to the high speed second-layer wirings 2*d*2*b* shown in FIG. 11. In other words, an input signal to be input to the semiconductor chip 3 via the high speed second-layer wirings 2*d*2*b* is transmitted to the input bonding pads 2Pi for input. An output signal to be output from the semiconductor chip 3 to the high speed second-layer wirings 2*d*2*b* is transmitted to the output bonding pads 2Po for output.

In order to reduce a space for setting an input/output circuit of the semiconductor chip 3 shown in FIG. 4, the terminal for input and the terminal for output are preferably disposed close to each other. In addition to the input terminal and the output terminal, the terminal for supply of the reference potential and the terminal for supply of the power supply potential are preferably disposed close to each other. In the example shown in FIG. 38, the input bonding pads 2Pi for input and the output bonding pads 2Po for output are respectively disposed in pairs. Thus, an area occupied by the circuits of the semiconductor chip 3 can be reduced. That is, the integration degree or density of the semiconductor chip 3 can be improved.

In the vicinity of the pairs of the input bonding pads 2Pi for input and the output bonding pads 2Po for output, reference bonding pads 2Pr for reference are disposed to form the reference paths for the signal transmission path. In this embodiment, as shown in FIG. 38, the reference bonding pads 2Pr are arranged such that a distance between the transmission path on the positive side and the corresponding reference path is preferably set equal to that between the transmission path on the negative side and the corresponding reference path. Specifically, a distance (for example, center-to-center spacing) from the high speed bonding pad 2PDb disposed in one transmission path forming the differential pair to the reference bonding pad 2Pr for reference disposed closest to the high speed bonding pad 2PDb is equal to a distance (for example, center-to-center spacing) from the high speed bonding pad 2PDb disposed in the other transmission path to the reference bonding pad 2Pr for reference disposed closest to the high speed bonding pad 2PDb. Thus, a differential delay between the one transmission path (for example, on the positive side) and the other transmission path (for example, on the negative side) forming the differential pair can be reduced which can prevent or suppress a difference in skew between the positive side and the negative side.

As shown in FIG. 39, a plurality of ball lands 2LD are arranged on the lower surface 2b as the lower mounting surface of the wiring substrate 2. The high speed ball lands 2LDb forming the high speed transmission path include input ball lands 2Li for input electrically coupled to the input bonding pads 2Pi for input (see FIG. 38), and output ball lands 2Lo for output electrically coupled to the output bonding pads 2Po for output (see FIG. 38). The ball lands 2LD include ground ball lands 2Lg for the reference potential electrically coupled to the ground bonding pads 2Pg for the reference potential (see FIG. 38). The ball lands 2LD include voltage ball lands 2Lv for the power supply potential electrically coupled to the voltage bonding pads 2Pv for the power supply potential (see FIG. 38).

In an example shown in FIG. 39, the input lands 2Li for input and the output ball lands 2Lo for output are arranged at the periphery of the lower surface 2b. The ground ball lands 2Lg for the reference potential and the voltage ball lands 2Lv for the power supply potential are disposed at the center of the lower surface 2b. The input ball lands 2Li for input and the output ball lands 2Lo for output are disposed in different positions of the lower surface 2b of the wiring substrate 2.

Specifically, the wiring substrate 2 has a quadrilateral shape in the planar view, and includes a first pair of parallel sides 2s1 and 2s2 extending in the direction X, and a second pair of parallel sides 2s3 and 2s4 extending in the direction Y perpendicular to the direction X. The input ball lands 2Li and the output ball lands 2Lo are arranged along the second pair of sides 2s3 and 2s4 among the four sides of the lower surface 2b. The input ball lands 2Li on side 2s3 are collectively arranged closer to side 2s1, while the input ball lands 2Li on side 2s4 are collectively arranged closer to side 2s2. The output ball lands 2Lo on side 2s3 are collectively arranged closer to side 2s2, while the output ball lands on side 2s4 are collectively arranged closer to side 2s1.

As exemplarily shown in FIG. 39, when the terminals for input and the terminals for output are collectively arranged, as shown in FIG. 40, the semiconductor devices 1 are mounted over the mounting substrate 10. In the cascade connection, the arrangements are very useful. That is, as schematically shown in FIG. 40, the terminal for input of the first semiconductor device 1 and the terminal for output of the second semiconductor device 1 can be opposed to each other over the mounting surface of the mounting substrate 10. This arrangement can reduce a transmission distance between the adjacent semiconductor devices 1 to thereby decrease the transmission loss. The mounting structure with the semiconductor devices 1 mounted thereover by the cascade connection can improve its resistance to noise.

As can be seen from comparison between FIG. 38 and FIG. 39, on the chip mounting surface side, pairs of the input bonding pads 2Pi and the output bonding pads 2Po are collectively disposed together, while on the lower mounting surface side, the input ball lands 2Li for input are grouped apart from the output ball lands 2Lo for output. In this case, a signal wiring for input needs to intersect a signal wiring for output at somewhere in the wiring substrate 2.

In this embodiment, as mentioned above with reference to FIGS. 30 to 37, the high speed transmission paths are routed in the second wiring layer WL2 and the fifth wiring layer WL5. The input signal wiring and the output signal wiring intersect each other between the second wiring layer WL2 and the fifth wiring layer WL5.

Specifically, one of the input signal wiring and the output signal wiring is routed to over the high speed ball land 2LDb (see FIG. 19) in the second wiring layer WL2 shown in FIG. 11. As shown in FIG. 16, the second through hole lands 2TL2 employs the wiring structure positioned over the high speed ball land 2LDb, which can improve the resistance to noise of the high speed transmission path. The other of the input signal wiring and the output signal wiring is routed to over the high speed ball land 2LDb (see FIG. 19) in the fifth wiring layer WL5 shown in FIG. 18. In this case, as described above with reference to FIG. 30 to FIG. 37, the use of the wiring structure in which the second through hole land 2TL2 is not superimposed over the high speed ball land 2LDb in the thickness direction can improve the resistance to noise of the high speed transmission path.

<Manufacturing Method of Semiconductor Device>

Figure 41:
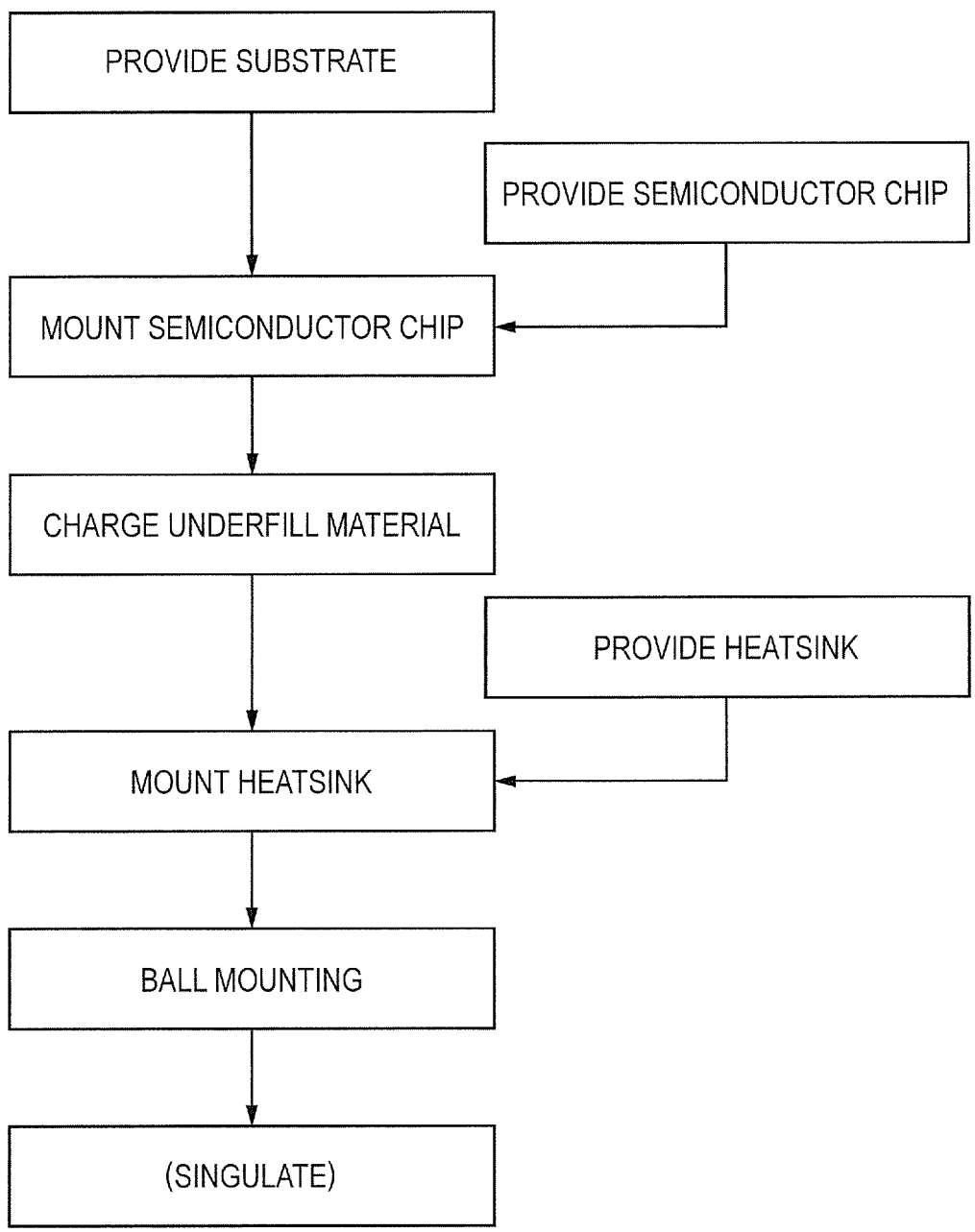
FIG. 41 is an explanatory diagram showing a flow of assembly steps of the semiconductor device described with reference to FIGS. 1 to 40.

Now, a manufacturing method (assembly process) of the semiconductor device 1 described with reference to FIGS. 1 to 40 will be described below using a flowchart of FIG. 41. FIG. 41 shows an explanatory diagram of a flowchart of the assembly process of the semiconductor device described above with reference to FIG. 1 to FIG. 40. In description of the following manufacturing method, the wiring substrate 2 previously formed in a product size is provided, and one semiconductor device 1 is manufactured using the substrate. In a modified example, a multilayout system can also be used, which involves providing a multilayout substrate including a plurality of product formation regions partitioned, assembling semiconductor elements in the respective product formation regions of the substrate, and dividing the substrate into the production formation regions to produce a plurality of semiconductor devices. Thus, a singulating step which is applied to the multilayout system is within a parenthesis.

First, in a substrate provision step shown in FIG. 41, the wiring substrate 2 shown in FIG. 4 is provided. The wiring substrate 2 provided in this step previously includes the components described using FIGS. 1 to 40 except that the solder balls 4 shown in FIG. 4 are not connected yet and that the heatsink 6 and the semiconductor chip 3 are not mounted. Solder material (solder bumps) coupled to the protruding electrodes 3BP are previously formed over the bonding pads 2PD of the wiring substrate 2.

In the semiconductor chip provision step, the semiconductor chip 3 shown in FIG. 4 is provided. An insulating film is formed over the front surface 3a of the semiconductor chip 3 to cover the base and the wirings of the semiconductor chip 3. Each of the electrode pads 3PD has its surface exposed from the insulating film at an opening formed in the insulating film. The electrode pads 3PD are made of metal. In this embodiment, the pad PD is made of, for example, aluminum (Al). The electrode pads 3PD are respectively coupled to the protruding electrodes 3BP, so that the electrode pads 3PD of the semiconductor chip 3 are electrically coupled to the bonding pads 2PD over the wiring substrate 2 via the protruding electrodes 3BP. The protruding electrode 3BP in this embodiment is the so-called solder bump formed by stacking a soldering material over the electrode pad 3PD via an underlayer metal film (under bump metal).

Then, in a semiconductor chip mounting step, as shown in FIG. 4, the semiconductor chip 3 is mounted over the upper surface 2a as a chip mounting surface of the wiring substrate 2. In this embodiment, as shown in FIG. 4, the semiconductor chip is mounted by the face-down mounting method (or flip-chip bonding method) such that the surface 3a with the electrode pads 3PD is opposed to the upper surface 2a of the wiring substrate 2. In this case, the solder bumps formed on the protruding electrodes 3BP and the solder bumps formed on the substrate bonding pads 2PD of the wiring substrate are bonded together to electrically couple the circuit formed in the semiconductor chip 3 to the circuit (transmission path) formed at the wiring substrate 2.

Then, in an underfill charging step, as shown in FIG. 4, underfill resin (insulating resin) 55 is disposed between the semiconductor chip 3 and the wiring substrate 2. The underfill resin 5 is disposed to cover a space between the front surface 3a of the semiconductor chip 3 and the upper surface 2a of the wiring substrate 2. The underfill resin 5 is made of insulating (non-conductive) material (for example, resin material), and charged to seal an electric connection part (junction of the protruding electrodes 3BP) between the semiconductor chip 3 and the wiring substrate 2.

In a modified example of the underfill resin 5, before the semiconductor chip mounting step shown in FIG. 41, a film-like or paste-like insulating material (not shown) is applied in advance to the chip mounting region where the semiconductor chip 3 is to be mounted, and then the semiconductor chip 3 is pushed against the insulating material, so that the semiconductor chip 3 can be mounted there rover.

Then, in a heatsink mounting step, as shown in FIG. 4, a heat-dissipating resin (adhesive) 7 is applied to the back surface 3b of the semiconductor chip 3, and then the heatsink 6 provided in the heat sink provision step is bonded to the resin. In this way, the heatsink 6 is bonded and fixed to the back surface 3b of the semiconductor chip 3. A support frame 8 for supporting the heatsink 6 can be previously bonded and fixed to the wiring substrate 2 before the heat sink mounting step. Alternatively, the support frame 8 is previously bonded to the periphery of the heatsink 6, and then the heatsink 6 and the support frame 8 can be collectively mounted with an adhesive on the lower side of the support frame 8.

Then, in a ball mount step, the solder balls 4 are attached to the lower surface 2b as the lower mounting surface of the wiring substrate 2. In the present step, the solder balls 4 are arranged over the ball lands 2LD exposed from the sixth insulating layer 2e6 shown in FIG. 16, and subjected to a reflow process (which involves heating and melting solder components to bond solder balls, and then cooling the solder balls), so that the solder balls are attached to the lands.

In a singulating step, the multilayout substrate is cut along dicing lines (division lines) for partitioning the substrate into the product formation regions, which produces a plurality of semiconductor devices 1 singulated for every product formation region.

Thereafter, necessary checking and testing, such as an appearance check or an electric test, are performed on each semiconductor device. Then, the semiconductor device is shipped, or mounted on a mounting substrate (not shown).

Other Modified Examples

The invention made by the inventors has been specifically described above based on the preferred embodiments. The invention is not limited to the above embodiments. It is apparent that various modifications and changes can be made to those embodiments without departing the scope of the invention.

For example, in the above embodiments, there are a plurality of transmission paths (first transmission paths, low speed transmission paths) through which the first signal current flows at a first transmission rate, and a plurality of transmission paths (second transmission paths, high speed transmission paths) through which the second signal current flows at a second transmission rate higher than the first transmission rate. The embodiments of the invention can be applied to a modified example in which the transmission paths for all signals are the high speed transmission paths. In this case, for example, the wiring structure described using FIG. 16 is applied to the transmission path coupled to the low speed first-layer wiring 2d1a shown in FIG. 5, which can improve the resistance to noise of the transmission paths coupled to the low speed first-layer wirings 2d1a.

For example, in the above embodiments, the transmission path through which the differential signal is transferred at a transmission rate of about 10 to 25 Gbps has been described as one example of the high speed transmission path. Even when transferring the signal by any systems other than the system using the differential signal, this embodiment can be applied.

Figure 42:
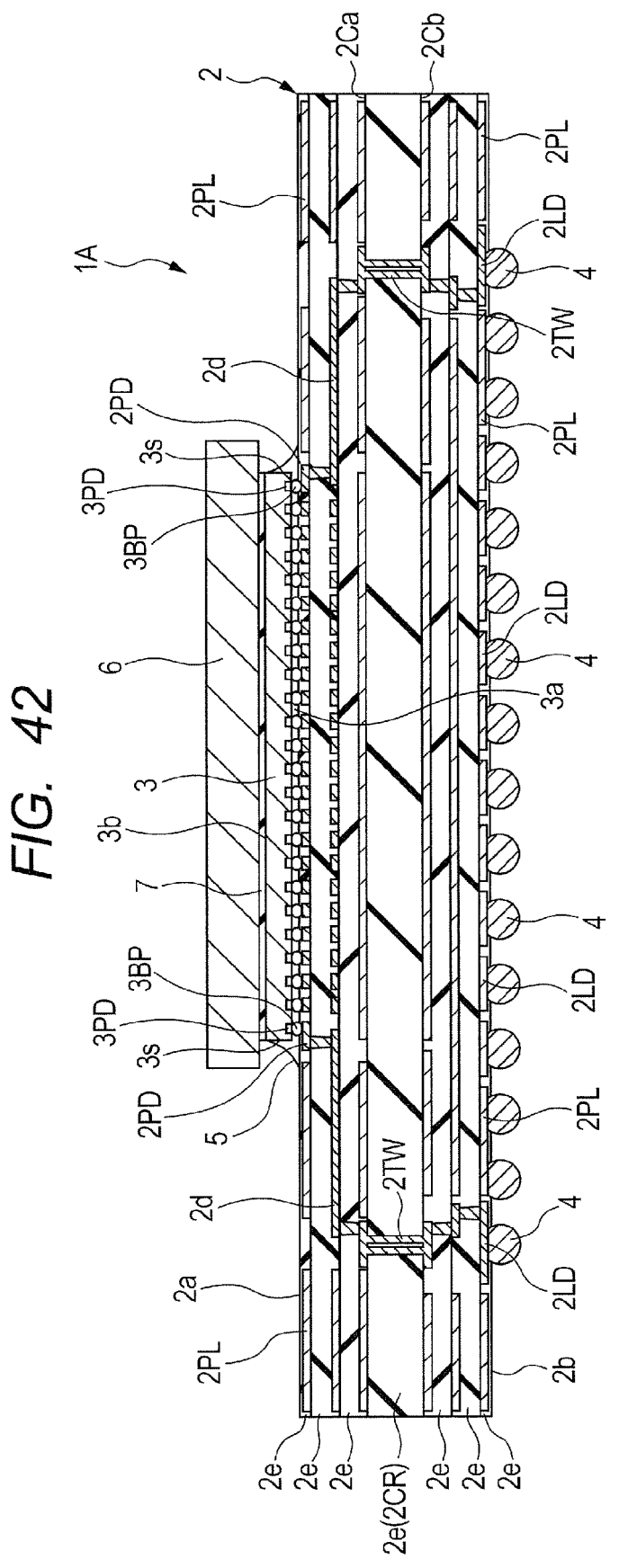
Figure 43:
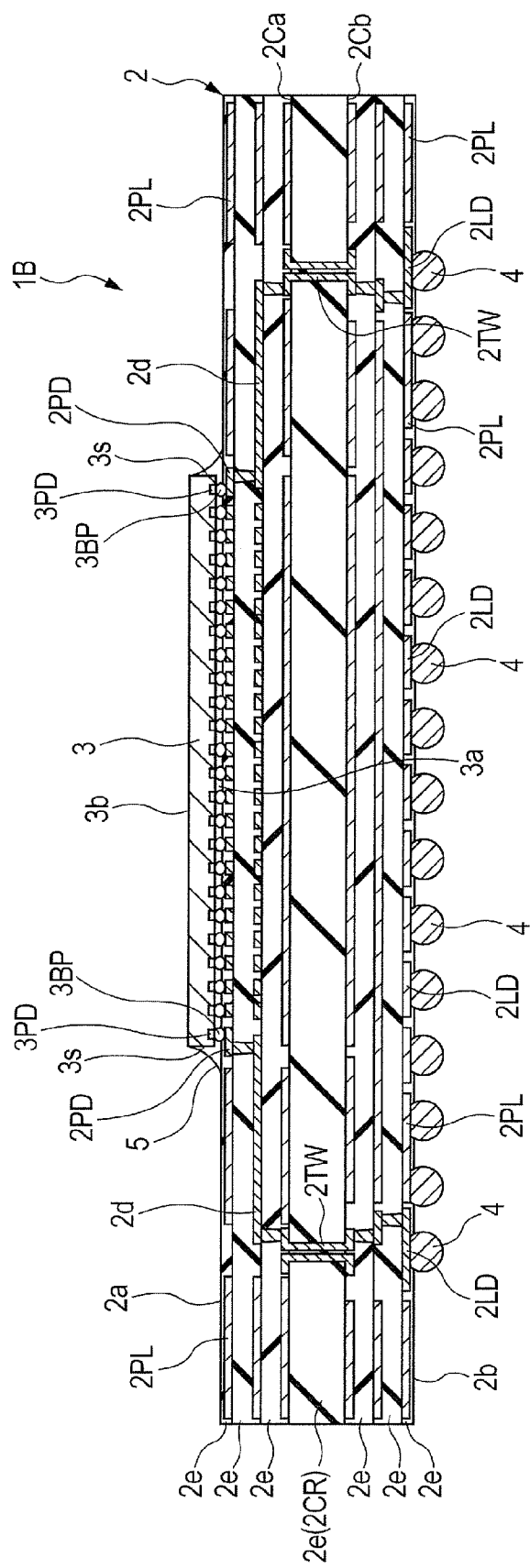
FIG. 43 is a cross-sectional view showing a semiconductor device as another modified example corresponding to FIG. 4.

For example, in the embodiments described above, the support frame 8 is bonded and fixed to the periphery of the semiconductor chip 3 to support the heatsink 6. As a modified example, like the semiconductor device 1A shown in FIG. 42, or the semiconductor device 1B shown in FIG. 43, the invention can be applied to an embodiment in which the support frame 8 (see FIGS. 3 and 4) is not provided, or another embodiment in which the support frame 8 and the heatsink 6 are not provided. FIGS. 42 and 43 are cross-sectional views showing the semiconductor device as a modified example corresponding to FIG. 4. The semiconductor device 1A shown in FIG. 42 and the semiconductor device 1B shown in FIG. 43 can reduce the stress generated on the front surface 3a side of the semiconductor chip 3 by the influence of the support frame 8 shown in FIG. 4. When a load is applied on the temperature cycle, the stress applied on the front surface 3a side of the semiconductor chip 3 can be reduced as compared to the semiconductor device 1 shown in FIG. 4.

Specifically, although in the above embodiments, various modified examples have been explained above, the combination of the respective modified examples as described above can be applied.

What is claimed is:
1. A semiconductor device, comprising:
a semiconductor chip having a front surface with a plurality of electrode pads formed thereover, and a back surface opposite to the front surface; and
a wiring substrate including a chip mounting surface over which the semiconductor chip is mounted, a lower mounting surface opposite to the chip mounting surface, a plurality of bonding pads mounted over the chip mounting surface and electrically coupled to the electrode pads of the semiconductor chip, a plurality of ball lands associated with the lower mounting surface, and a plurality of wiring layers electrically coupling the bonding pads to the ball lands,
wherein the wiring substrate comprises:
a first wiring layer including a plurality of first via wirings electrically coupled to the bonding pads, a first conductive plane provided around the first via wirings and spaced apart from the first via wirings, and a first insulating layer covering the first via wirings and the first conductive plane;

a second wiring layer including a plurality of second-layer wirings electrically coupled to the first via wirings, a plurality of second via wirings electrically coupled to the second-layer wirings, a second conductive plane provided around the second-layer wirings and the second via wirings and spaced apart from the second-layer wirings and the second via wirings, and a second insulating layer covering the second-layer wirings, the second via wirings, and the second conductive plane, the second wiring layer being positioned closer to the lower mounting surface than the first wiring layer;

a third wiring layer including a plurality of first through hole lands electrically coupled to the second via wirings, a third conductive plane provided around the first through hole lands and spaced apart from the first through hole lands, and a third insulating layer covering the first through hole lands and the third conductive plane, the third wiring layer being positioned closer to the lower mounting surface than the second wiring layer; and a core insulating layer including a first surface with the third wiring layer formed thereat, a second surface opposite to the first surface, a plurality of through holes extending between the first and second surfaces, and a plurality of through hole wirings covering respective inner walls of the through holes and formed integrally with the first through hole lands, wherein the second-layer wirings are sandwiched between the first conductive plane of the first wiring layer and the third conductive plane of the third wiring layer in a side view, wherein the first conductive plane of the first wiring layer is provided with a plurality of first openings, the first openings being located to be superimposed over the first through hole lands of the third wiring layer in a thickness direction, each first opening having an area thereof larger than a plane area of a corresponding one of the first through hole lands, and each first opening being entirely filled with the first insulating layer, wherein the second conductive plane of the second wiring layer is provided with a plurality of second openings, the second openings being located to be superimposed over the first openings of the first wiring layer in the thickness direction, each second opening having an area thereof larger than the plane area of a corresponding one of the first through hole lands, and wherein each of the second via wirings is formed within the corresponding first and second openings in a planar view.

2. The semiconductor device according to claim 1,
wherein the wiring substrate comprises:

a fourth wiring layer including a plurality of second through hole lands formed over the second surface of the core insulating layer and integrally formed with the through hole wirings, a fourth conductive plane provided around the second through hole lands and spaced apart from the second through hole lands, and a fourth insulating layer covering the second through hole lands and the fourth conductive plane, the fourth wiring layer being positioned closer to the lower mounting surface than the core insulating layer;

a fifth wiring layer including a plurality of third via wirings electrically coupled to the second through hole lands, a fifth conductive plane provided around the third via wirings and spaced apart from the third via wirings, and a fifth insulating layer covering the third via wirings and the fifth conductive plane, the fifth wiring layer being positioned closer to the lower mounting surface than the fourth wiring layer; and a sixth wiring layer including a plurality of fourth via wirings electrically coupled to the third via wirings, the plurality of ball lands electrically coupled to the fourth via wirings, a sixth conductive plane provided around the ball lands and the fourth via wirings and spaced apart from the ball lands and the fourth via wirings, and a sixth insulating layer covering the fourth via wirings and the sixth conductive plane, wherein a plane area of each of the ball lands is larger than that of a corresponding one of the second through hole lands, wherein the fourth conductive plane of the fourth wiring layer is provided with a plurality of fourth-layer openings, the fourth-layer openings being located to be superimposed over the ball lands of the sixth wiring layer in the thickness direction, each fourth-layer opening having an area thereof larger than the plane area of a corresponding one of the ball lands, wherein the fifth conductive plane of the fifth wiring layer is provided with a plurality of fifth-layer openings, the fifth-layer openings being located to be superimposed over the respective fourth-layer openings of the fourth wiring layer in the thickness direction, each fifth-layer opening having an area thereof larger than the plane area of a corresponding one of the ball lands, and wherein each of the fourth via wirings is formed within the corresponding fourth and fifth-layer openings in a planar view.

3. The semiconductor device according to claim 2, wherein the area of each of the first openings formed in the first wiring layer is smaller than that of a corresponding one of the fifth-layer openings.

4. The semiconductor device according to claim 3, wherein each of the second through hole lands formed in the fourth wiring layer is superimposed over a corresponding one of the ball lands formed in the sixth insulating layer in the thickness direction.

5. The semiconductor device according to claim 4, wherein the area of each of the first openings formed in the first wiring layer is smaller than that of a corresponding one of the fourth-layer openings.

6. The semiconductor device according to claim 5,
wherein each of the first openings formed in the first wiring layer has the same shape and area as those of a corresponding one of the second openings formed in the second wiring layer, and
wherein a contour of each of the first openings is superimposed over a contour of said corresponding one of the second openings in the planar view.

7. The semiconductor device according to claim 6,
wherein each of the fourth-layer openings has the same shape and area as those of each of the fifth-layer openings, and
wherein a contour of each of the fourth-layer openings is superimposed over that of each of the fifth-layer openings in the planar view.

8. The semiconductor device according to claim 3, wherein the second through hole lands formed in the fourth wiring layer are not superimposed over the ball lands formed in the sixth insulating layer in the thickness direction.

9. The semiconductor device according to claim 3,
wherein the fifth-layer wirings are sandwiched between the fourth conductive plane of the fourth wiring layer and the sixth conductive plane of the sixth wiring layer in the side view.

10. The semiconductor device according to claim 9, wherein the area of each of the fourth-layer openings is smaller than that of a corresponding one of the fifth-layer openings.

11. The semiconductor device according to claim 10, wherein:
each fifth-layer opening has an area thereof larger than a plane area of a corresponding one of the second through hole lands, each fifth opening being entirely filled with the fifth insulating layer, and
each sixth-layer opening has an area thereof larger than a plane area of a corresponding one of the second through hole lands, and
each of the third via wirings is formed within the fifth and sixth openings in the planar view.

12. The semiconductor device according to claim 1,
wherein the bonding pads include pairs of a plurality of input bonding pads to which an input signal for the semiconductor chip is transmitted via the second-layer wirings of the wiring substrate, and a plurality of output bonding pads to which an output signal from the semiconductor chip is transmitted through the second-layer wirings of the wiring substrate, said pairs of the input bonding pads and output bonding pads being collectively disposed together on the chip mounting surface side of the wiring substrate, and
wherein at the lower mounting surface of the wiring substrate, the ball lands include a plurality of input ball lands electrically coupled to the input bonding pads, and a plurality of output ball lands electrically coupled to the output bonding pads, the input ball lands being grouped apart from the output ball lands.

13. The semiconductor device according to claim 1,
wherein the plane area of each of the ball lands is larger than that of a corresponding one of the first through hole lands, and
wherein an area of one of the first openings and an area of a corresponding one of the second openings are each smaller than the plane area of a corresponding one of the ball lands.

14. The semiconductor device according to claim 1, wherein each of the second-layer wirings is comprised of a pair of signal wirings through which a differential signal flows.

15. The semiconductor device according to claim 1,
wherein the first wiring layer is provided with a first-layer wiring electrically coupled to a first bonding pad among the bonding pads, and electrically isolated from the second-layer wirings, and
wherein a transmission rate of an electric signal flowing through the second-layer wirings is larger than that of an electric signal flowing through the first-layer wiring.

16. The semiconductor device according to claim 1,
wherein the first wiring layer is provided with a first-layer wiring electrically coupled to a first bonding pad among the bonding pads, and electrically isolated from the second-layer wirings, and
wherein in the planar view, the first-layer wiring is disposed not to be superimposed over the second-layer wirings.

17. The semiconductor device according to claim 1, wherein a ground potential is supplied to the first, second, and third conductive planes.

18. The semiconductor device according to claim 1, wherein
no conductive pattern is disposed within the first opening of the first conductive plane on the first wiring layer.

19. A wiring substrate comprising:
(a) a chip mounting surface having a plurality of bonding pads;
(b) a lower mounting surface opposite to the chip mounting surface, the lower mounting surface having a plurality of ball lands;
(c) a plurality of wiring layers electrically coupling the plurality of bonding pads to the plurality of ball lands, the plurality of wiring layers including:
(c1) a first wiring layer comprising:
a plurality of first via wirings electrically coupled to the bonding pads; and
a first conductive plane provided around the first via wirings, the first conductive plane having a plurality of first openings;
(c2) a second wiring layer positioned closer to the lower mounting surface than the first wiring layer, the second wiring layer comprising:
a plurality of second-layer wirings electrically coupled to the first via wirings;
a plurality of second via wirings electrically coupled to the second-layer wirings, and
a second conductive plane provided around the second-layer wirings and the second via wirings, the second conductive plane having plurality of second openings; and
(c3) a third wiring layer positioned closer to the lower mounting surface than the second wiring layer; the third wiring layer comprising:
a plurality of first through hole lands electrically coupled to the second via wirings; and
a third conductive plane provided around the first through hole lands; and
(d) a core insulating layer comprising:
(d1) a first surface with the third wiring layer formed thereat;
(d2) a second surface opposite to the first surface;
(d3) a plurality of through holes extending between the first and second surfaces; and
(d4) a plurality of through hole wirings covering respective inner walls of the through holes and formed integrally with the first through hole lands;
wherein:
the second-layer wirings are sandwiched between the first conductive plane of the first wiring layer and the third conductive plane of the third wiring layer in a side view;
the first openings are superimposed over the first through hole lands of the third wiring layer in a thickness direction, each first opening having an area thereof larger than a plane area of a corresponding one of the first through hole lands;
the second openings are superimposed over the first openings of the first wiring layer in the thickness direction, each second opening having an area thereof larger than the plane area of a corresponding one of the first through hole lands; and
each of the second via wirings is formed within the corresponding first and second openings in a planar view.

20. The wiring substrate according to claim 19, further comprising (c4) a fourth wiring layer positioned closer to the lower mounting surface than the core insulating layer, the fourth wiring layer comprising:
  a plurality of second through hole lands formed over the second surface of the core insulating layer and integrally formed with the through hole wirings; and
  a fourth conductive plane provided around the second through hole lands, the fourth conductive plane having a plurality of fourth-layer openings;
(c5) a fifth wiring layer positioned closer to the lower mounting surface than the fourth wiring layer, the fifth wiring layer comprising:
  a plurality of third via wirings electrically coupled to the second through hole lands; and
  a fifth conductive plane provided around the third via wirings, the fifth conductive plane having a plurality of fifth-layer openings, each fifth-layer opening having an area thereof larger than a plane area of a corresponding one of the ball lands, and
(c6) a sixth wiring layer comprising:
  a plurality of fourth via wirings electrically coupled to the third via wirings, and also electrically coupled to the ball lands; and
  a sixth conductive plane provided around the ball lands and the fourth via wirings;
wherein:
  the plane area of each of the ball lands is larger than that of a corresponding one of the second through hole lands;
  the fourth-layer openings are superimposed over the ball lands of the sixth wiring layer in the thickness direction, each fourth-layer opening having an area thereof larger than the plane area of a corresponding one of the ball lands;
  the fifth-layer openings are superimposed over the respective fourth-layer openings of the fourth wiring layer in the thickness direction; and
  each of the fourth via wirings is formed within the corresponding fourth and fifth-layer openings in a planar view.

21. A semiconductor device comprising:
  the wiring substrate in accordance with claim 20; and
  a semiconductor chip having a front surface with a plurality of electrode pads formed thereover, and a back surface opposite to the front surface; wherein:
  the front surface of the semiconductor chip faces the chip mounting surface of the wiring substrate, with the electrode pads of the semiconductor chip electrically coupled to the bonding pads of the wiring substrate.

22. A semiconductor device comprising:
  the wiring substrate in accordance with claim 19; and
  a semiconductor chip having a front surface with a plurality of electrode pads formed thereover, and a back surface opposite to the front surface; wherein:
  the front surface of the semiconductor chip faces the chip mounting surface of the wiring substrate, with the electrode pads of the semiconductor chip electrically coupled to the bonding pads of the wiring substrate.

23. The wiring substrate according to claim 19, wherein:
  no conductive pattern is disposed within the first opening of the first conductive plane on the first wiring layer.

* * * * *